US008855456B2

(12) United States Patent
Beamon et al.

(10) Patent No.: US 8,855,456 B2
(45) Date of Patent: Oct. 7, 2014

(54) MOUNTING DEVICES FOR OPTICAL DEVICES, AND RELATED SUB-ASSEMBLIES, APPARATUSES, AND METHODS

(75) Inventors: Hubert Blair Beamon, Haltom City, TX (US); Terry Dean Cox, Keller, TX (US)

(73) Assignee: Corning Cable Systems LLC, Hickory, NC (US)

( * ) Notice: Subject to any disclaimer, the term of this patent is extended or adjusted under 35 U.S.C. 154(b) by 157 days.

(21) Appl. No.: 13/405,559

(22) Filed: Feb. 27, 2012

(65) Prior Publication Data

US 2012/0219263 A1    Aug. 30, 2012

Related U.S. Application Data

(60) Provisional application No. 61/447,535, filed on Feb. 28, 2011.

(51) Int. Cl.
*G02B 6/00*    (2006.01)
*G02B 6/38*    (2006.01)
*G02B 6/42*    (2006.01)
*H05K 1/02*    (2006.01)
*G02B 6/44*    (2006.01)

(52) U.S. Cl.
CPC ............ *G02B 6/3897* (2013.01); *G02B 6/4453* (2013.01); *G02B 6/4452* (2013.01); *G02B 6/4455* (2013.01); *G02B 6/4454* (2013.01); *G02B 6/4246* (2013.01); *G02B 6/4277* (2013.01); *H05K 1/0274* (2013.01); *H05K 2201/09163* (2013.01); *H05K 2201/10098* (2013.01); *H05K 2201/10121* (2013.01)
USPC .......................................................... 385/135

(58) Field of Classification Search
CPC ..................................... G02B 6/4452–6/4455
USPC .............................................. 385/135; 29/834
See application file for complete search history.

(56) References Cited

U.S. PATENT DOCUMENTS

| | | | |
|---|---|---|---|
| 5,127,073 A | 6/1992 | Mulholland et al. | 385/92 |
| 6,856,769 B1 | 2/2005 | Steffensen et al. | 398/135 |
| 2003/0063397 A1* | 4/2003 | Inujima et al. | 359/808 |
| 2006/0045436 A1 | 3/2006 | Wang et al. | 385/92 |

OTHER PUBLICATIONS

Patent Cooperation Treaty, International Preliminary Report on Patentability for PCT/US2012/026705, Sep. 3, 2013, 5 pages.

* cited by examiner

*Primary Examiner* — Jerry Blevins

(57) ABSTRACT

Mounting devices for optical devices, and related sub-assemblies, apparatuses, and methods are disclosed. The mounting devices may be employed to secure optical devices that are configured to convert optical signals to electrical signals, or electrical signals to optical signals. The mounting devices may be configured to secure optical devices to an electronics board, such as a printed circuit board (PCB) as an example. To preserve signal integrity, the mounting devices may also be configured to align the optical devices with electrical lead connections on the electronics board. The mounting devices may also be configured to improve grounding of the optical devices to provide and improve radio frequency (RF) shielding to avoid degradation of signal-to-noise (S/N) ratios from RF interference from electronic devices on the electronics board and other nearby electronic devices.

19 Claims, 38 Drawing Sheets

MOUNTING DEVICES FOR OPTICAL DEVICES, AND RELATED SUB-ASSEMBLIES, APPARATUSES, AND METHODS

RELATED APPLICATIONS

This application claims the benefit of priority under 35 U.S.C. §119 of U.S. Provisional Application Ser. No. 61/447,535 filed on Feb. 28, 2011 the content of which is relied upon and incorporated herein by reference in its entirety.

BACKGROUND

1. Field of the Disclosure

The technology of the disclosure relates generally to alignment, mounting, and radio frequency (RF) shielding of optical devices, including transmit optical sub-assemblies (TOSAs) and receive optical sub-assemblies (ROSAs), and related assemblies and methods. The optical devices may be employed in equipment in optical fiber-based distributed antenna equipment for distributing RF signals over optical fiber to remote units.

2. Technical Background

Wireless communication is rapidly growing, with ever-increasing demands for high-speed mobile data communication. As an example, so-called "wireless fidelity" or "WiFi" systems and wireless local area networks (WLANs) are being deployed in many different types of areas (e.g., coffee shops, airports, libraries, etc.). Wireless communication systems communicate with wireless devices called "clients," which must reside within the wireless range or "cell coverage area" in order to communicate with an access point device.

One approach to deploying a wireless communication system involves the use of "picocells." Picocells are radio frequency (RF) coverage areas. Picocells can have a radius in the range from a few meters up to twenty meters as an example. Combining a number of access point devices creates an array of picocells that cover an area called a "picocellular coverage area." Because the picocell covers a small area, there are typically only a few users (clients) per picocell. This allows for minimizing the amount of RF bandwidth shared among the wireless system users. In this regard, head-end equipment and other equipment can be provided to receive incoming RF signals from a wired or wireless network. The head-end equipment distributes the RF signals on a communication downlink to remote antenna units distributed throughout a building or facility, hence providing a distributed antenna system. Client devices within range of the picocells can receive the RF signals and can communicate RF signals back to an antenna in the remote antenna units, which are communicated back on a communication uplink to the head-end equipment and onto the network.

The head-end equipment and other equipment in a distributed communication system may be optical fiber-based. In this regard, the equipment may be configured to convert electrical RF signals into optical RF signals to be communicated over optical fiber to the remote antenna units. Electrical-to-optical converters, such as a transmit optical sub-assembly (TOSA) optical device, may be employed in the head-end equipment to convert the electrical RF signals to optical RF signals and distribute the optical RF signals over downlink optical fiber to the remote antenna units. The remote antenna units receive the optical RF signals over the downlink optical fiber and convert these optical RF signals to electrical RF signals using optical-to-electrical converters to distribute the recovered electrical RF signals to client devices. Electrical RF signals received from client devices are likewise converted into optical RF signals using electrical-to-optical converters to distribute the optical RF signals over uplink optical fiber to head-end equipment. Optical-to-electrical converters, such as a receive optical sub-assembly (ROSA) optical device may be employed in the head-end equipment to convert the optical RF signals from the uplink optical fiber to electrical RF signals.

The optical devices (e.g., TOSAs and ROSAs) may be mounted or positioned on printed circuit boards (PCBs) provided in the head-end equipment to transmit and/or receive optical signals. Mounting or positioning of optical devices onto a PCB may limit the length of exposed, unshielded wire extensions between the optical devices and printed traces on the PCB to provide for signal integrity of the signals after conversion from optical to electrical signals. However, undesired losses can still be present. For example, mis-alignment of the optical devices to the PCB can result in power transfer losses between the connection of the optical device to electrical leads on the PCB. Further, RF interference that can occur between the electronic devices on the PCB and the optical device mounted thereto can result in higher signal-to-noise (S/N) ratios.

SUMMARY OF THE DETAILED DESCRIPTION

Embodiments disclosed in the detailed description include mounting devices for optical devices, and related sub-assemblies, apparatuses, and methods. The mounting devices may be employed to secure optical devices that are configured to convert optical signals to electrical signals, or electrical signals to optical signals. The mounting devices may be configured to secure optical devices to an electronics board, such as a printed circuit board (PCB) as an example. To preserve signal integrity, the mounting devices may also be configured to align the optical devices with electrical lead connections on the electronics board. The mounting devices may also be configured to improve grounding of the optical devices to provide and improve radio frequency (RF) shielding to avoid degradation of signal-to-noise (S/N) ratios from RF interference from electronic devices on the electronics board and other nearby electronic devices.

In this regard in one embodiment, a mounting device for mounting an optical device in an optical sub-assembly is provided. This mounting device comprises a retention structure comprising a retention opening disposed along a longitudinal axis of the retention structure. This mounting device also comprises at least one mounting surface disposed adjacent to the retention structure and disposed along a plane that intersects with the retention opening. The at least one mounting surface is configured to attached to an electronics board of an optical sub-assembly to secure the retention structure to the electronics board. The retention structure is configured to retain at least a portion of an optical device comprising an optical interface in the retention opening to align the at least a portion of the optical device with a longitudinal axis of the retention opening. As one non-limiting example, the configuration of the at least one mounting surface to the retention opening in this mounting device may allow the mounting device to be used for edge mounting of an optical device to an electronics board.

In another embodiment, an optical sub-assembly is provided. This optical sub-assembly comprises a mounting device comprising a retention structure. This retention structure comprises a retention opening disposed along a longitudinal axis of the retention structure, and at least one mounting surface disposed adjacent to the retention structure and disposed along a plane that intersects with the retention opening.

This optical sub-assembly also comprises an optical device comprising an optical interface. At least a portion of the optical device is retained in the retention opening to align the at least a portion of the optical device with a longitudinal axis of the retention opening. As a non-limiting example, the configuration of the at least one mounting surface to the retention opening may allow the mounting device to be used for edge mounting of an optical device to an electronics board.

In another embodiment, an optical interface apparatus is provided. This optical interface apparatus comprises an electronics board. The electronics board comprises a board opening disposed in the electronics board, the board opening forming a first opening edge in the electronics board. An optical interface is disposed in the electronics board adjacent to the first opening edge. This optical interface apparatus also comprises an optical device disposed in the board opening of the electronics board, the optical device connected to the optical interface. This optical interface apparatus also comprises a mounting device disposed in contact with at least a portion of the optical device, and disposed across the optical device and the board opening in the electronics board to secure the optical device to the electronics board.

In another embodiment, a method for aligning an optical device electrically connected to an electronics board is provided. This method includes disposing at least a portion of a body of an optical device within a retention structure of a mounting device. This method also includes positioning the at least a portion of the optical device disposed within the retention structure of the mounting device in a board opening disposed in an electronics board, the board opening forming a first opening edge in the electronics board. This method also includes disposing the mounting device across the board opening in the electronics board. This method also includes securing the mounting device to the electronics board to secure the optical device within the board opening of the electronics board. This method also includes attaching the optical device to an optical interface disposed in the electronics board adjacent to the first opening edge.

Additional features and advantages will be set forth in the detailed description which follows, and in part will be readily apparent to those skilled in the art from that description or recognized by practicing the embodiments as described herein, including the detailed description that follows, the claims, as well as the appended drawings.

It is to be understood that both the foregoing general description and the following detailed description present embodiments, and are intended to provide an overview or framework for understanding the nature and character of the disclosure. The accompanying drawings are included to provide a further understanding, and are incorporated into and constitute a part of this specification. The drawings illustrate various embodiments, and together with the description serve to explain the principles and operation of the concepts disclosed.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein; rather, these embodiments are provided so that this disclosure will satisfy applicable legal requirements. Whenever possible, like reference numbers will be used to refer to like components or parts.

Embodiments disclosed in the detailed description include mounting devices for optical devices, and related sub-assemblies, apparatuses, and methods. The mounting devices may be employed to secure optical devices that are configured to convert optical signals to electrical signals, or electrical signals to optical signals. The mounting devices may be configured to secure optical devices to an electronics board, such as a printed circuit board (PCB) as an example. To preserve signal integrity, the mounting devices may also be configured to align the optical devices with electrical lead connections on the electronics board. The mounting devices may also be configured to improve grounding of the optical devices to provide and improve radio frequency (RF) shielding to avoid degradation of signal-to-noise (S/N) ratios from RF interference from electronic devices on the electronics board and other nearby electronic devices.

Figure 1:
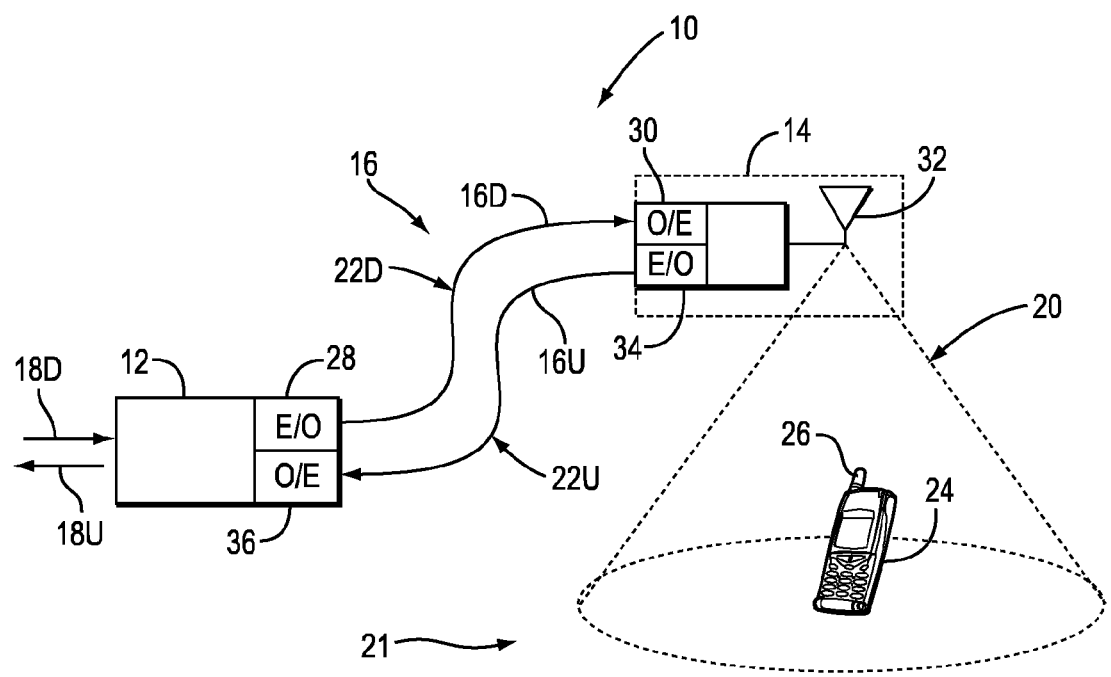
FIG. 1 is a schematic diagram of an exemplary optical fiber-based distributed antenna system.
Figure 2:
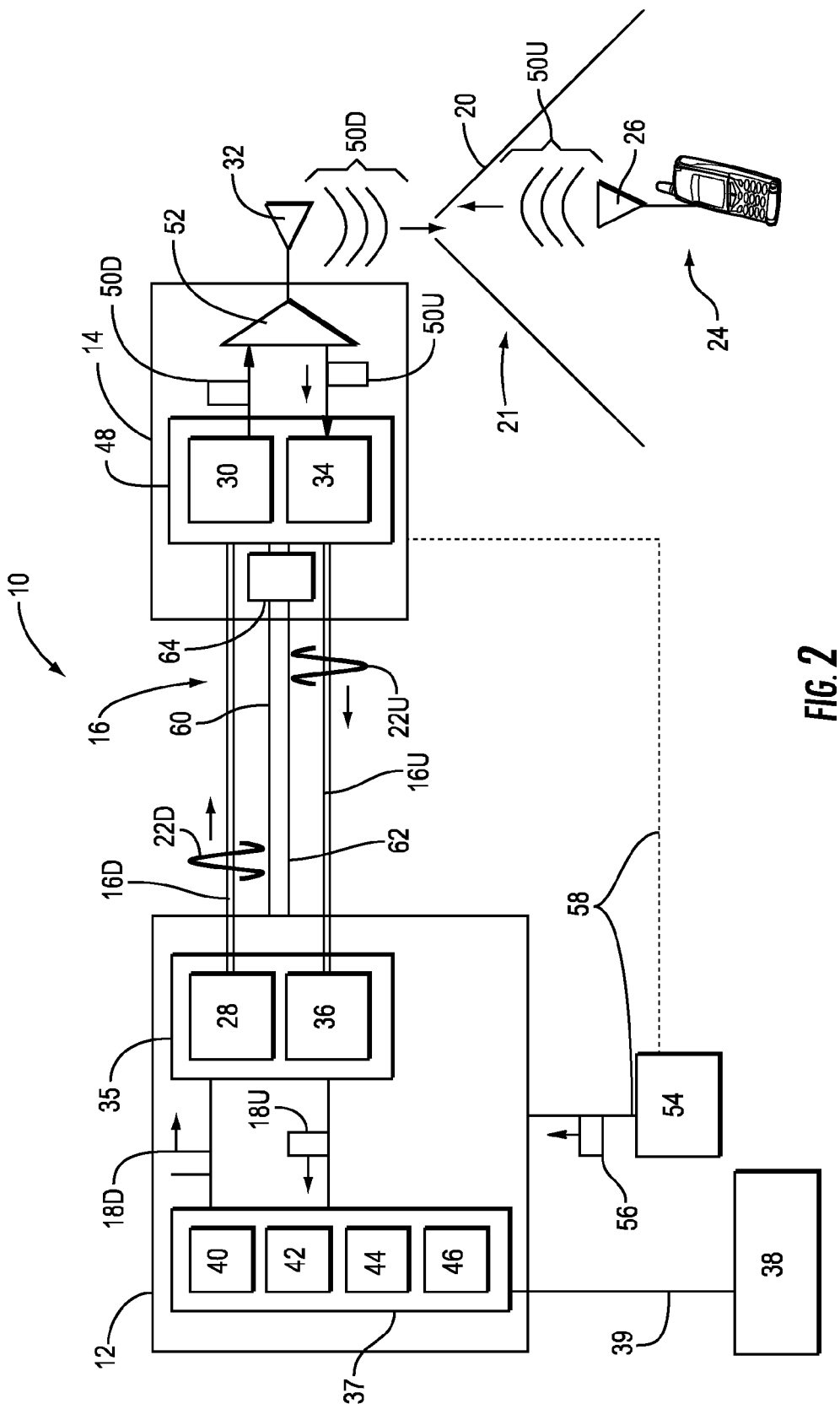
FIG. 2 is a more detailed schematic diagram of exemplary head-end equipment and a remote antenna unit (RAU) that can be deployed in the optical fiber-based distributed antenna system of FIG. 1.
Figure 3:
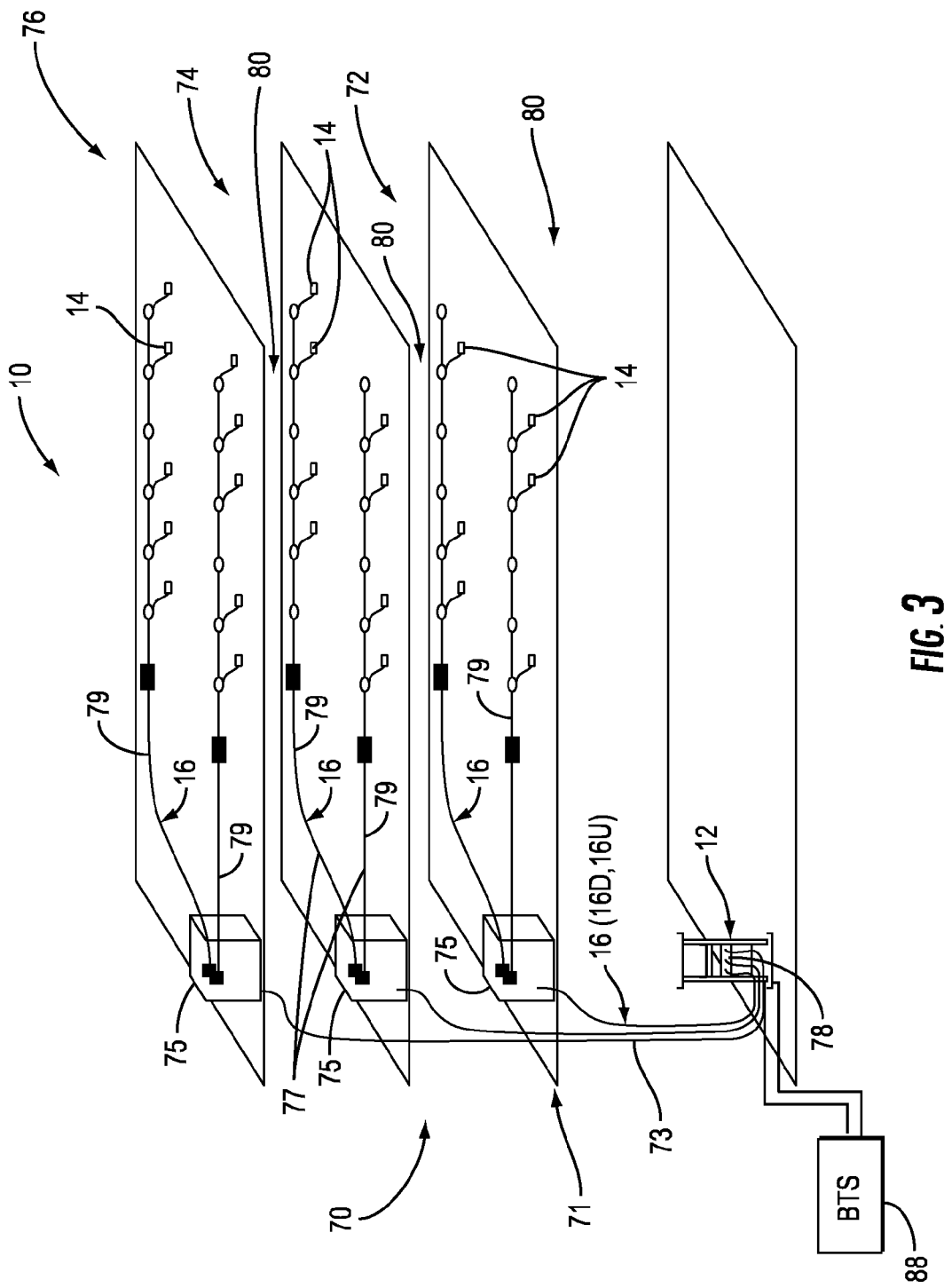
FIG. 3 is a partially schematic cut-away diagram of an exemplary building infrastructure in which the optical fiber-based distributed antenna system in FIGS. 1 and 2 can be employed.

Before discussing examples of mounting devices for optical devices, and related sub-assemblies, apparatuses, and methods, an exemplary systems and equipment that may employ the optical devices and related sub-assemblies, apparatuses, and methods disclosed herein are discussed with regard to FIGS. 1-8B. FIGS. 1-3 illustrate exemplary optical fiber-based distributed antenna systems that include optical devices for converting optical RF signals to electrical RF signals and vice versa to distribute RF communication services over optical fiber to and from remote antenna units. FIGS. 4-8B illustrate exemplary head-end equipment that includes optical interface modules and cards for converting optical RF signals to electrical RF signals and vice versa to distribute RF communication services over optical fiber to and from remote antenna units. As non-limiting examples, the optical interface modules are exemplary optical devices in which the mounting devices and related sub-assemblies, apparatus, and methods disclosed herein may be provided.

FIG. 1 is a schematic diagram of an embodiment of an optical fiber-based distributed antenna system 10 configured to create one or more antenna coverage areas for establishing communications with wireless client devices located in the RF range of the antenna coverage areas. The optical fiber-based distributed antenna system 10 provides RF communication services (e.g., cellular services). In this embodiment, the optical fiber-based distributed antenna system 10 includes head-end equipment (HEE) 12 such as a head-end unit (HEU), one or more remote antenna units (RAUs) 14, and an optical fiber 16 that optically couples HEE 12 to the RAU 14. The RAU 14 is a type of remote communications unit. In general, a remote communications unit can support either wireless communications, wired communications, or both. The RAU 14 can support wireless communications and may also support wired communications. The HEE 12 is configured to receive communications over downlink electrical RF signals 18D from a source or sources, such as a network or carrier as examples, and provide such communications to the RAU 14. The HEE 12 is also configured to return communications received from the RAU 14, via uplink electrical RF signals 18U, back to the source or sources. In this regard in this embodiment, the optical fiber 16 includes at least one downlink optical fiber 16D to carry signals communicated from the HEE 12 to the RAU 14 and at least one uplink optical fiber 16U to carry signals communicated from the RAU 14 back to the HEE 12.

The optical fiber-based distributed antenna system 10 has an antenna coverage area 20 that can be substantially centered about the RAU 14. The antenna coverage area 20 of the RAU 14 forms an RF coverage area 21. The HEE 12 is adapted to perform or to facilitate any one of a number of Radio-over-Fiber (RoF) applications, such as RF identification (RFID), wireless local-area network (WLAN) communication, or cellular phone service. Shown within the antenna coverage area 20 is a client device 24 in the form of a mobile device as an example, which may be a cellular telephone as an example. The client device 24 can be any device that is capable of receiving RF communication signals. The client device 24 includes an antenna 26 (e.g., a wireless card) adapted to receive and/or send electromagnetic RF signals.

With continuing reference to FIG. 1, to communicate the electrical RF signals over the downlink optical fiber 16D to the RAU 14, to in turn be communicated to the client device 24 in the antenna coverage area 20 formed by the RAU 14, the HEE 12 includes an electrical-to-optical (E/O) converter 28. The E/O converter 28 converts the downlink electrical RF signals 18D to downlink optical RF signals 22D to be communicated over the downlink optical fiber 16D. The RAU 14 includes an optical-to-electrical (O/E) converter 30 to convert received downlink optical RF signals 22D back to electrical RF signals to be communicated wirelessly through an antenna 32 of the RAU 14 to client devices 24 located in the antenna coverage area 20.

Similarly, the antenna 32 is also configured to receive wireless RF communications from client devices 24 in the antenna coverage area 20. In this regard, the antenna 32 receives wireless RF communications from client devices 24 and communicates electrical RF signals representing the wireless RF communications to an E/O converter 34 in the RAU 14. The E/O converter 34 converts the electrical RF signals into uplink optical RF signals 22U to be communicated over the uplink optical fiber 16U. An O/E converter 36 provided in the HEE 12 converts the uplink optical RF signals 22U into uplink electrical RF signals, which can then be communicated as uplink electrical RF signals 18U back to a network or other source. The HEE 12 in this embodiment is not able to distinguish the location of the client devices 24 in this embodiment. The client device 24 could be in the range of any antenna coverage area 20 formed by an RAU 14.

FIG. 2 is a more detailed schematic diagram of the exemplary optical fiber-based distributed antenna system of FIG. 1 that provides electrical RF service signals for a particular RF service or application. In an exemplary embodiment, the HEE 12 includes a service unit 37 that provides electrical RF service signals by passing (or conditioning and then passing) such signals from one or more outside networks 38 via a network link 39. In a particular example embodiment, this includes providing WLAN signal distribution as specified in the Institute of Electrical and Electronics Engineers (IEEE) 802.11 standard, i.e., in the frequency range from 2.4 to 2.5 GigaHertz (GHz) and from 5.0 to 6.0 GHz. Any other electrical RF signal frequencies are possible. In another exemplary embodiment, the service unit 37 provides electrical RF service signals by generating the signals directly. In another exemplary embodiment, the service unit 37 coordinates the delivery of the electrical RF service signals between client devices 24 within the antenna coverage area 20.

With continuing reference to FIG. 2, the service unit 37 is electrically coupled to the E/O converter 28 that receives the downlink electrical RF signals 18D from the service unit 37 and converts them to corresponding downlink optical RF signals 22D. In an exemplary embodiment, the E/O converter 28 includes a laser suitable for delivering sufficient dynamic range for the RoF applications described herein, and optionally includes a laser driver/amplifier electrically coupled to the laser. Examples of suitable lasers for the E/O converter 28 include, but are not limited to, laser diodes, distributed feedback (DFB) lasers, Fabry-Perot (FP) lasers, and vertical cavity surface emitting lasers (VCSELs).

With continuing reference to FIG. 2, the HEE 12 also includes the O/E converter 36, which is electrically coupled to the service unit 37. The O/E converter 36 receives the uplink optical RF signals 22U and converts them to corresponding uplink electrical RF signals 18U. In an example embodiment, the O/E converter 36 is a photodetector, or a photodetector electrically coupled to a linear amplifier. The E/O converter 28 and the O/E converter 36 constitute a "converter pair" 35, as illustrated in FIG. 2.

In accordance with an exemplary embodiment, the service unit 37 in the HEE 12 can include an RF signal conditioner unit 40 for conditioning the downlink electrical RF signals 18D and the uplink electrical RF signals 18U, respectively. The service unit 37 can include a digital signal processing unit ("digital signal processor") 42 for providing to the RF signal conditioner unit 40 an electrical signal that is modulated onto an RF carrier to generate a desired downlink electrical RF signal 18D. The digital signal processor 42 is also configured to process a demodulation signal provided by the demodulation of the uplink electrical RF signal 18U by the RF signal conditioner unit 40. The HEE 12 can also include an optional central processing unit (CPU) 44 for processing data and otherwise performing logic and computing operations, and a memory unit 46 for storing data, such as data to be transmitted over a WLAN or other network for example.

With continuing reference to FIG. 2, the RAU 14 also includes a converter pair 48 comprising the O/E converter 30 and the E/O converter 34. The O/E converter 30 converts the received downlink optical RF signals 22D from the HEE 12 back into downlink electrical RF signals 50D. The E/O converter 34 converts uplink electrical RF signals 50U received from the client device 24 into the uplink optical RF signals 22U to be communicated to the HEE 12. The O/E converter 30 and the E/O converter 34 are electrically coupled to the antenna 32 via an RF signal-directing element 52, such as a circulator for example. The RF signal-directing element 52 serves to direct the downlink electrical RF signals 50D and the uplink electrical RF signals 50U, as discussed below. In accordance with an exemplary embodiment, the antenna 32 can include any type of antenna, including but not limited to one or more patch antennas, such as disclosed in U.S. patent application Ser. No. 11/504,999, filed Aug. 16, 2006 entitled "Radio-over-Fiber Transponder With A Dual-Band Patch Antenna System," and U.S. patent application Ser. No. 11/451,553, filed Jun. 12, 2006 entitled "Centralized Optical Fiber-Based Wireless Picocellular Systems and Methods," both of which are incorporated herein by reference in their entireties.

With continuing reference to FIG. 2, the optical fiber-based distributed antenna system 10 also includes a power supply 54 that provides an electrical power signal 56. The power supply 54 is electrically coupled to the HEE 12 for powering the power-consuming elements therein. In an exemplary embodiment, an electrical power line 58 runs through the HEE 12 and over to the RAU 14 to power the O/E converter 30 and the E/O converter 34 in the converter pair 48, the optional RF signal-directing element 52 (unless the RF signal-directing element 52 is a passive device such as a circulator for example), and any other power-consuming elements provided. In an exemplary embodiment, the electrical power line 58 includes two wires 60 and 62 that carry a single voltage and are electrically coupled to a DC power converter 64 at the RAU 14. The DC power converter 64 is electrically coupled to the O/E converter 30 and the E/O converter 34 in the converter pair 48, and changes the voltage or levels of the electrical power signal 56 to the power level(s) required by the power-consuming components in the RAU 14. In an exemplary embodiment, the DC power converter 64 is either a DC/DC power converter or an AC/DC power converter, depending on the type of electrical power signal 56 carried by the electrical power line 58. In another example embodiment, the electrical power line 58 (dashed line) runs directly from the power supply 54 to the RAU 14 rather than from or through the HEE 12. In another example embodiment, the electrical power line 58 includes more than two wires and may carry multiple voltages.

To provide further exemplary illustration of how an optical fiber-based distributed antenna system can be deployed indoors, FIG. 3 is provided. FIG. 3 is a partially schematic cut-away diagram of a building infrastructure 70 employing an optical fiber-based distributed antenna system. The system may be the optical fiber-based distributed antenna system 10 of FIGS. 1 and 2. The building infrastructure 70 generally represents any type of building in which the optical fiber-based distributed antenna system 10 can be deployed. As previously discussed with regard to FIGS. 1 and 2, the optical fiber-based distributed antenna system 10 incorporates the HEE 12 to provide various types of communication services to coverage areas within the building infrastructure 70, as an example. For example, as discussed in more detail below, the optical fiber-based distributed antenna system 10 in this embodiment is configured to receive wireless RF signals and convert the RF signals into RoF signals to be communicated over the optical fiber 16 to multiple RAUs 14. The optical fiber-based distributed antenna system 10 in this embodiment can be, for example, an indoor distributed antenna system (IDAS) to provide wireless service inside the building infrastructure 70. These wireless signals can include cellular service, wireless services such as RFID tracking, Wireless Fidelity (WiFi), local area network (LAN), WLAN, and combinations thereof, as examples.

With continuing reference to FIG. 3, the building infrastructure 70 in this embodiment includes a first (ground) floor 72, a second floor 74, and a third floor 76. The floors 72, 74, 76 are serviced by the HEE 12 through a main distribution frame 78 to provide antenna coverage areas 80 in the building infrastructure 70. Only the ceilings of the floors 72, 74, 76 are shown in FIG. 3 for simplicity of illustration. In the example embodiment, a main cable 71 has a number of different sections that facilitate the placement of a large number of RAUs 14 in the building infrastructure 70. Each RAU 14 in turn services its own coverage area in the antenna coverage areas 80. The main cable 71 can include, for example, a riser cable 73 that carries all of the downlink and uplink optical fibers 16D, 16U to and from the HEE 12. The riser cable 73 may be routed through an interconnect unit (ICU) 75. The ICU 75 may be provided as part of or separate from the power supply 54 in FIG. 2. The ICU 75 may also be configured to provide power to the RAUs 14 via the electrical power line 58, as illustrated in FIG. 2 and discussed above, provided inside an array cable 79, or tail cable or home-run tether cable as other examples, and distributed with the downlink and uplink optical fibers 16D, 16U to the RAUs 14. The main cable 71 can include one or more multi-cable (MC) connectors adapted to connect select downlink and uplink optical fibers 16D, 16U, along with an electrical power line, to a number of optical fiber cables 77.

The main cable 71 enables multiple optical fiber cables 77 to be distributed throughout the building infrastructure 70 (e.g., fixed to the ceilings or other support surfaces of each floor 72, 74, 76) to provide the antenna coverage areas 80 for the first, second, and third floors 72, 74, and 76. In an example embodiment, the HEE 12 is located within the building infrastructure 70 (e.g., in a closet or control room), while in another example embodiment, the HEE 12 may be located outside of the building infrastructure 70 at a remote location.

A base transceiver station (BTS) 88, which may be provided by a second party such as a cellular service provider, is connected to the HEE 12, and can be co-located or located remotely from the HEE 12. A BTS is any station or source that provides an input signal to the HEE 12 and can receive a return signal from the HEE 12. In a typical cellular system, for example, a plurality of BTSs are deployed at a plurality of remote locations to provide wireless telephone coverage. Each BTS serves a corresponding cell and when a mobile client device enters the cell, the BTS communicates with the mobile client device. Each BTS can include at least one radio transceiver for enabling communication with one or more subscriber units operating within the associated cell. As another example, wireless repeaters or bi-directional amplifiers could also be used to serve a corresponding cell in lieu of a BTS. Alternatively, radio input could be provided by a repeater or picocell as other examples.

The optical fiber-based distributed antenna system 10 in FIGS. 1-3 and described above provides point-to-point communications between the HEE 12 and the RAU 14. Each RAU 14 communicates with the HEE 12 over a distinct downlink and uplink optical fiber pair to provide the point-to-point communications. Whenever an RAU 14 is installed in the optical fiber-based distributed antenna system 10, the RAU 14 is connected to a distinct downlink and uplink optical fiber pair connected to the HEE 12. The downlink and uplink optical fibers 16D, 16U may be provided in a fiber optic cable. Multiple downlink and uplink optical fiber pairs can be provided in a fiber optic cable to service multiple RAUs 14 from a common fiber optic cable. For example, with reference to FIG. 3, RAUs 14 installed on a given floor 72, 74, or 76 may be serviced from the same optical fiber 16. In this regard, the optical fiber 16 may have multiple nodes where distinct downlink and uplink optical fiber pairs can be connected to a given RAU 14. One downlink optical fiber 16D could be provided to support multiple channels each using wavelength-division multiplexing (WDM), as discussed in U.S. patent application Ser. No. 12/892,424 entitled "Providing Digital Data Services in Optical Fiber-based Distributed Radio Frequency (RF) Communications Systems, And Related Components and Methods," incorporated herein by reference in its entirety. Other options for WDM and frequency-division multiplexing (FDM) are also disclosed in U.S. patent application Ser. No. 12/892,424, any of which can be employed in any of the embodiments disclosed herein.

The HEE 12 may be configured to support any frequencies desired, including but not limited to US FCC and Industry Canada frequencies (824-849 MHz on uplink and 869-894 MHz on downlink), US FCC and Industry Canada frequencies (1850-1915 MHz on uplink and 1930-1995 MHz on downlink), US FCC and Industry Canada frequencies (1710-1755 MHz on uplink and 2110-2155 MHz on downlink), US FCC frequencies (698-716 MHz and 776-787 MHz on uplink and 728-746 MHz on downlink), EU R & TTE frequencies (880-915 MHz on uplink and 925-960 MHz on downlink), EU R & TTE frequencies (1710-1785 MHz on uplink and 1805-1880 MHz on downlink), EU R & TTE frequencies (1920-1980 MHz on uplink and 2110-2170 MHz on downlink), US FCC frequencies (806-824 MHz on uplink and 851-869 MHz on downlink), US FCC frequencies (896-901 MHz on uplink and 929-941 MHz on downlink), US FCC frequencies (793-805 MHz on uplink and 763-775 MHz on downlink), and US FCC frequencies (2495-2690 MHz on uplink and downlink).

Figure 4:
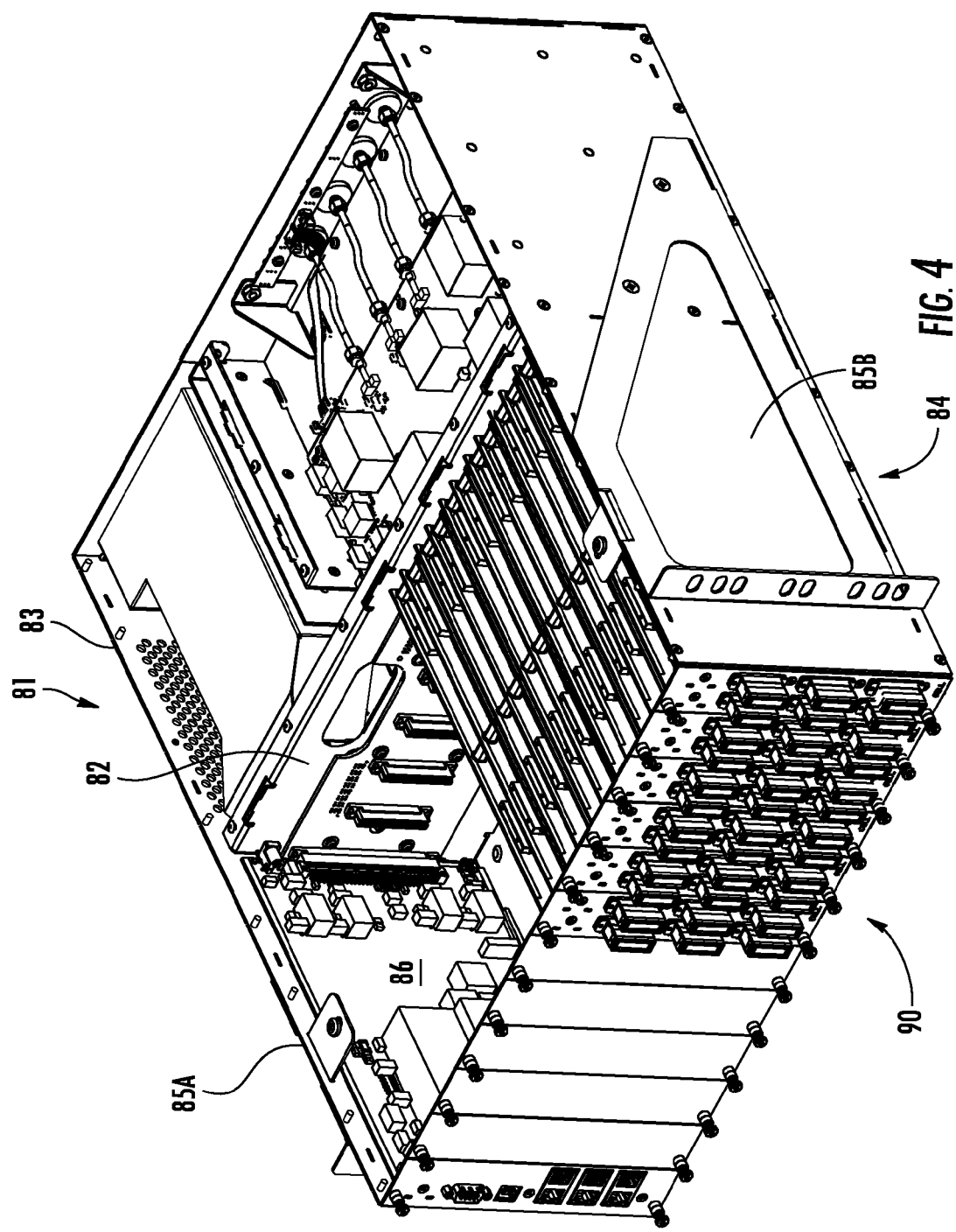
FIG. 4 is an exemplary distributed antenna system equipment housing assembly ("assembly") and head-end equipment that may be employed in the distributed antenna system of optical fiber-based distributed antenna system of FIGS. 1 and 2.

FIG. 4 illustrates an exemplary distributed antenna system housing assembly 81 (referred to as "assembly 81") that may be employed to provide an HEE, such as the HEE 12 in FIGS. 1-3. The assembly 81 is configured to be easily assembled in a factory or in the field by a technician. Further, the assembly 81 supports a number of features that allow interface cards to be easily inserted and aligned with respect to a midplane interface card 82 to ensure that proper connections are made with other components of the HEE 12 that form part of the distributed antenna system, such as the optical-fiber based distributed antenna system 10 in FIGS. 1-3, for example. As illustrated in FIG. 4, the assembly 81 includes an enclosure 83. The enclosure 83 is comprised of a bottom plate 84 and side plates 85A, 85B. An internal cavity 86 is formed in the space formed inside the bottom plate 84 and the side plates 85A, 85B when assembled together for locating components of the HEE 12, such as the components illustrated in FIG. 2, for example. A top plate (not shown) could also be provided and secured to the side plates 85A, 85B, to protect the internal cavity 86 and protect components of the HEE 12 disposed therein.

Figure 5:
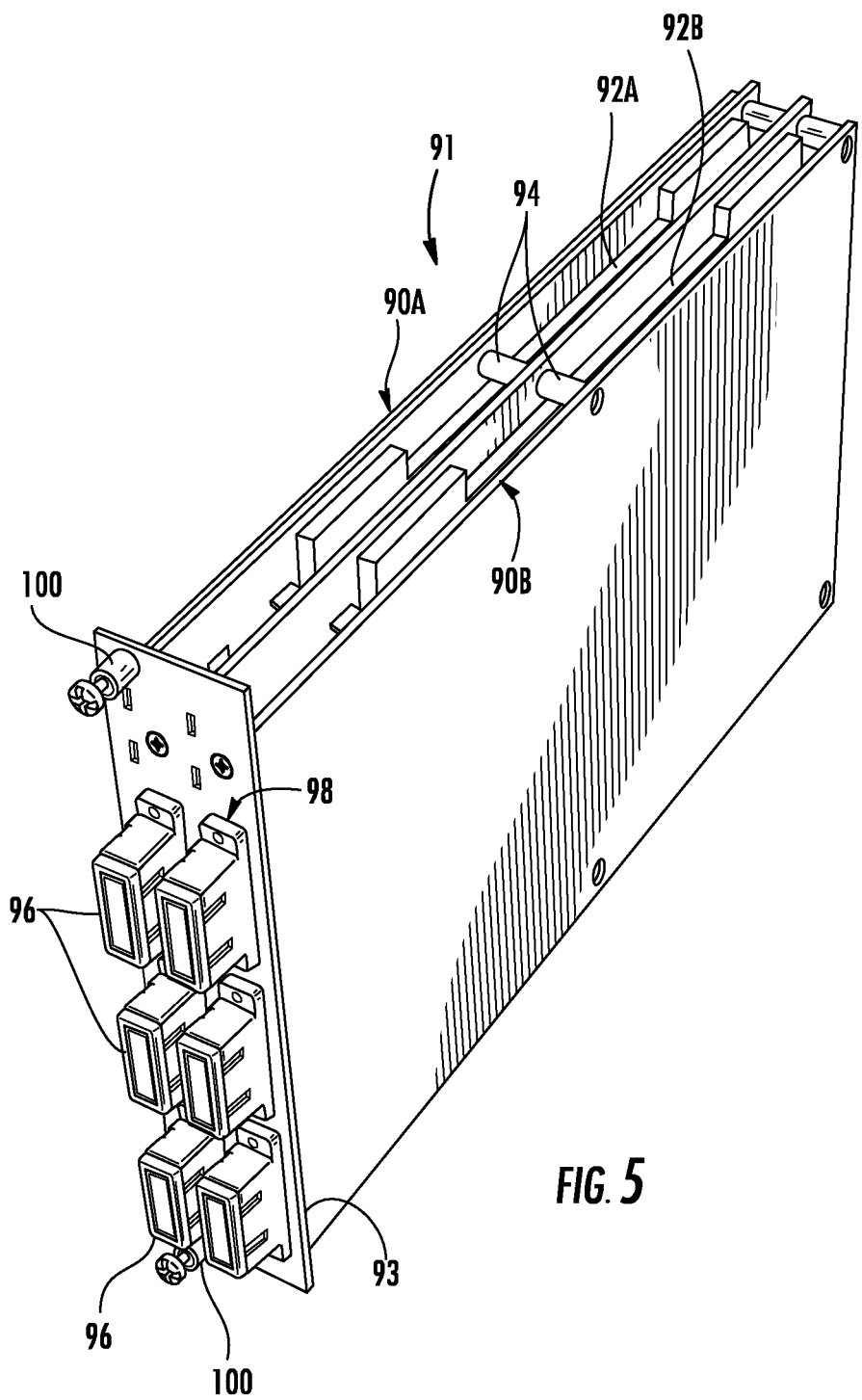
FIG. 5 is an exemplary optical interface module (OIM) comprised of a pair of optical interface cards (OIC) configured to be installed in the distributed antenna system equipment housing assembly of FIG. 4 as part of the head-end equipment.

With continuing reference to FIG. 4, the enclosure 83 is configured to support optical interface cards (OICs) 90 illustrated in FIG. 5. An OIC 90 contains electronics and related optical components to convert electrical signals to optical signals to be distributed over optical fiber and vice versa. In this embodiment as illustrated FIG. 5, OICs 90A, 90B are grouped together in pairs to form an optical interface module (OIM) 91. Thus, an OIM 91 is comprised of two (2) OICs 90A, 90B in this embodiment that each support up to three (3) RAUs 14, and thus the OIM 91 supports up to six (6) RAUs 14 in this embodiment. As illustrated in FIG. 5, each OIC 90A, 90B is provided as an electronics board 92A, 92B (e.g., a printed circuit board (PCB)) with integrated circuits provided therein to provide electrical signal to optical signal conversions for communication downlinks and vice versa for communication uplinks. An OIM plate 93 is provided to assist in coupling a pair of OICs 90A, 90B together to form the OIM 91. The pair of OICs 90A, 90B is secured to the OIM plate 93 to form the OIM 91. The OIM plate 93 serves to support the OICs 90A, 90B and contribute to the alignment of the OICs 90A, 90B for proper insertion into and attachment to the enclosure 83, which in turn assists in providing for a proper and aligned connection of the OICs 90A, 90B to the midplane interface card 82, as shown in FIG. 4.

The OICs 90A, 90B are also secured together via standoff connectors 94 that contain alignment features to allow self-alignment between the OICs 90A, 90B when connected to the midplane interface card 82, as illustrated in FIG. 4. Connector adapters 96 are disposed in the OIM plate 93 and provide for optical connections of the electronics boards 92A, 92B of the OICs 90A, 90B. The connector adapters 96 are disposed through openings 98 in the OIM plate 93 to provide external access when the OIM 91 is installed in the enclosure 83. RAUs 14 can be connected to the connector adapters 96 to establish connections to the OICs 90A, 90B via the optical fiber cables connected to the connector adapters 96. These connector adapters 96 may be configured to receive any type of fiber optic connector, including but not limited to FC, LC, SC, ST, MTP, and MPO. The OIM 91 is secured to the enclosure 83 via spring-loaded connector screws 100 disposed in the OIM plate 93 to secure the OIM plate 93, and thus the OIM 91, in the enclosure 83, as illustrated in FIG. 4.

Figure 6:
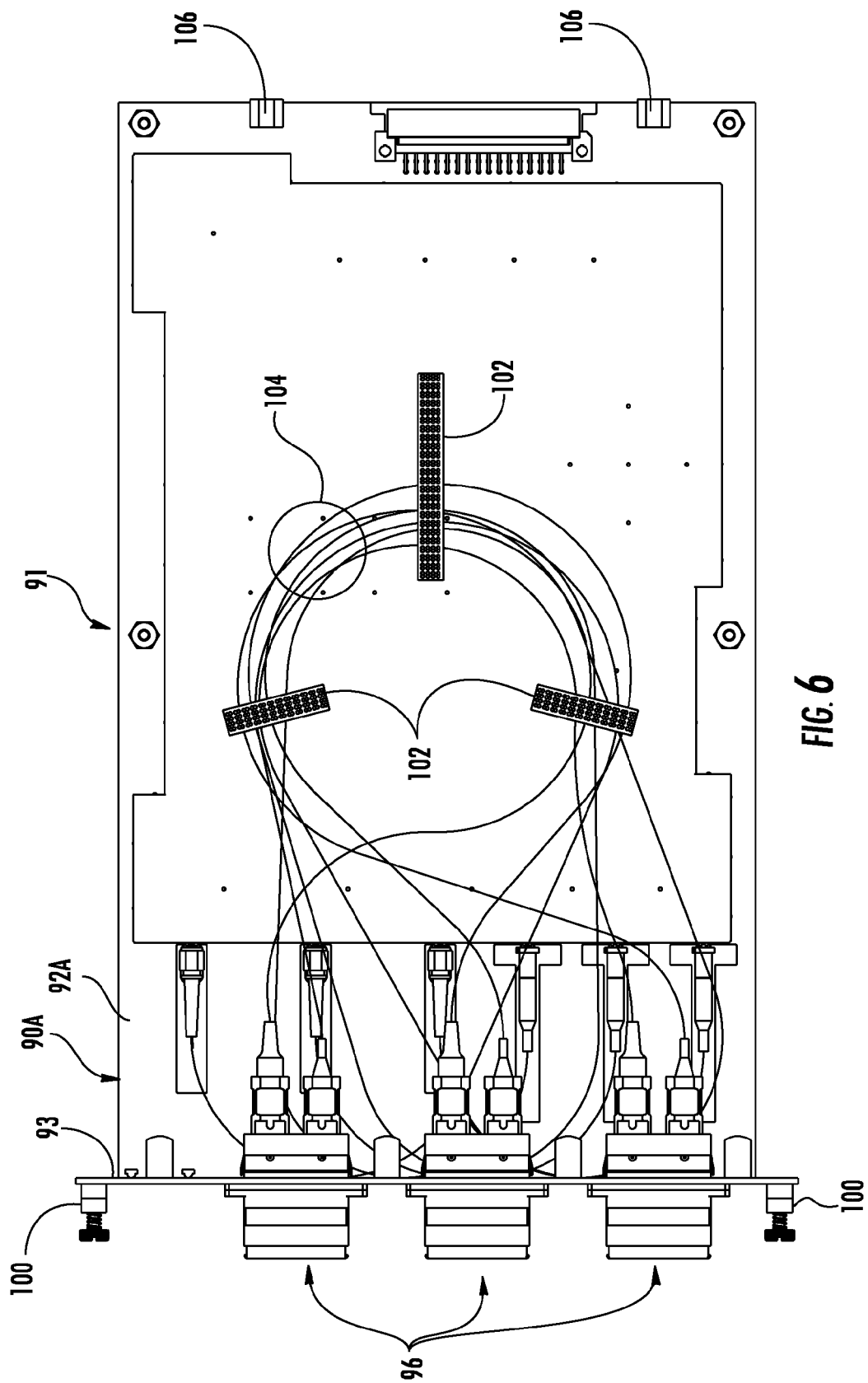
FIG. 6 is a top view of an OIC in the OIM in FIG. 5.

As illustrated in FIG. 6, fiber routing guides 102 can be provided in the OIM 91 to assist in routing optical fibers 104 from the connector adapters 96 that are configured to connect to optical fibers 104 connected to the RAUs 14 (see FIG. 2). The optical fibers 104 are connected to the electronic components of the OICs 90A, 90B to convert the received uplink optical signals from the RAUs 14 into electrical signals to be distributed via an RF connector 106.

Figure 7:
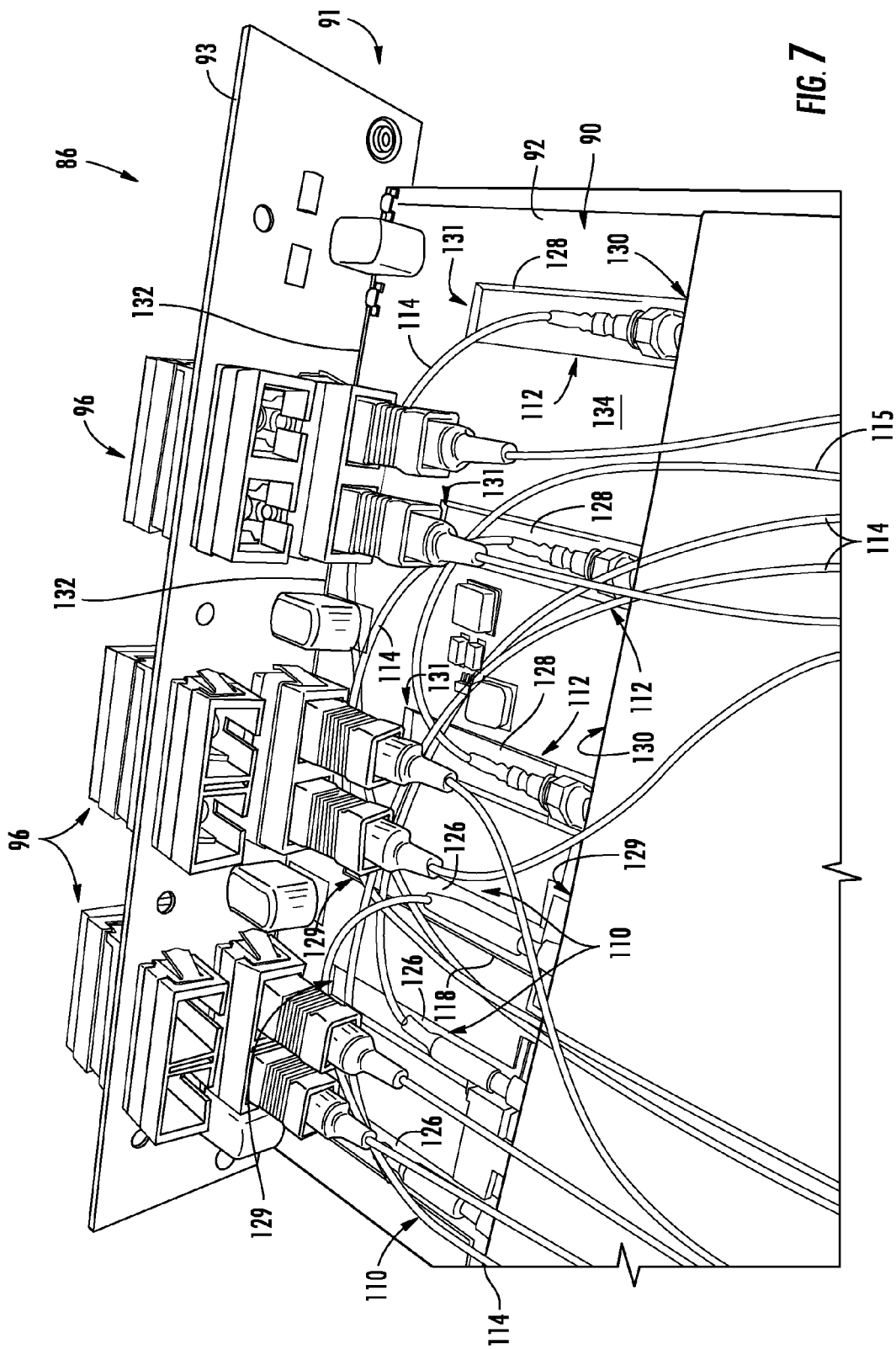
FIG. 7 is a top perspective view of an OIC disposed in the OIM of FIG. 5 and illustrating transmit optical sub-assemblies (TOSAs) and receive optical sub-assemblies (ROSAs) disposed in openings in the OIC electronics board.
Figure 8:
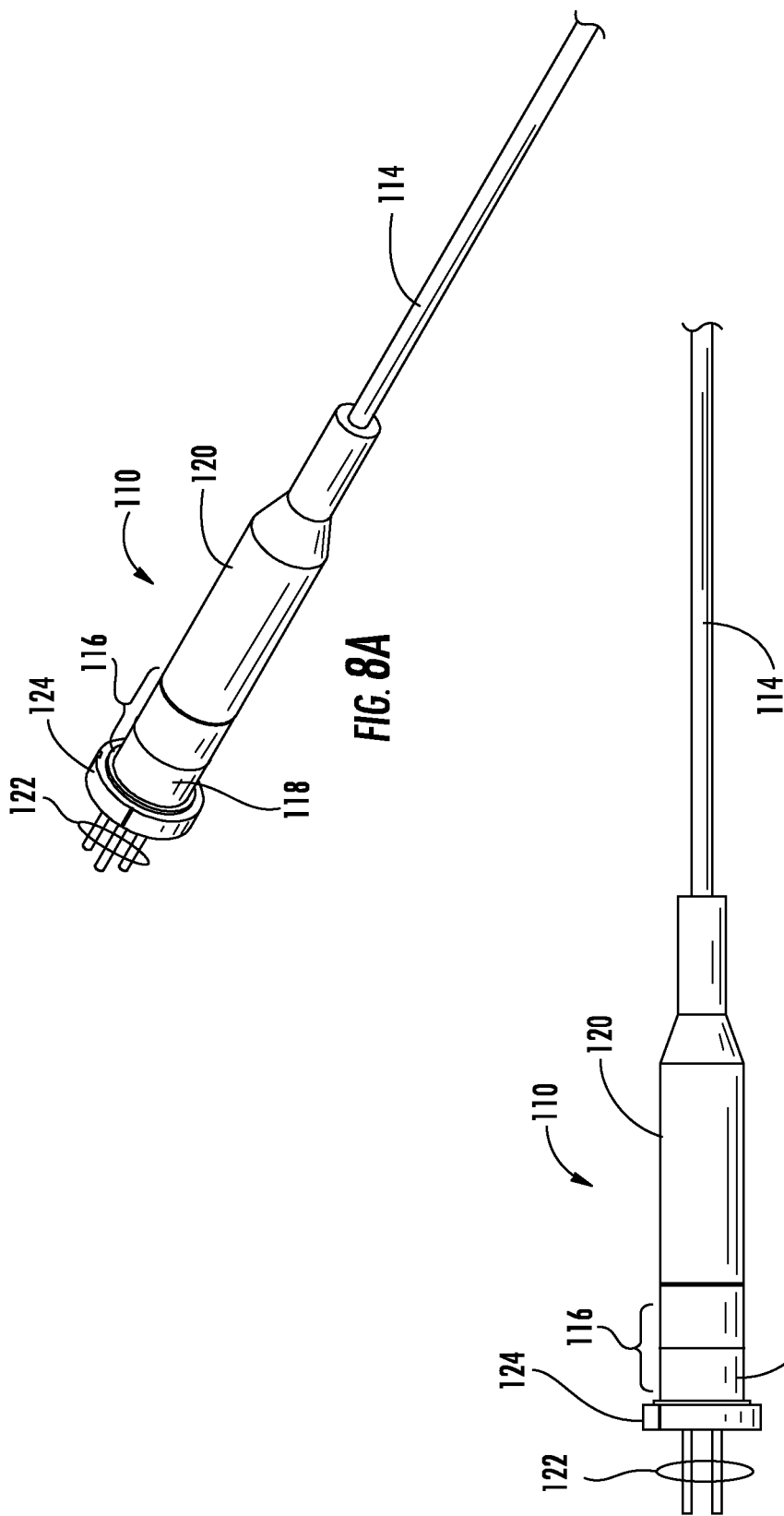
FIGS. 8A and 8B are perspective and side views, respectively, of an exemplary TOSA with an optical fiber tether connected to the TOSA.

FIG. 7 is a top perspective view of an OIC 90 disposed in the OIM 91 of FIG. 5 and illustrating optical devices that are mounted or positioned on an end of the electronics board 92 to transmit and/or receive optical signals interfaced with electrical signal components disposed in the electronics board 92. The optical devices are transmit optical sub-assemblies (TOSAs) 110 and receive optical sub-assemblies (ROSAs) 112. The TOSAs 110 and ROSAs 112 are connected via optical fiber tethers 114, 115 to the connector adapters 96 that extend through the OIM plate 93 to allow connections to be made thereto.

FIGS. 8A and 8B illustrate an exemplary TOSA 110. FIGS. 8A and 8B are perspective and side views, respectively, of the TOSA 110 with the optical fiber tether 114 connected to the TOSA 110. As illustrated therein, the TOSA 110 is comprised of a body 116 that includes a can 118. A fiber strain relief boot 120 is provided to provide strain relief between the optical fiber tether 114 and the body 116. The can 118 contains a light source, such as a surface emitting laser diode matched to a lens in an end portion of the optical fiber tether 114. To electrically connect the laser in the can 118, electrical leads 122 are provided. A flange 124 is disposed on the can 118 wherein the electrical leads 122 are disposed through the flange 124. Thus, if the TOSA 110 is to be electrically connected, the electrical leads 122 must be connected to the desired electrical interface, such as through soldering or other connection type. In the electronics board 92 of FIG. 7, the electrical leads 122 of the TOSA 110 are connected to an electrical connector or trace on the electronics board 92. Thus, in this example, the TOSA 110 must also be mounted or disposed in some fashion with the electronics board 92.

In this embodiment with reference to FIG. 7, the TOSAs 110 and ROSAs 112 are mounted or positioned on openings 126, 128, respectively, disposed on the electronics board 92 to transmit and/or receive optical signals interfaced with electrical signal components disposed in the electronics board 92. Mounting or positioning of TOSAs 110 and ROSAs 112 in the openings 126, 128 of the electronics board 92 has several features. The openings 126, 128 allow the TOSAs 110 and ROSAs 112 to be disposed at an edge 130 of the electronics board 92 where the openings 126, 128 start, but not at an end 132 of the electronics board 92 where the OIM plate 93 is located. In this manner, space is provided for the TOSAs 110 and ROSAs 112 such that they do not interfere with or prevent the OIM plate 93 from being disposed at the end 132 of the electronics board 92. It allows for the TOSAs 110 and ROSAs 112 to be edge mounted to the edge 130 of the electronics board 92. This may limit the length of exposed, unshielded wire extensions between the TOSAs 110 and ROSAs 112 and printed traces on the electronics board 92 to minimize inductance in the wire extensions. This provides for preserved signal integrity of the signals after conversion to electrical signals.

Note that the openings 126, 128 in the electronics board 92 in FIG. 7 in this embodiment are disposed completely in an interior portion 134 of the electronics board 92. However, the openings 126, 128 could be disposed in the electronics board 92 where a portion of the openings 126, 128 are disposed at the end 132 of the electronics board 92 where the front sides 129, 131 of openings 126, 128, respectively, disposed at the end 132 of the electronics board 92. For instance, this configuration may be provided if there is room to locate the TOSAs 110 and ROSAs 112 to extend to the end 132 of the electronics board 92.

As discussed above with regard to FIG. 7, the TOSAs 110 and ROSAs 112 are edge mounted to the electronics board 92 to reduce the length between the electrical leads and the optical interface OIC interface board 92 to preserve signal integrity and to provide space for the TOSAs 110 and ROSAs 112. Due to this edge mounting, it may also be important to mount the TOSAs 110 and ROSAs 112 in centered alignment in the openings 126, 128 of the OIC electronics board 92. Aligning the TOSAs 110 and ROSAs 112 to the openings 126, 128 provides for proper electrical connection between the electrical leads 122 and the OIC electronics board 92. A mis-alignment can cause a variation in impedance matching between the electrical leads 122 and the OIC electronics board 92 that can affect performance from designed performance characteristics. Further, it may be desired or required to provide additional grounding between the TOSAs 110 and ROSAs 112 to a ground node of the circuit provided in the OIC electronics board 92 to improve RF shielding of the TOSAs 110 and ROSAs 112 to reduce S/N ratios and preserve or improve performance as a result. The grounding provided between a ground lead of the electrical leads 122 and the OIC electronics board 92 may not be sufficient to provide sufficient RF shielding. In this regard, the remainder of the description herein provided in FIGS. 9-23F illustrates examples of mounting devices that can also assist with alignment of these optical devices to an electronics board and inside openings of the electronics board and provide grounding of the optical devices to the electronics board.

Figure 9:
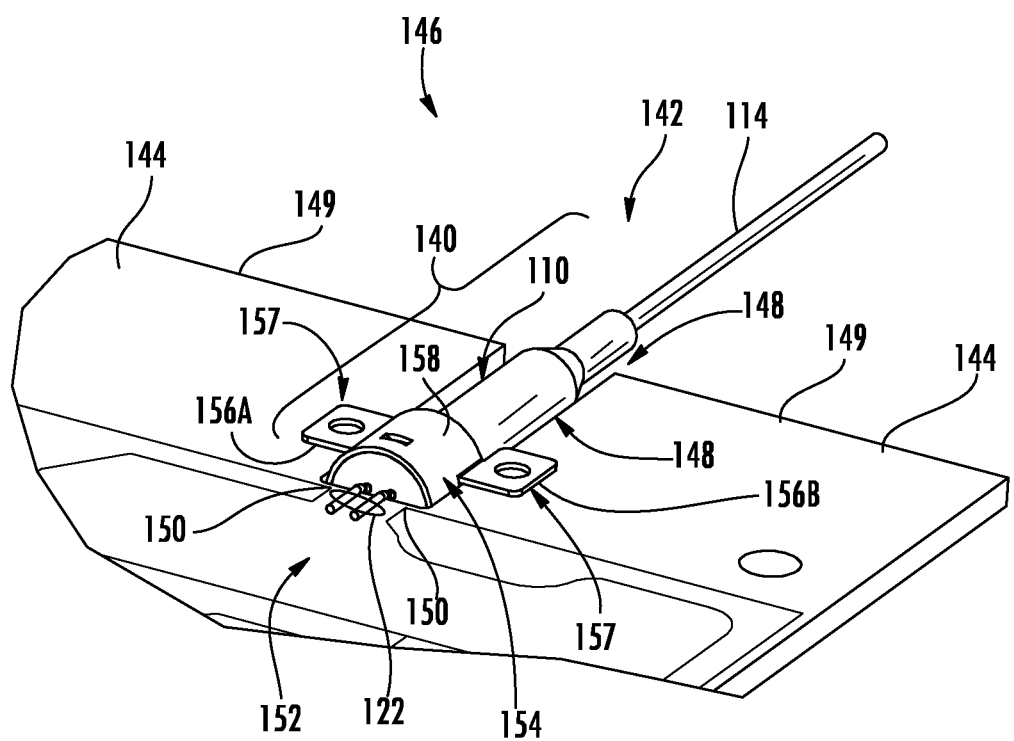
FIG. 9 is a rear perspective view of an exemplary optical sub-assembly comprising a mounting device securing the optical device of FIGS. 8A and 8B to an electronics board.

FIG. 9 is a rear perspective view of a first exemplary optical sub-assembly 140 that can be provided for mounting an optical device 142 to an electronics board 144 to provide an optical interface apparatus 146. In this example, the optical device 142 mounted to the electronics board 144 is the TOSA 110 in FIGS. 8A and 8B. Also in this example, the optical interface apparatus 146 may be an optical interface card, such as the OIC 90 previously described above with regard to FIGS. 5-7. Note that although a TOSA 110 is illustrated in FIG. 9 as being mounted to the electronics board 144, the ROSA 112 or other optical device could also be mounted to the electronics board 144 in the same or similar fashion.

With continuing reference to FIG. 9, the TOSA 110 of the optical sub-assembly 140 is disposed inside a board opening 148 in the electronics board 144 to edge mount the optical device 142 to the electronics board 144, as previously discussed. In this embodiment, the board opening 148 extends to an end 149 of the electronics board 144. However, the board opening 148 does not have to extend to the end 149 of the electronics board 144, such as is the case with the OIC 90 in FIGS. 5-7. With reference back to FIG. 9, the board opening 148 forms a first opening edge 150 in the electronics board 144. An optical interface 152 is disposed in the electronics board 144 adjacent to the first opening edge 150. The electrical leads 122 of the TOSA 110 are connected to the optical interface 152 to electrically connect the TOSA 110 to the electrical circuit(s) in the electronics board 144 to provide the optical interface apparatus 146. The optical signals generated by the TOSA 110 as a result of interfacing the TOSA 110 to the electronics board 144 are provided over the optical fiber tether 114.

With continuing reference to FIG. 9, a mounting device 154 is provided that is used to secure the TOSA 110 inside the board opening 148 and to the electronics board 144. FIGS. 10A-10D illustrate more detail of the mounting device 154 and its features and will be described below in more detail. With reference back to FIG. 9, the mounting device 154 contains features that allow the TOSA 110 to be edge mounted to the electronics board 144 in the board opening 148 such that the electrical leads 122 of the TOSA 110 can be electrically connected to the optical interface 152 adjacent the first opening edge 150 of the electronics board 144. FIGS. 11A and 11B are front perspective and bottom perspective views, respectively, of the optical sub-assembly 140 mounted to electronics board 144 in FIG. 9. FIGS. 11C and 11D are left top and rear side cross-sectional views, respectively, of the optical sub-assembly 140 mounted to the electronics board 144 in FIG. 9. FIGS. 11E and 11F are bottom and front side cross-sectional views, respectively, of the optical sub-assembly 140 mounted to the electronics board 144 in FIG. 9.

As will also be discussed in more detail with regard to FIGS. 10A-10D, the mounting device 154 also contains additional features. The mounting device 154 includes features that assist in aligning the flange 124 and can 118 of the TOSA 110 to the board opening 148 and the optical interface 152 when the TOSA 110 is mounted to the electronics board 144 using the mounting device 154. The mounting device 154 is also configured to provide electrical contact with the flange 124 and can 118 of the TOSA 110 when mounting the TOSA 110 to the electronics board 144. Thus, when mounting surfaces 156A, 156B of the mounting device 154 are connected to a grounding node 157 of the electronics board 144 to secure the mounting device 154 to the electronics board 144, additional grounding (i.e., lower impedance) is provided between the TOSA 110 and the electronics board 144. Providing additional grounding beyond grounding provided through a ground lead among the electrical leads 122 and the optical interface 152 may improve RF shielding of the TOSA 110. This may assist in reducing or preventing radiated RF signals from the TOSA 110 from interfering with the ROSAs 112 as an example, and thus causing noise to be imposed on the receive circuits in the electronics board 144 connected to ROSAs 112. Providing additional grounding with a grounding clamp connected to a ground lead among the electrical leads 122 may be difficult or not possible without damaging the TOSA 110 and/or due to coating on the connection point between the electrical leads 122 and the optical interface 152.

Figure 10A:
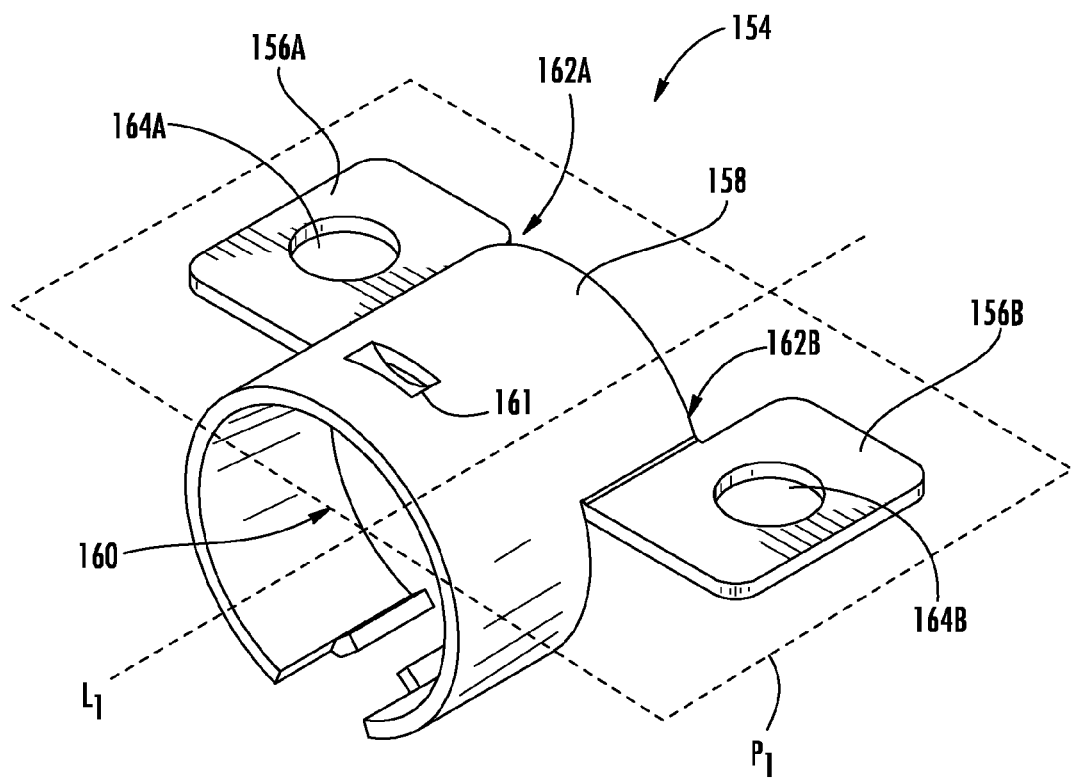
FIG. 10A is a perspective view of the mounting device of the optical sub-assembly of FIG. 9.
Figure 10B:
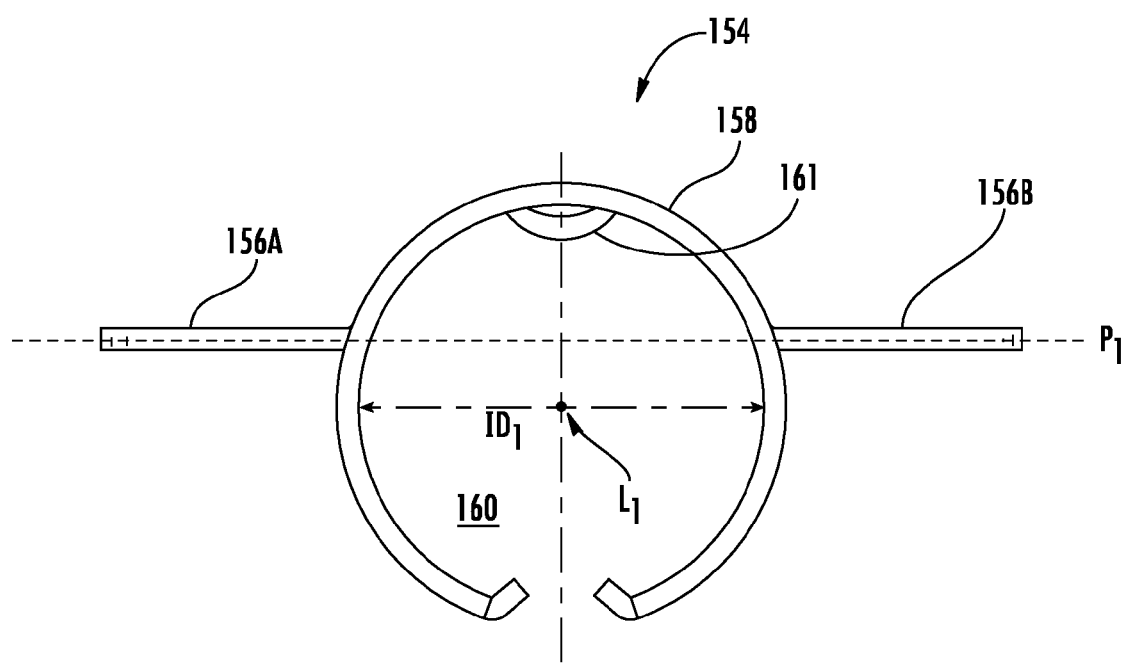
FIG. 10B is a front view of the mounting device of the optical sub-assembly of FIG. 9.
Figure 10C:
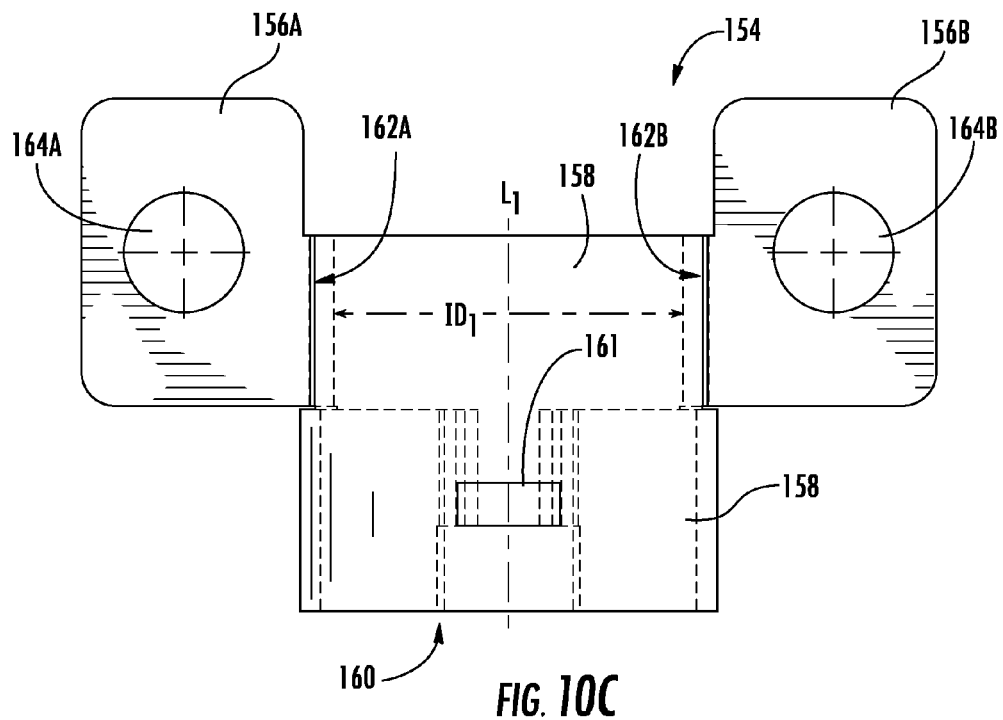
FIGS. 10C and 10D are top and right side views, respectively, of the mounting device of the optical sub-assembly of FIG. 9.
Figure 10D:
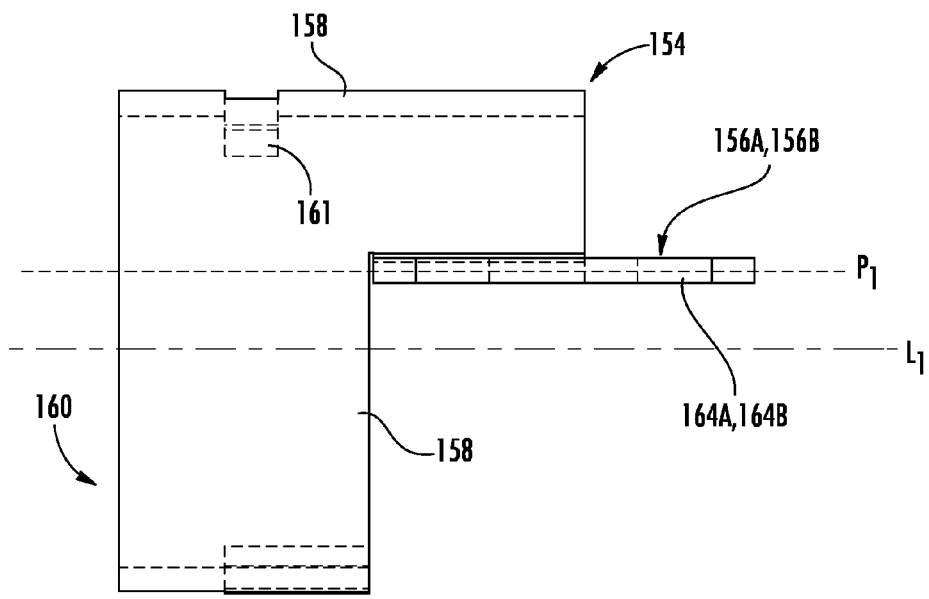
Figure 11A:
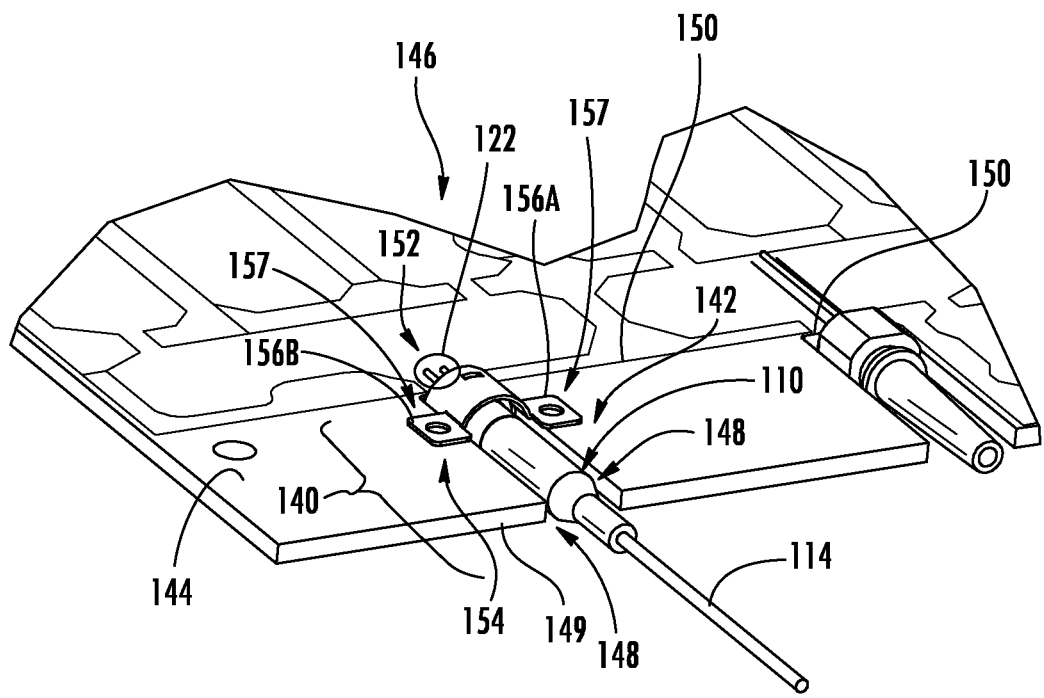
FIGS. 11A and 11B are front perspective and bottom perspective views, respectively, of the optical sub-assembly mounted to the electronics board in FIG. 9.
Figure 11B:
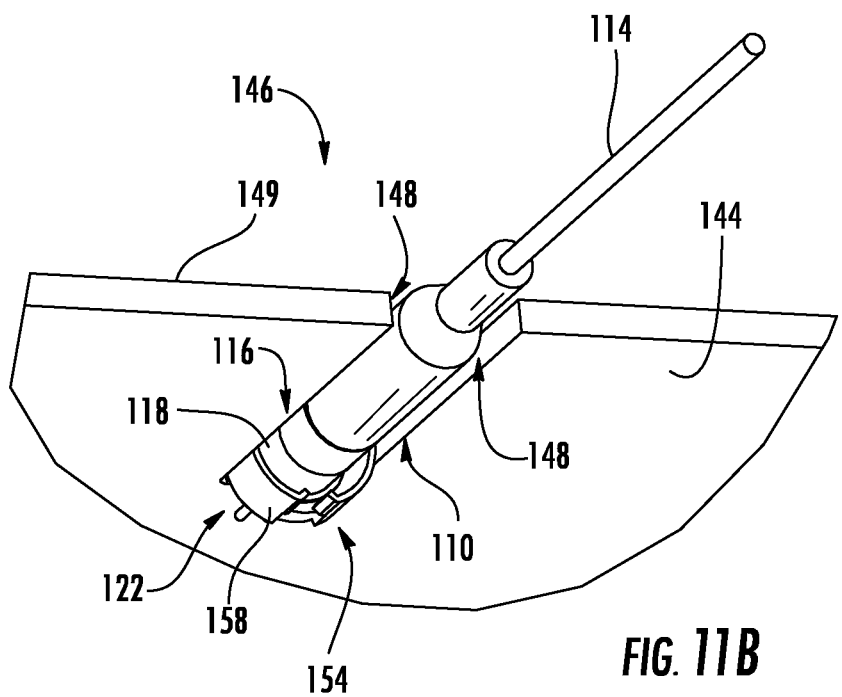
Figure 11C:
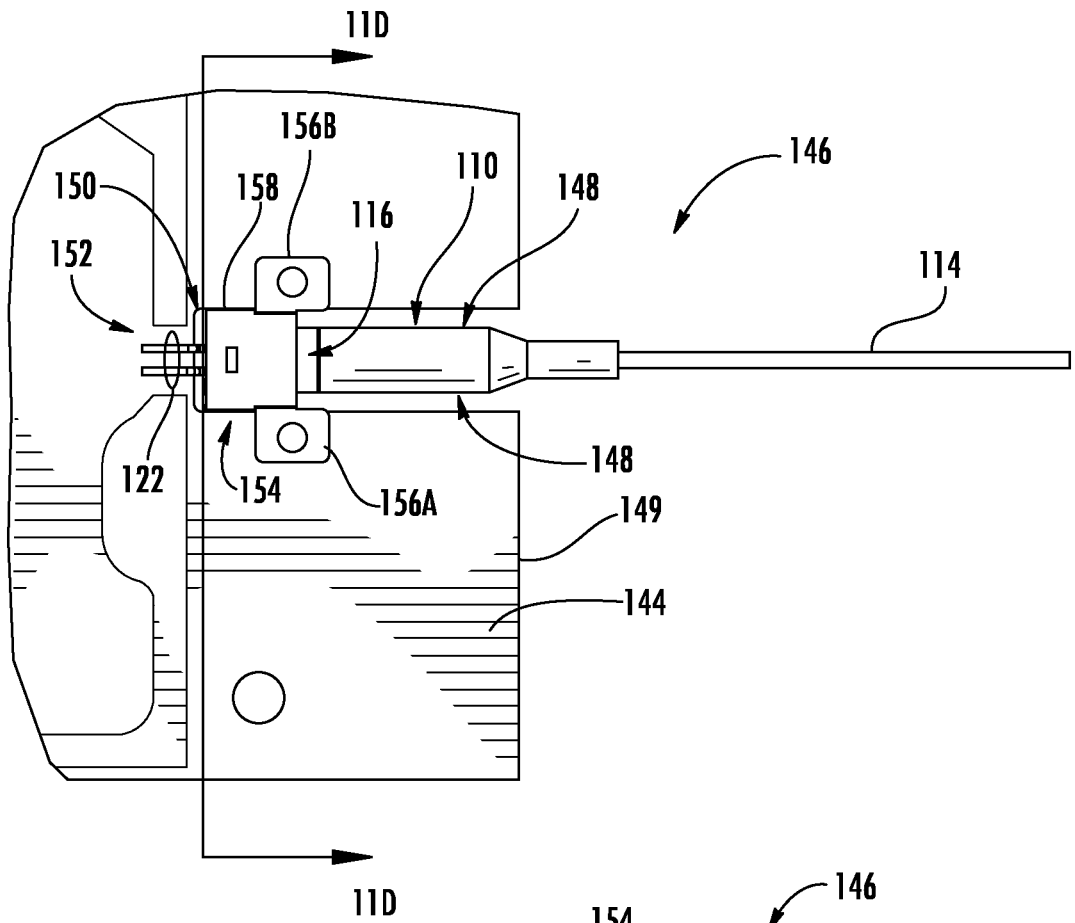
FIGS. 11C and 11D are left top and rear side cross-sectional views, respectively, of the optical sub-assembly mounted to the electronics board in FIG. 9.
Figure 11D:
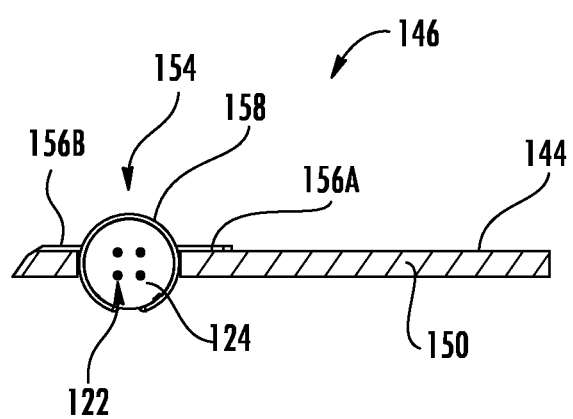
Figure 11E:
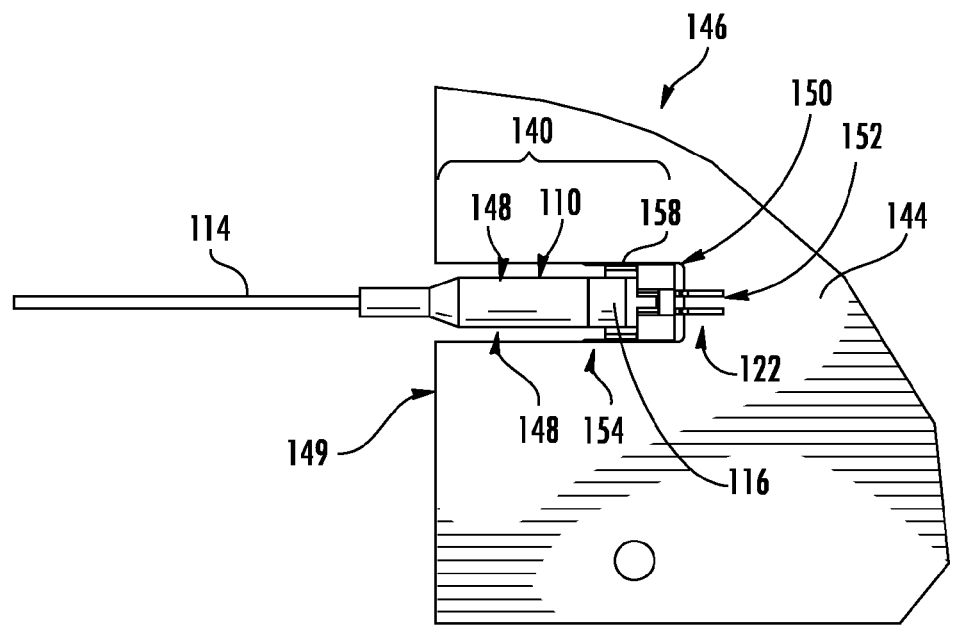
FIGS. 11E and 11F are bottom and front side cross-sectional views, respectively, of the optical sub-assembly mounted to the electronics board in FIG. 9.
Figure 11F:
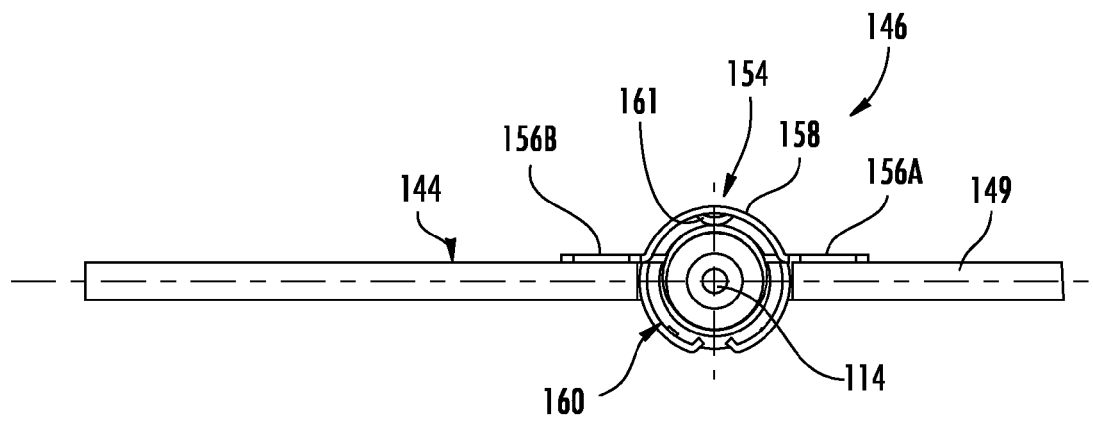

FIG. 10A is a perspective view of the mounting device 154 of the optical sub-assembly 140 of FIG. 9. FIG. 10B is front view of the mounting device 154 of the optical sub-assembly 140 of FIG. 9. FIGS. 10C and 10D are top and right side views, respectively, of the mounting device 154 of the optical sub-assembly 140 of FIG. 9. As illustrated therein, the mounting device 154 includes a retention structure 158. The retention structure 158 comprises a retention opening 160 disposed along a longitudinal axis $L_1$ of the retention structure 158. The retention opening 160 in this embodiment has a geometric shape that is complementary to the geometric shape of the flange 124 and/or the can 118 of the TOSA 110. In this embodiment, the retention opening 160 is cylindrical shaped to be complementary with the cylindrical shape of the flange 124 and/or the can 118 of the TOSA 110. As illustrated in FIG. 9, in this embodiment, the flange 124 is the largest outer diameter component of the TOSA 110, and is disposed inside the retention opening 160. As also illustrated in FIG. 9 and illustrated in more detail with regard to FIGS. 11A-11F, the retention opening 160 supports the flange 124, and the can 118, of the TOSA 110 to secure the TOSA 110 in the board opening 148 of the electronics board 144. The retention opening 160 can precisely retain the flange 124 and the can 118 of the TOSA 110 to hold the TOSA 110 in precise alignment in the board opening 148 and to align the electrical leads 122 with the optical interface 152 of the electronics board 144.

With continuing reference to FIGS. 10A-10D, to securely retain the flange 124 and the can 118 of the TOSA 110 inside the retention opening 160, an inner diameter $ID_1$ of the retention opening 160, as illustrated in FIG. 10B, may be the same or slightly smaller than the largest outer diameter of the body 116, flange 124, or can 118 of the TOSA 110. In this manner, a friction fit is provided between the retention structure 158 and the TOSA 110, as illustrated in FIG. 9 and FIGS. 11A-11F. A protrusion member 161 may also be provided in the retention structure 158 and disposed in the retention opening 160 to provide a stop for the flange 124 and allow the retention structure 158 to flex about the body 116, flange 124, or can 118 of the TOSA 110 disposed in the retention opening 160 and when the mounting surfaces 156A, 156B are secured to the electronics board 144, as illustrated in FIG. 9 and FIGS. 11A-11F. The protrusion member 161 can also assist in providing additional friction fit/clamping between the retention structure 158 and the flange 124 or can 118 of the TOSA 110.

With continuing reference to FIGS. 10A-10D, the mounting device 154 also includes the mounting surfaces 156A, 156B. The mounting surfaces 156A, 156B may be mounting tabs or other structures that extend from sides 162A, 162B of the retention structure 158 to support mounting of the mounting device 154 to each side of the board opening 148 when the TOSA 110 is disposed in the board opening 148, as illustrated in FIG. 9 and FIGS. 11A-11F. To provide for edge mounting of the TOSA 110 in the board opening 148, the mounting surfaces 156A, 156B are disposed along a plane $P_1$ that intersects with the retention opening 160, as illustrated in FIGS. 10A and 10B. In this manner, the retention opening 160 will be disposed inside the board opening 148 such that the flange 124 and the can 118 of the TOSA 110 supported in the retention opening 160 will be disposed both about and below the electronics board 144. The mounting surfaces 156A, 156B each contain through holes 164A, 164B that are configured to receive fasteners or solder to secure the mounting surfaces 156A, 156B to the electronics board 144, and in turn secure the TOSA 110 supported in the retention opening 160 to the electronics board 144.

With continuing reference to FIGS. 10A-10D, the retention structure 158 and the mounting surfaces 156A, 156B may be constructed from electrically conductive material, such as copper, silver, brass, steel, and any spring tempered copper alloy such as phosphor bronze or beryllium copper, as non-limiting examples. Thus, when the flange 124 and/or the can 118 of the TOSA 110 is secured inside the retention opening 160 and the mounting surfaces 156A, 156B are coupled to a grounding node of the electronics board 144, the TOSA 110 will be additionally grounded to the electronics board 144 through the mounting device 154. In this regard, the mounting surfaces 156A, 156B serve as grounding pads. The mounting surfaces 156A, 156B may be soldered to grounding nodes on the electronics board 144 to provide this additional grounding between the electronics board 144 and the TOSA 110, as illustrated in FIG. 9 and FIGS. 11A-11F. Additional or improved grounding can improve RF shielding of the TOSA 110. For example, a surface area between eighty-five percent (85%) and ninety-five percent (95%) of the outer surface of the flange 124 (e.g., eighty-nine percent (89%)) may be placed into contact with the retention structure 158 to provide additional grounding in this embodiment. The greater the amount of surface contact between the mounting device 154 and the TOSA 110, the lower the impedance and enhanced grounding. The protrusion member 161 provided in the retention structure 158 and disposed in the retention opening 160 may also assist to provide additional electrical contact between the flange 124 and/or the can 118 of the TOSA 110 to provide electrical contact between the flange 124 and the can 118 of the TOSA 110 and the mounting surfaces 156A, 156B for additional or improved grounding.

Figure 12:
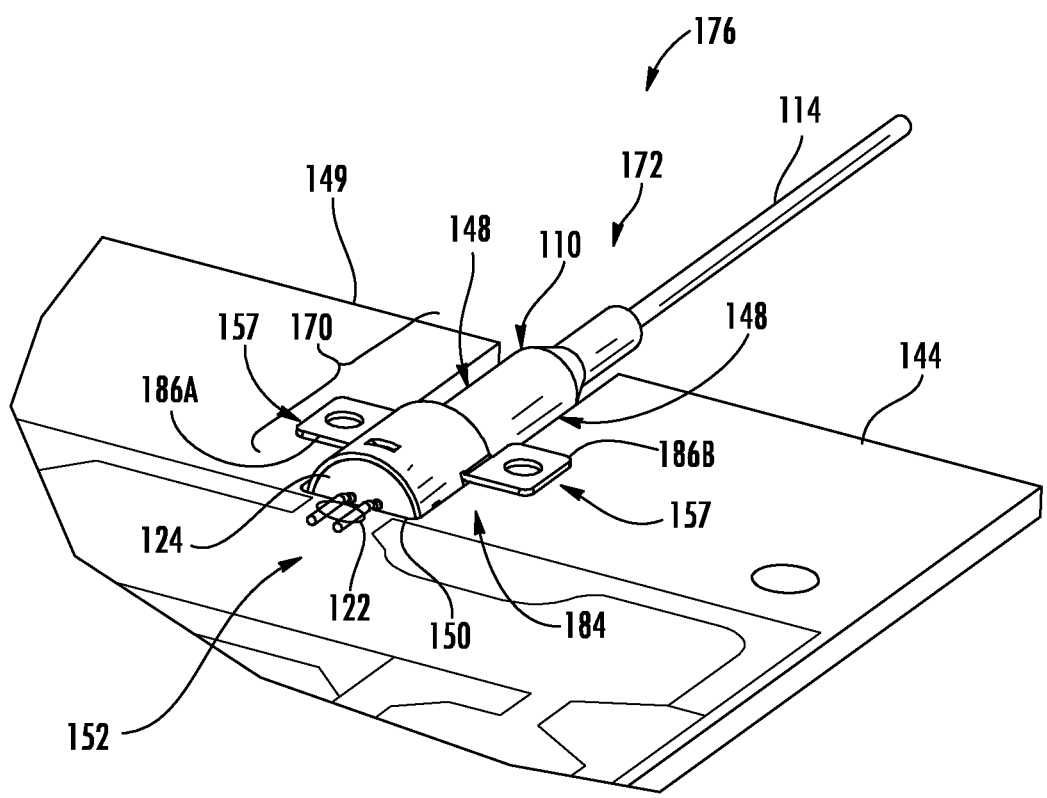
FIG. 12 is a rear perspective view of another exemplary optical sub-assembly comprising a mounting device securing the optical device of FIGS. 8A and 8B to an electronics board.

FIG. 12 is a rear perspective view of another exemplary optical sub-assembly 170 that can be provided for mounting an optical device 172 to the electronics board 144 to provide another optical interface apparatus 176. In this example, the optical device 172 mounted to the electronics board 144 is also the TOSA 110 in FIGS. 8A and 8B. Also in this example, the optical interface apparatus 176 may be an optical interface card, such as the OIC 90 previously described above with regard to FIGS. 5-7. Note that although a TOSA 110 is illustrated in FIG. 12 as being mounted to the electronics board 144, a ROSA 112 or other optical device could also be mounted to the electronics board 144 in the same or similar fashion.

With continuing reference to FIG. 12, the TOSA 110 of the optical sub-assembly 170 is disposed inside the board opening 148 in the electronics board 144 to edge mount the optical device 172 to the electronics board 144, as previously discussed. In this embodiment, the board opening 148 extends to the end 149 of the electronics board 144. However, the board opening 148 does not have to extend to the end 149 of the electronics board 144, such as is the case with the OIC 90 in FIGS. 5-7. With reference back to FIG. 12, the board opening 148 forms the first opening edge 150 in the electronics board 144. The optical interface 152 is disposed in the electronics board 144 adjacent to the first opening edge 150. The electrical leads 122 of the TOSA 110 are connected to the optical interface 152 to electrically connect the TOSA 110 to the electrical circuit(s) in the electronics board 144 to provide the optical interface apparatus 176. The optical signals generated by the TOSA 110 as a result of interfacing the TOSA 110 to the electronics board 144 are provided over the optical fiber tether 114.

With continuing reference to FIG. 12, an alternative mounting device 184 is provided that is used to secure the TOSA 110 inside the board opening 148 and to the electronics board 144. FIGS. 13A-13D illustrate more detail of the mounting device 184 and its features and will be described below in more detail. With reference back to FIG. 12, the mounting device 154 contains features that allow the TOSA 110 to be edge mounted to the electronics board 144 in the board opening 148 such that the electrical leads 122 of the TOSA 110 can be electrically connected to the optical interface 152 adjacent the first opening edge 150 of the electronics board 144. FIGS. 14A and 14B are front perspective and bottom perspective views, respectively, of the optical sub-assembly 170 mounted to the electronics board 144 in FIG. 12. FIGS. 14C and 14D are left top and rear side cross-sectional views, respectively, of the optical sub-assembly 170 mounted to the electronics board 144 in FIG. 9. FIGS. 14E and 14F are bottom and front side cross-sectional views, respectively, of the optical sub-assembly 170 mounted to the electronics board 144 in FIG. 12.

As will also be discussed in more detail with regard to FIGS. 13A-13D, the mounting device 184 also contains additional features. The mounting device 184 includes features that assist in aligning the flange 124 and the can 118 of the TOSA 110 to the board opening 148 and the optical interface 152 when the TOSA 110 is mounted to the electronics board 144 using the mounting device 184. The mounting device 184 is also configured to provide electrical contact with the can 118 of the TOSA 110 when mounting the TOSA 110 to the electronics board 144. Thus, when mounting surfaces 186A, 186B of the mounting device 184 are connected to a grounding node 157 of the electronics board 144 to secure the mounting device 184 to the electronics board 144, additional grounding (i.e., lower impedance) is provided between the TOSA 110 and the electronics board 144. Providing additional grounding beyond grounding provided through a ground lead among the electrical leads 122 and the optical interface 152 may improve RF shielding of the TOSA 110. This may assist in reducing or preventing radiated RF signals from the TOSA 110 from interfering with the ROSAs 112 as an example, and thus causing noise to be imposed on the receive circuits in the electronics board 144 connected to ROSAs 112. Providing additional grounding with a grounding clamp connected to a ground lead among the electrical leads 122 may be difficult or not possible without damaging the TOSA 110 and/or due to coating on the connection point between the electrical leads 122 and the optical interface 152.

Figure 13A:
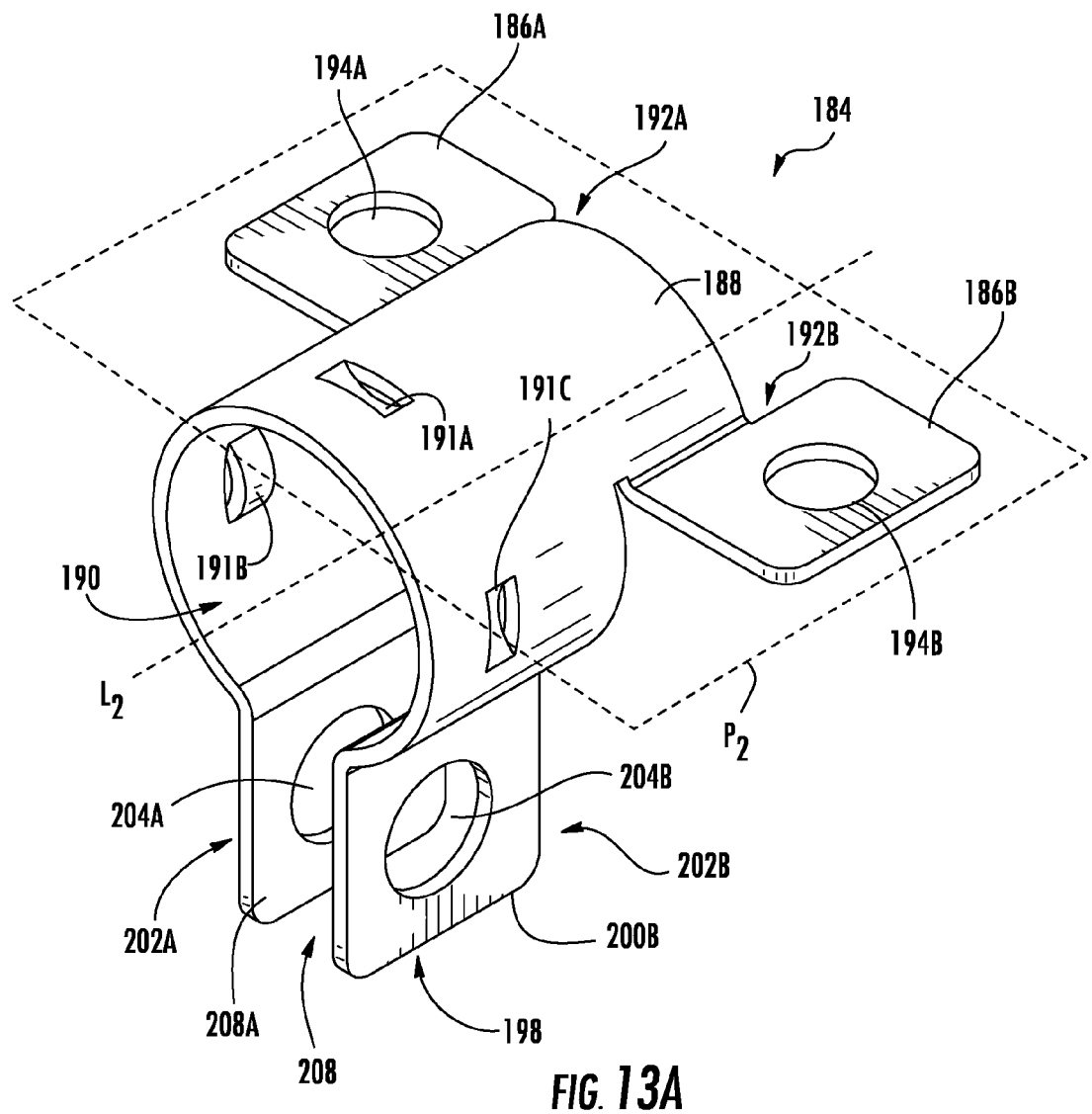
FIG. 13A is a perspective view of the mounting device of the optical sub-assembly of FIG. 12.
Figure 13B:
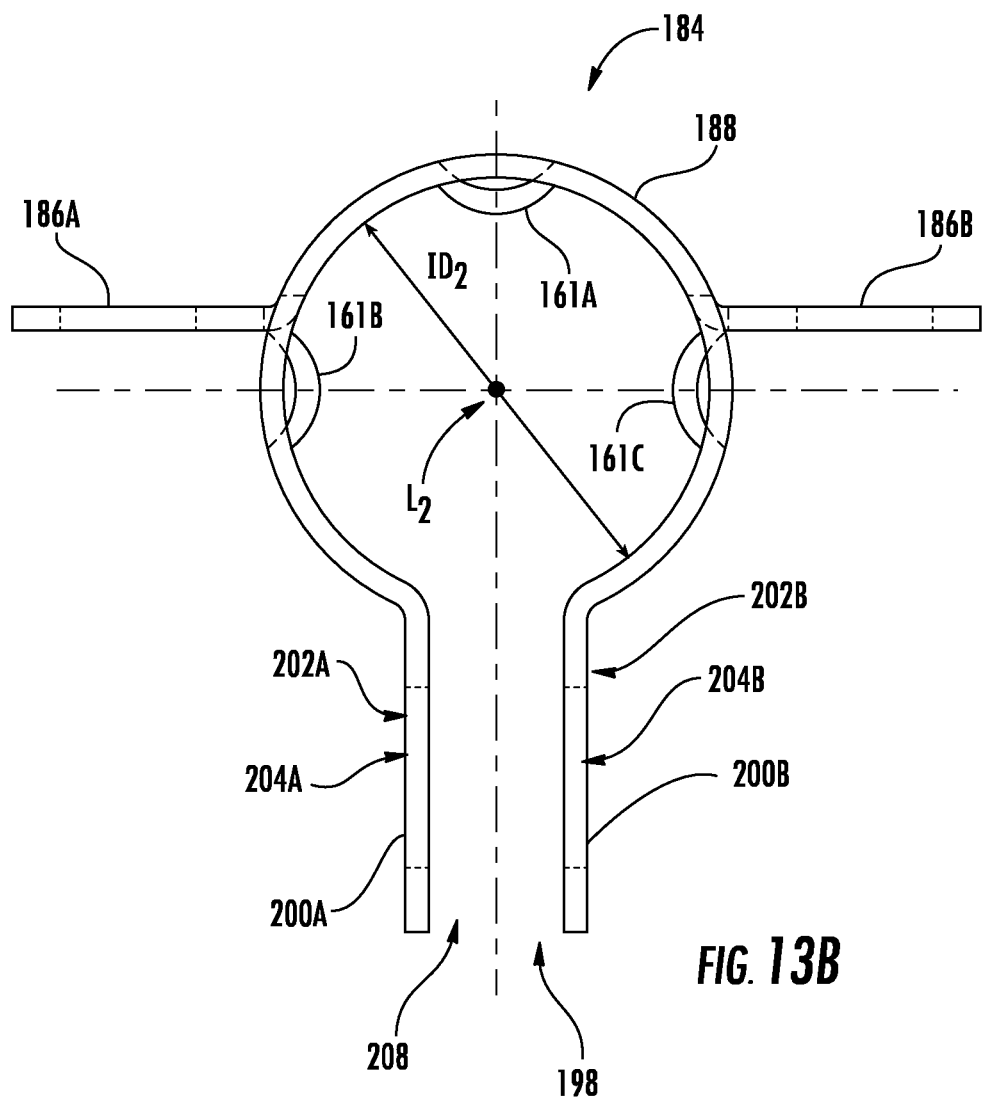
FIG. 13B is a front view of the mounting device of the optical sub-assembly of FIG. 12.
Figure 13C:
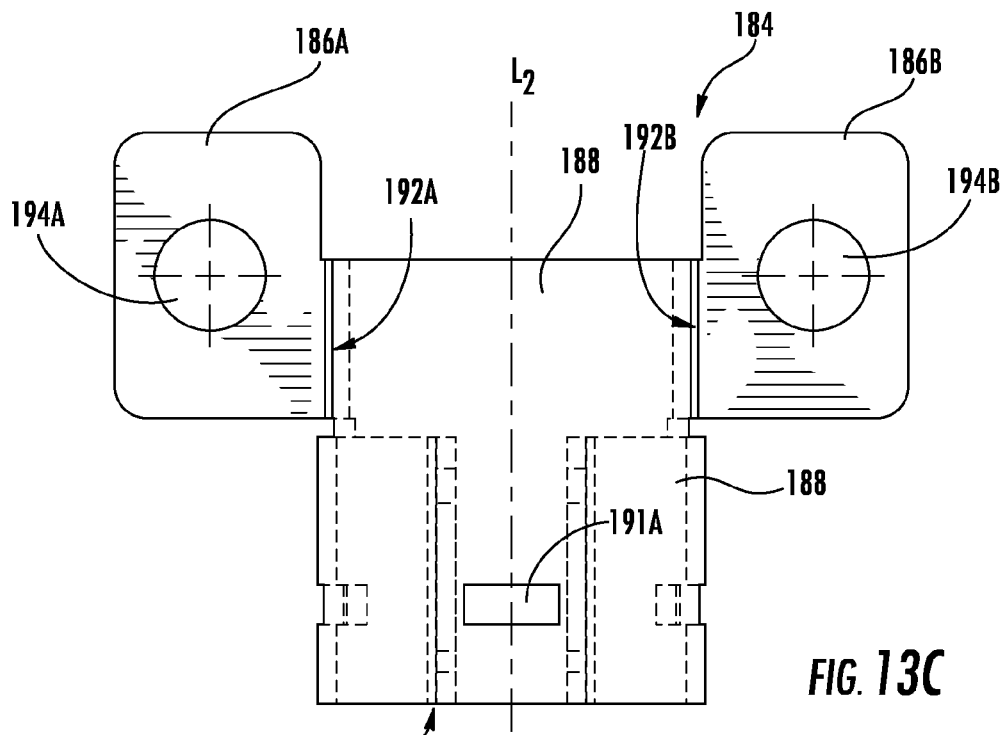
FIGS. 13C and 13D are top and right side views, respectively, of the mounting device of the optical sub-assembly of FIG. 12.
Figure 13D:
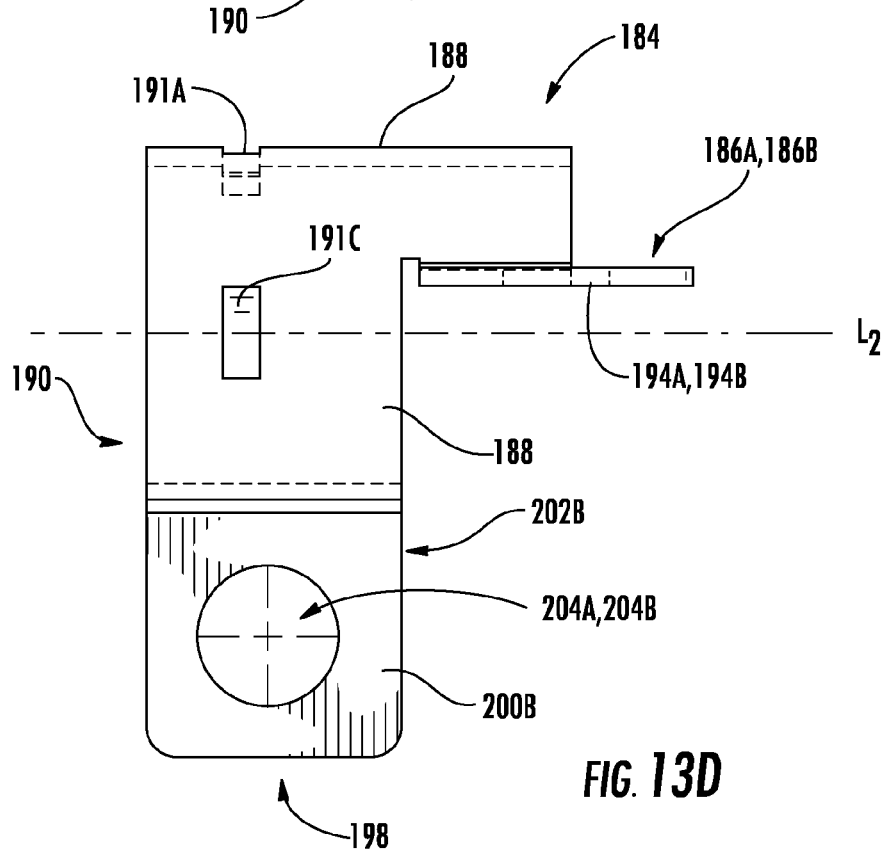
Figure 14A:
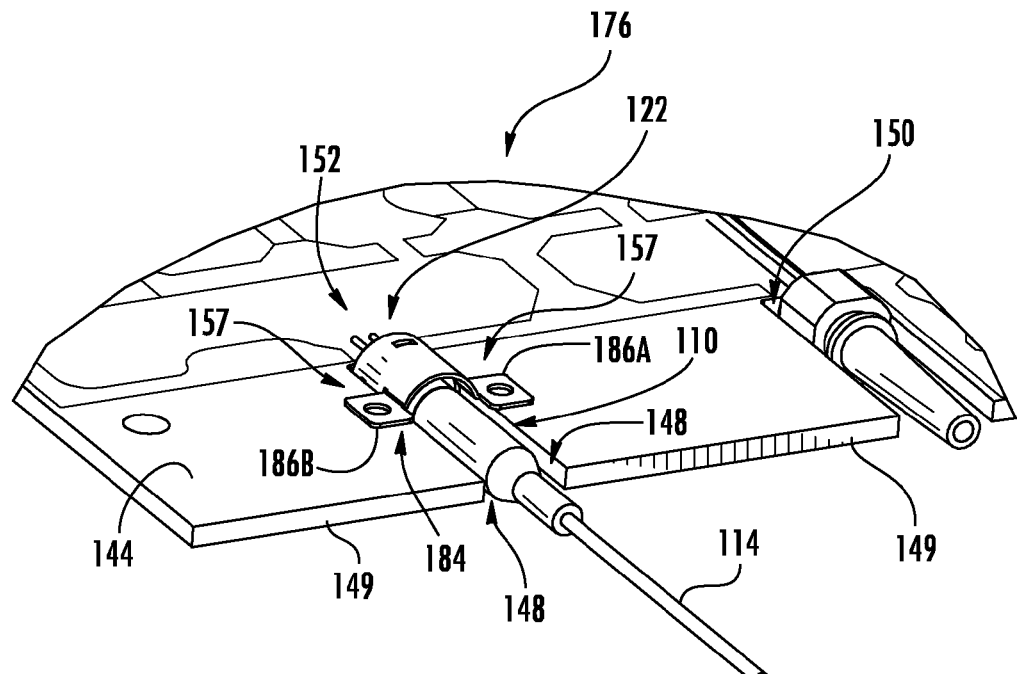
FIGS. 14A and 14B are front perspective and bottom perspective views, respectively, of the optical sub-assembly mounted to the electronics board in FIG. 12.
Figure 14B:
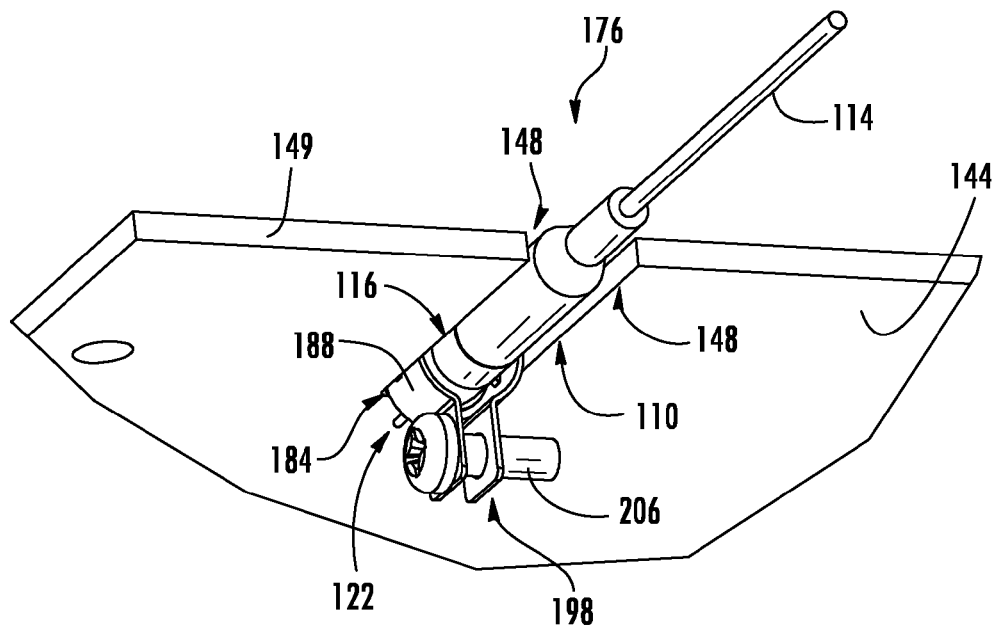
Figure 14C:
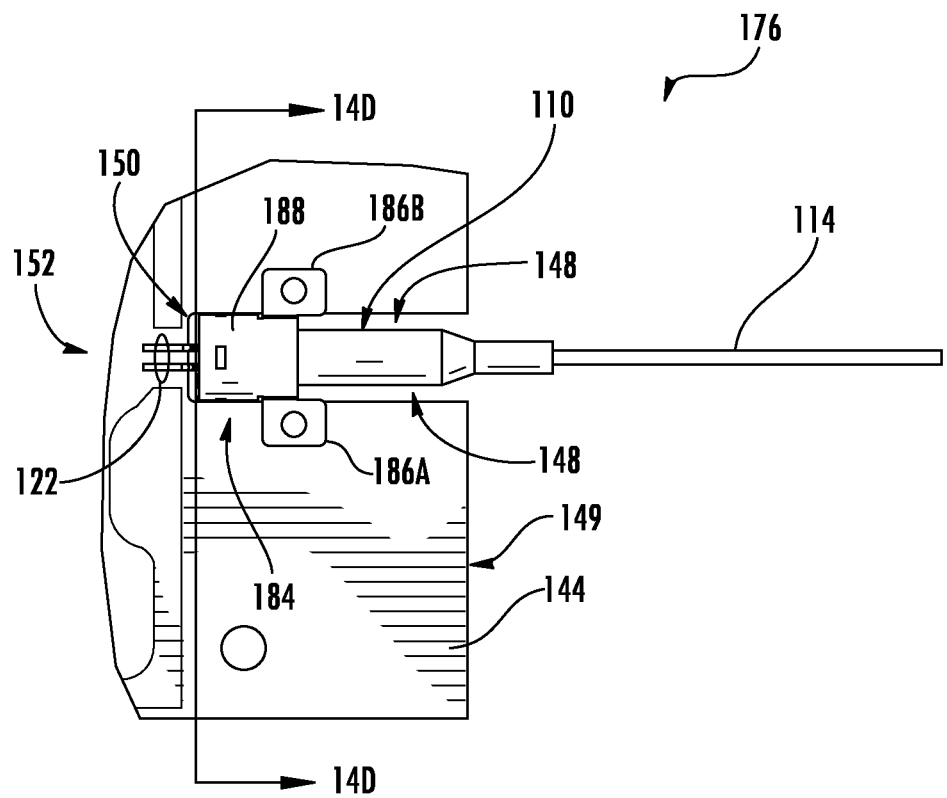
FIGS. 14C and 14D are left top and rear side cross-sectional views, respectively, of the optical sub-assembly mounted to the electronics board in FIG. 12.
Figure 14D:
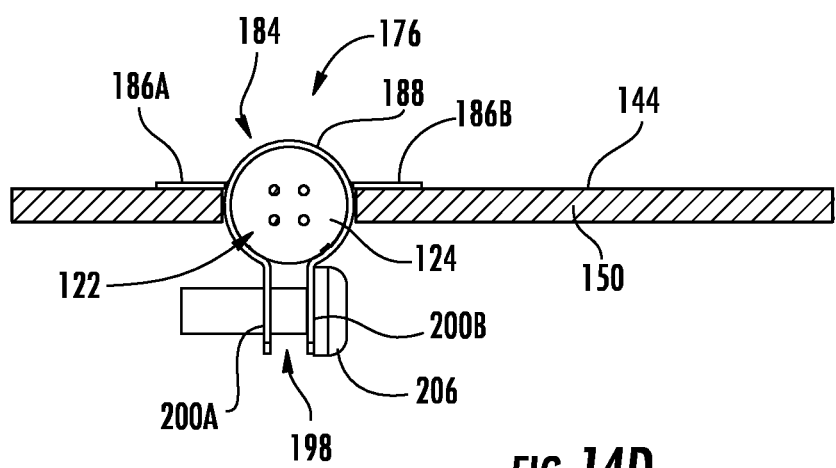
Figure 14E:
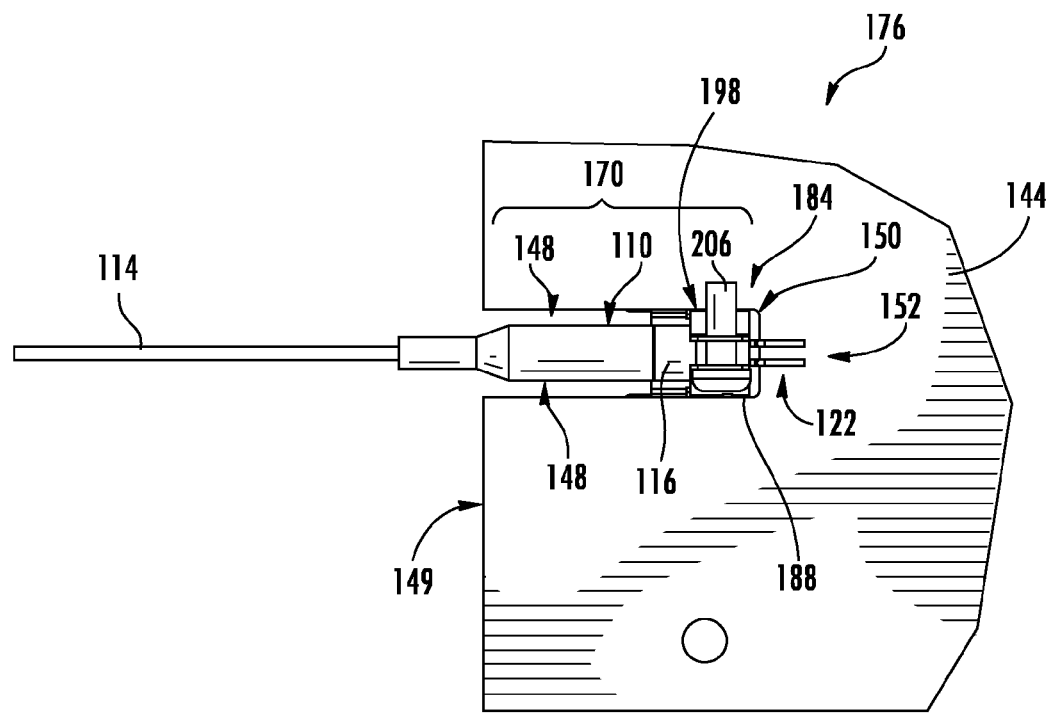
FIGS. 14E and 14F are bottom and front side cross-sectional views, respectively, of the optical sub-assembly mounted to the electronics board in FIG. 12.
Figure 14F:
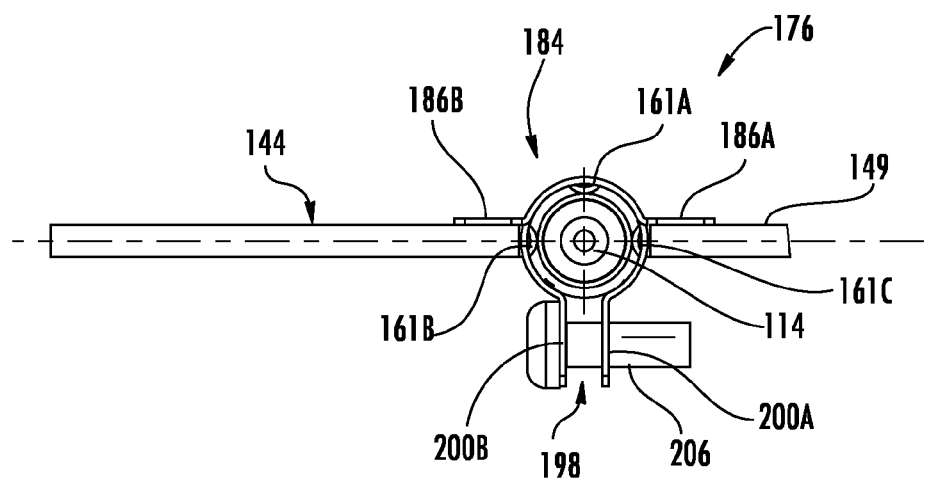

FIG. 13A is a perspective view of the mounting device 184 of the optical sub-assembly 170 of FIG. 12. FIG. 13B is front view of the mounting device 184 of the optical sub-assembly 170 of FIG. 12. FIGS. 13C and 13D are top and right side views, respectively, of the mounting device 184 of the optical sub-assembly 170 of FIG. 12. As illustrated therein, the mounting device 184 includes a retention structure 188. The retention structure 188 comprises a retention opening 190 disposed along a longitudinal axis $L_2$ of the retention structure 188. The retention opening 190 in this embodiment has a geometric shape that is complementary to the geometric shape of the flange 124 and/or the can 118 of the TOSA 110. In this embodiment, the retention opening 190 is cylindrical shaped to be complementary with the cylindrical shape of the flange 124 and/or the can 118 of the TOSA 110. As illustrated in FIG. 12, in this embodiment, the flange 124, is the largest outer diameter component of the TOSA 110, and is disposed inside the retention opening 190. As also illustrated in FIG. 12 and illustrated in more detail with regard to FIGS. 14A-14F, the retention opening 190 supports the flange 124 and the can 118 of the TOSA 110 to secure the TOSA 110 in the board opening 148 of the electronics board 144. The retention opening 190 can precisely retain the flange 124 and the can 118 of the TOSA 110 to hold the TOSA 110 in precise alignment in the board opening 148 and to align the electrical leads 122 with the optical interface 152 of the electronics board 144.

With continuing reference to FIGS. 13A-13D, to securely retain the flange 124 and/or the can 118 of the TOSA 110 inside the retention opening 190, an inner diameter $ID_2$ of the retention opening 190, as illustrated in FIG. 13B, may be the same or slightly smaller than the outer diameter of the flange 124 or can 118 of the TOSA 110. In this manner, a friction fit is provided between the retention structure 188 and the TOSA 110, as illustrated in FIG. 12 and FIGS. 14A-14F. Protrusion members 191A, 191B, 191C may also be provided in the retention structure 188 and disposed in the retention opening 190 to allow the retention structure 188 to flex about the body 116, flange 124, or can 118 of the TOSA 110 disposed in the retention opening 190 and when the mounting surfaces 186A, 186B are secured to the electronics board 144, as illustrated in FIG. 12 and FIGS. 14A-14F. The protrusion members 191A, 191B, 191C can also assist in providing additional friction fit/clamping between the retention structure 188 and the body 116, flange 124, or can 118 of the TOSA 110.

With continuing reference to FIGS. 13A-13D, the mounting device 184 also includes the mounting surfaces 186A, 186B. The mounting surfaces 186A, 186B may be mounting tabs or other structures that extend from sides 192A, 192B of the retention structure 188 to support mounting of the mounting device 154 to each side of the board opening 148 when the TOSA 110 is disposed in the board opening 148, as illustrated in FIG. 12 and FIGS. 14A-14F. To provide for edge mounting of the TOSA 110 in the board opening 148, the mounting surfaces 186A, 186B are disposed along a plane $P_2$ that intersects with the retention opening 190, as illustrated in FIGS. 13A and 13B. In this manner, the retention opening 190 will be disposed inside the board opening 148 such that the flange 124 and the can 118 of the TOSA 110 supported in the retention opening 190 will be disposed both about and below the electronics board 144. The mounting surfaces 186A, 186B each contain through holes 194A, 194B that are configured to receive fasteners or solder to secure the mounting surfaces 186A, 186B to the electronics board 144, and in turn secure the TOSA 110 supported in the retention opening 190 to the electronics board 144.

With continuing reference to FIGS. 13A-13D, the retention structure 188 and the mounting surfaces 186A, 186B may be constructed from electrically conductive material, such as copper, silver, brass, steel, and any spring tempered copper alloy such as phosphor bronze or beryllium copper, as non-limiting examples. Thus, when the flange 124 and/or the can 118 of the TOSA 110 is secured inside the retention opening 190 and the mounting surfaces 186A, 186B are coupled to a grounding node of the electronics board 144, the TOSA 110 will be additionally grounded to the electronics board 144 through the mounting device 184. In this regard, the mounting surfaces 186A, 186B serve as grounding pads. The mounting surfaces 186A, 186B may be soldered to grounding nodes on the electronics board 144 to provide this additional grounding between the electronics board 144 and the TOSA 110, as illustrated in FIG. 12 and FIGS. 14A-14F. Additional or improved grounding can improve RF shielding of the TOSA 110. For example, a between eighty percent (80%) and ninety percent (90%) (e.g., eighty-six percent (86%)) of the outer surface of the flange 124 may be placed into contact with the retention structure 188 to provide additional grounding in this embodiment. The greater the amount of surface contact between the mounting device 184 and the TOSA 110, the lower the impedance and enhanced grounding. The protrusion members 191A, 191B, 191C provided in the retention structure 188 and disposed in the retention opening 190 may also assist to provide electrical contact between the flange 124 and/or the can 118 of the TOSA 110 to provide electrical contact between the flange 124 and/or the can 118 of the TOSA 110 and the mounting surfaces 186A, 186B for additional or improved grounding.

With regard to FIGS. 13A-13D, the retention structure 188 contains an additional clamp 198. The clamp 198 further assists in securing the flange 124 and/or the can 118 of the TOSA 110 firmly and securely in the retention opening 190. The clamp 198 is comprised of two extension members 200A, 200B that extend down from each side 202A, 202B of the retention structure 188 such that the extension members 200A, 200B are disposed in parallel planes to each other. Each extension member 200A, 200B contains openings 204A, 204B that are configured to receive a fastener 206 therethrough, as illustrated in FIGS. 14B, 14D, and 14F. The fastener 206 may be threaded. When the fastener 206 is tightened, the fastener 206 forces the extension members 200A, 200B to be bent toward each other to decrease the inner diameter $ID_2$ of the retention opening 190 around the flange 124 and/or the can 118 of the TOSA 110 as a clamp. Providing the clamp 198 may further assist in securing and/or aligning to the TOSA 110 in the board opening 148 and the electrical leads 122 to the optical interface. A gap or slot 208 between the extension members 200A, 200B also allows the optical fiber tether 114 to be disposed therein to allow the mounting device 184 to be slipped over a TOSA 110 during assembly even if the electrical leads 122 of the TOSA 110 are already secured to the electronics board 144. This may be particularly beneficial if the optical fiber tether 114 is already connectorized, as is illustrated in FIG. 7, wherein the slot 208 of the mounting device 184 is slipped over the optical fiber tether 114 between the TOSA 110 and the connector.

Figure 15:
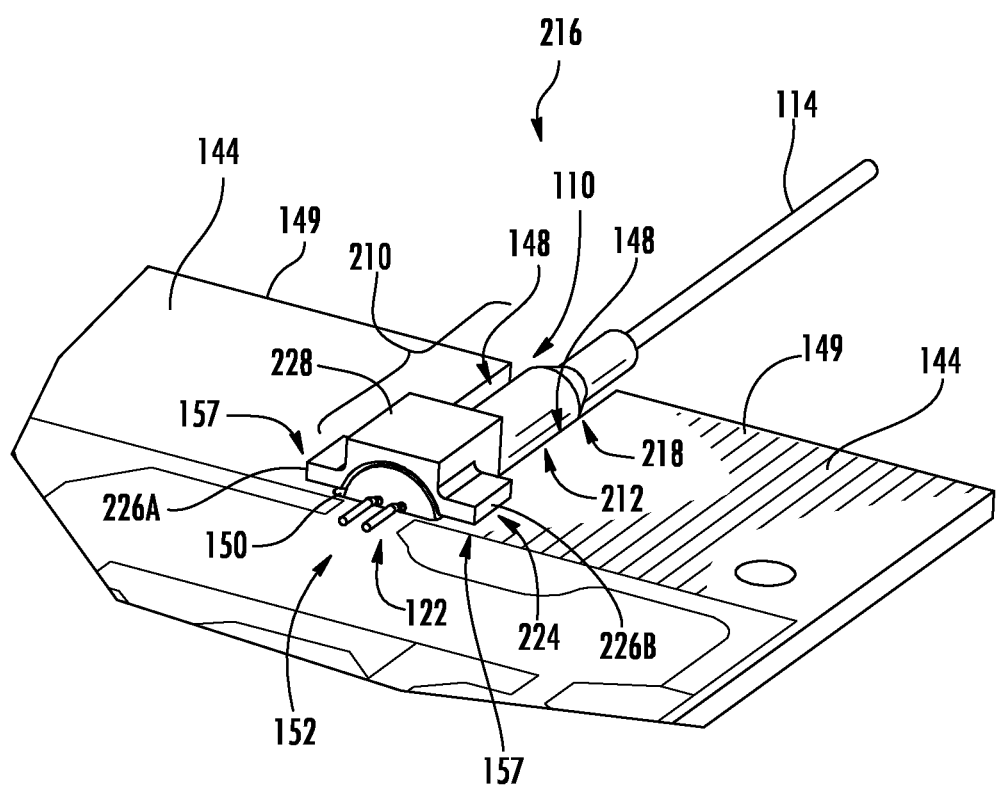
FIG. 15 is a rear perspective view of another exemplary optical sub-assembly comprising a mounting device securing the optical device of FIGS. 8A and 8B to an electronics board.

FIG. 15 is a rear perspective view of another exemplary optical sub-assembly 210 that can be provided for mounting an optical device 212 to the electronics board 144 to provide another optical interface apparatus 216. In this example, the optical device 212 mounted to the electronics board 144 is also the TOSA 110 in FIGS. 8A and 8B. Also in this example, the optical interface apparatus 216 may be an optical interface card, such as the OIC 90 previously described above with regard to FIGS. 5-7. Note that although a TOSA 110 is illustrated in FIG. 15 as being mounted to the electronics board 144, a ROSA 112 or other optical device could also be mounted to the electronics board 144 in the same or similar fashion.

With continuing reference to FIG. 15, the TOSA 110 of the optical sub-assembly 210 is disposed inside the board opening 148 in the electronics board 144 to edge mount the optical device 212 to the electronics board 144, as previously discussed. In this embodiment, the board opening 148 extends to the end 149 of the electronics board 144. However, the board opening 148 does not have to extend to the end 149 of the electronics board 144, such as is the case with the OIC 90 in FIGS. 5-7. With reference back to FIG. 15, the board opening 148 forms the first opening edge 150 in the electronics board 144. The optical interface 152 is disposed in the electronics board 144 adjacent to the first opening edge 150. The electrical leads 122 of the TOSA 110 are connected to the optical interface 152 to electrically connect the TOSA 110 to the electrical circuit(s) in the electronics board 144 to provide the optical interface apparatus 216. The optical signals generated by the TOSA 110 as a result of interfacing the TOSA 110 to the electronics board 144 are provided over the optical fiber tether 114.

With continuing reference to FIG. 15, an alternative mounting device 224 is provided that is used to secure the TOSA 110 inside the board opening 148 and to the electronics board 144. FIGS. 16A-16E illustrate more detail of the mounting device 224 and its features and will be described below in more detail. With reference back to FIG. 15, the mounting device 224 contains features that allow the TOSA 110 to be edge mounted to the electronics board 144 in the board opening 148 such that the electrical leads 122 of the TOSA 110 can be electrically connected to the optical interface 152 adjacent the first opening edge 150 of the electronics board 144. FIGS. 17A and 17B are front perspective and bottom perspective views, respectively, of the optical sub-assembly 210 mounted to the electronics board 144 in FIG. 15. FIGS. 17C and 17D are left top and rear side cross-sectional views, respectively, of the optical sub-assembly 210 mounted to the electronics board 144 in FIG. 15. FIGS. 17E and 17F are bottom and front side cross-sectional views, respectively, of the optical sub-assembly 210 mounted to the electronics board 144 in FIG. 15.

As will also be discussed in more detail with regard to FIGS. 16A-16E, the mounting device 224 also contains additional features. The mounting device 224 includes features that assist in aligning the flange 124 and the can 118 of the TOSA 110 to the board opening 148 and the optical interface 152 when the TOSA 110 is mounted to the electronics board 144 using the mounting device 224. The mounting device 224 is also configured to provide electrical contact with the flange 124 and the can 118 of the TOSA 110 when mounting the TOSA 110 to the electronics board 144. Thus, when mounting surfaces 226A, 226B of the mounting device 224 are connected to the grounding node 157 of the electronics board 144 to secure the mounting device 224 to the electronics board 144, additional grounding (i.e., lower impedance) is provided between the TOSA 110 and the electronics board 144. Providing additional grounding beyond grounding provided through a ground lead among the electrical leads 122 and the optical interface 152 may improve RF shielding of the TOSA 110. This may assist in reducing or preventing radiated RF signals from the TOSA 110 from interfering with the ROSAs 112 as an example, and thus causing noise to be imposed on the receive circuits in the electronics board 144 connected to ROSAs 112. Providing additional grounding with a grounding clamp connected to a ground lead among the electrical leads 122 may be difficult or not possible without damaging the TOSA 110 and/or due to coating on the connection point between the electrical leads 122 and the optical interface 152.

Figure 16A:
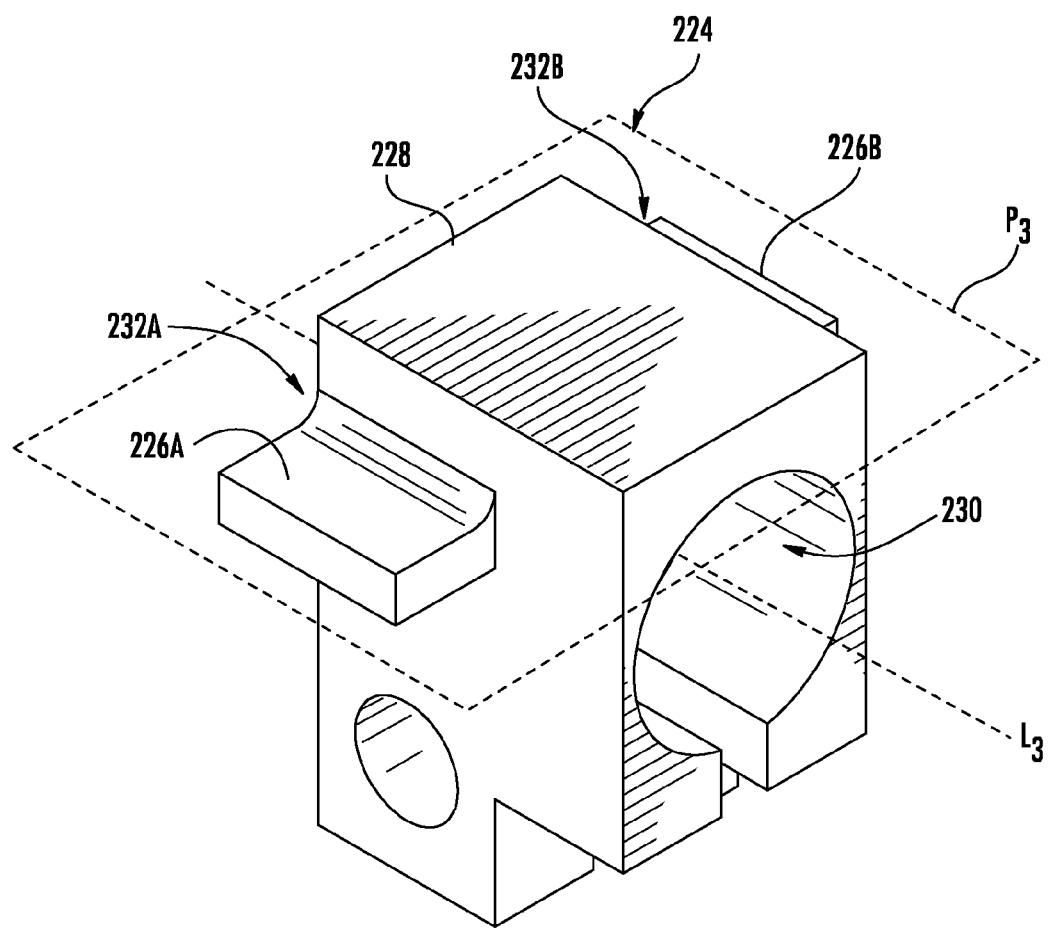
FIG. 16A is a perspective view of the mounting device of the optical sub-assembly of FIG. 15.
Figure 16B:
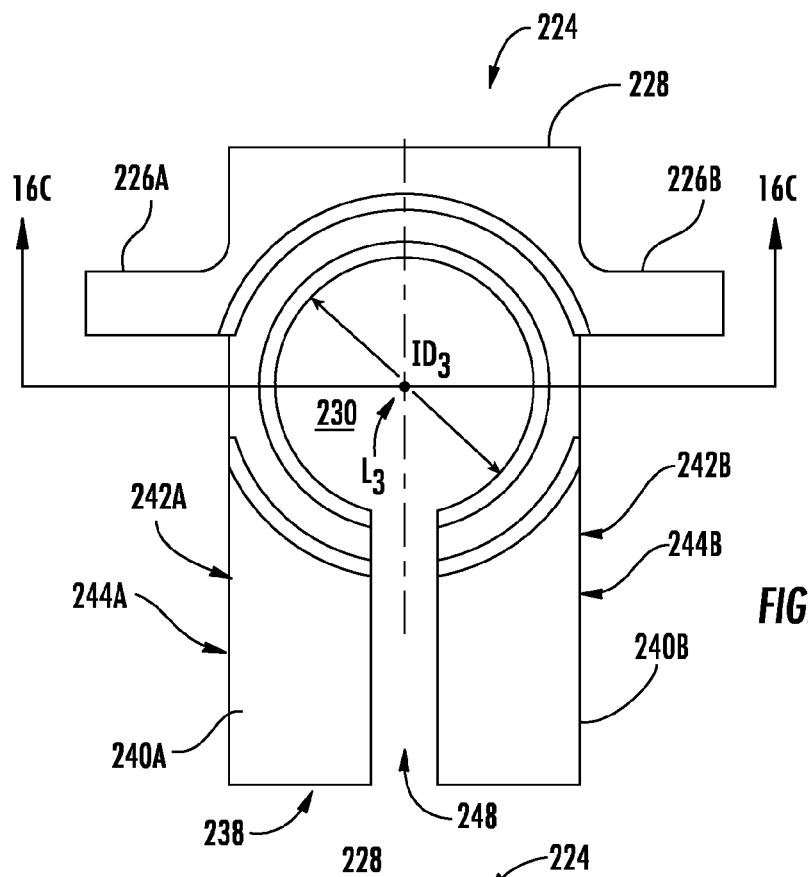
FIGS. 16B and 16C are front and rear views, respectively, of the mounting device of the optical sub-assembly of FIG. 15.
Figure 16C:
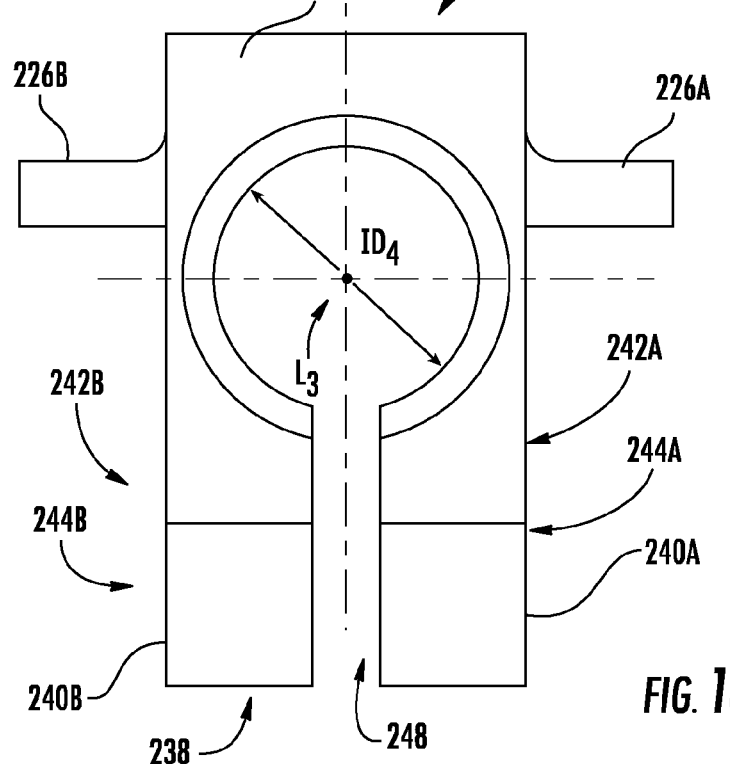
Figures 16D, 16E:
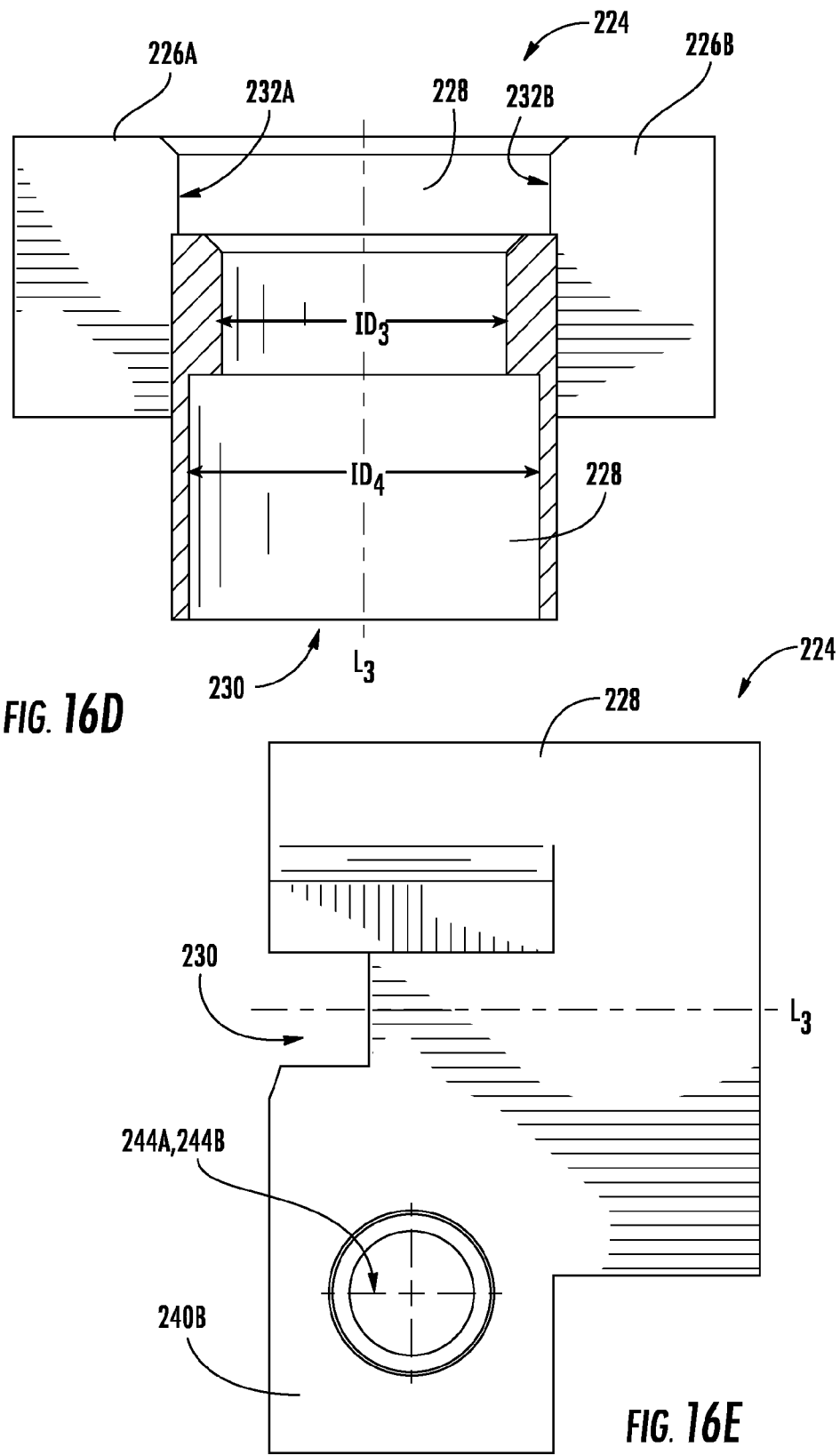
FIGS. 16D and 16E are top and left side views, respectively, of the mounting device of the optical sub-assembly of FIG. 15.
Figure 17A:
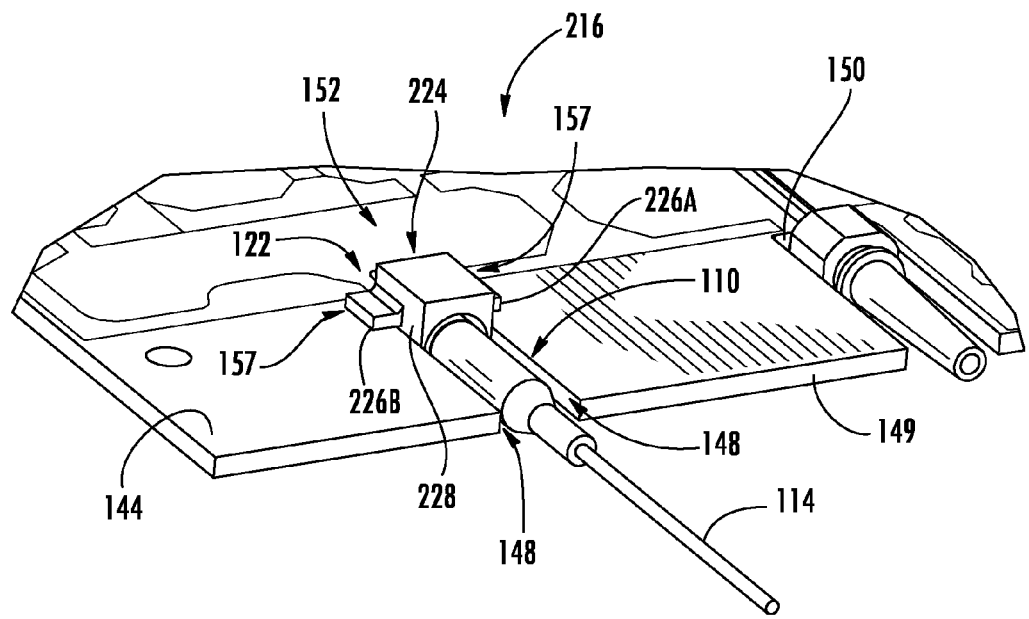
FIGS. 17A and 17B are front perspective and bottom perspective views, respectively, of the optical sub-assembly mounted to the electronics board in FIG. 15.
Figure 17B:
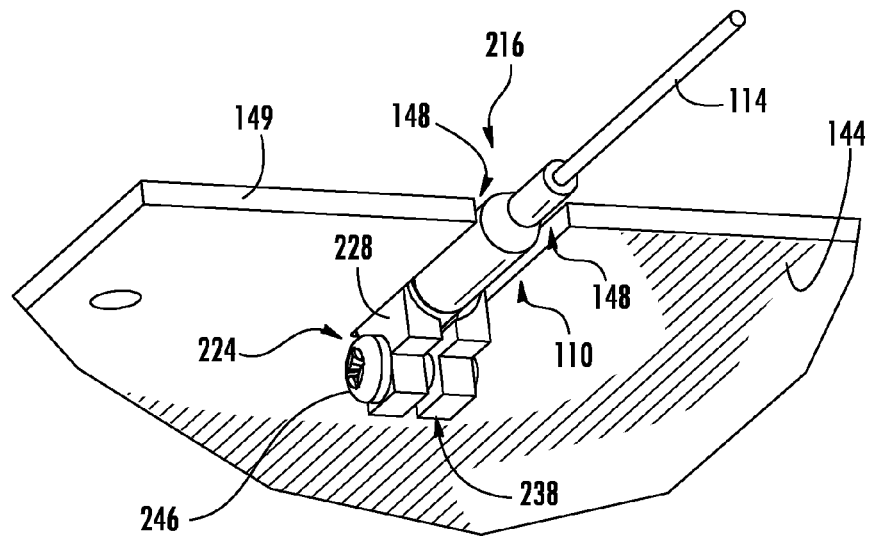
Figure 17C:
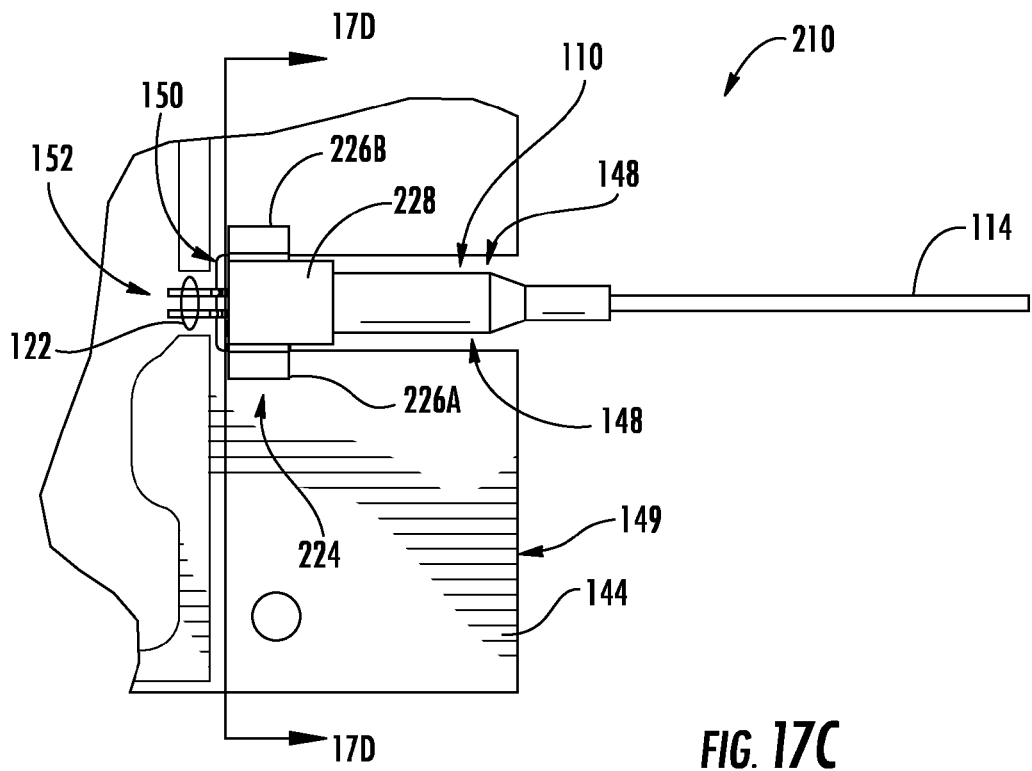
FIGS. 17C and 17D are left top and rear side cross-sectional views, respectively, of the optical sub-assembly mounted to the electronics board in FIG. 15.
Figure 17D:
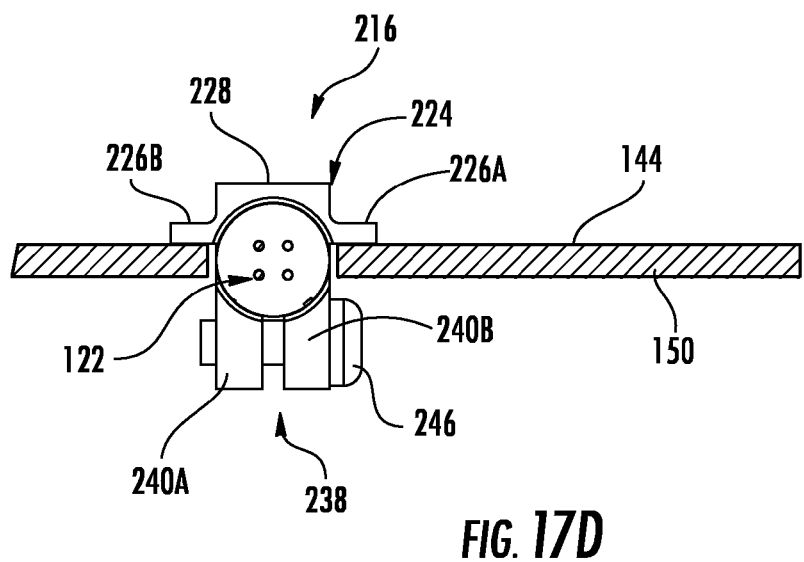
Figure 17E:
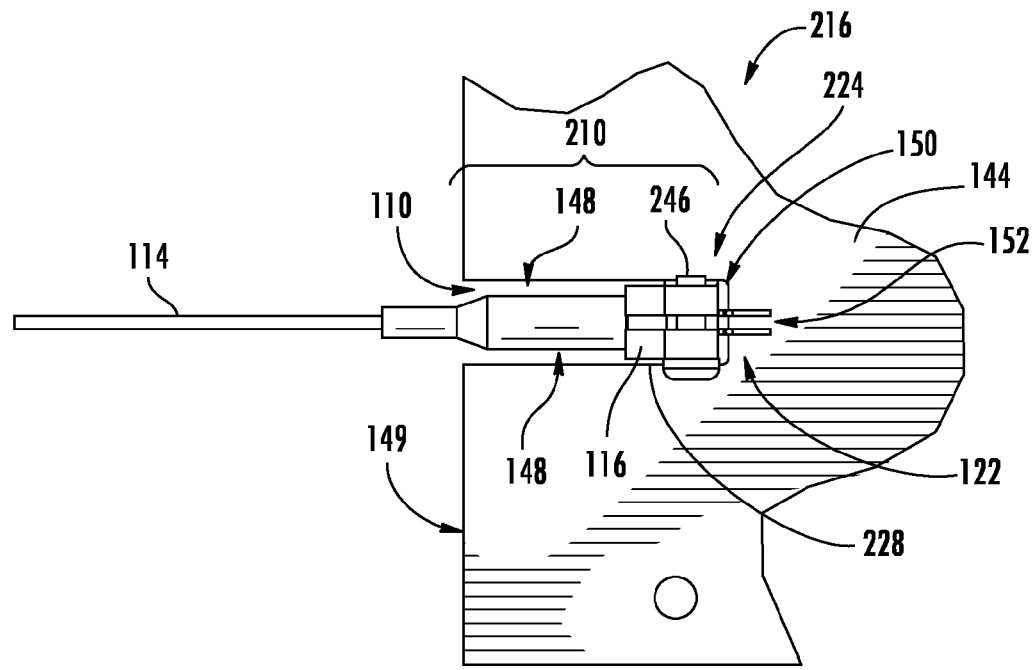
FIGS. 17E and 17F are bottom and front side cross-sectional views, respectively, of the optical sub-assembly mounted to the electronics board in FIG. 15.
Figure 17F:
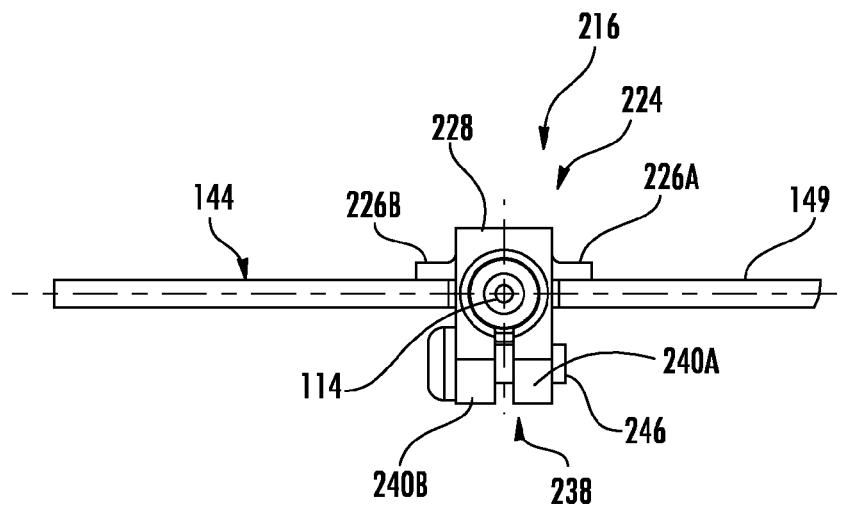

FIG. 16A is a perspective view of the mounting device 224 of the optical sub-assembly 210 of FIG. 15. FIGS. 16B and 16C are front and rear views, respectively, of the mounting device 224 of the optical sub-assembly 210 of FIG. 15. FIGS. 16D and 16E are top and left side views, respectively, of the mounting device 224 of the optical sub-assembly 210 of FIG. 15. As illustrated therein, the mounting device 224 includes a retention structure 228. The retention structure 228 comprising a retention opening 230 disposed along a longitudinal axis $L_3$ of the retention structure 228. The retention opening 230 in this embodiment has a geometric shape that is complementary to the geometric shape of the flange 124 and/or the can 118 of the TOSA 110. In this embodiment, the retention opening 230 is cylindrical shaped to be complementary with the cylindrical shape of the flange 124 and/or the can 118 of the TOSA 110. As illustrated in FIG. 15, in this embodiment, the flange 124 is the largest outer diameter component of the TOSA 110, and is disposed inside the retention opening 230. As also illustrated in FIG. 15 and illustrated in more detail with regard to FIGS. 17A-17F, the retention opening 230 supports the flange 124 and the can 118 of the TOSA 110 to secure the TOSA 110 in the board opening 148 of the electronics board 144. The retention opening 230 can precisely retain the flange 124 and the can 118 of the TOSA 110 to hold the TOSA 110 in precise alignment in the board opening 148 and to align the electrical leads 122 with the optical interface 152 of the electronics board 144.

With continuing reference to FIGS. 16A-16E, to securely retain the flange 124 and/or the can 118 of the TOSA 110 inside the retention opening 230, an inner diameter $ID_3$ of the retention opening 230, as illustrated in FIG. 16B, may be the same or slightly smaller than the outer diameter of the flange 124, and/or the can 118 of the TOSA 110. In this manner, a friction fit is provided between the retention structure 228 and the TOSA 110, as illustrated in FIG. 15 and FIGS. 17A-17F. As also illustrated in FIGS. 16C and 16D, the retention structure 228 also contains a larger inner diameter $ID_4$ that is created as a result of a counter bore disposed in the retention structure 228 to create the retention opening 230 having the inner diameter $ID_3$. Thus, additional space is provided between the inner diameter $ID_3$ and the inner diameter $ID_4$ in the retention opening 230 so that there is room for the body 116 of the TOSA 110 to be retained loosely in the retention opening 230 while the flange 124 and the can 118 of the TOSA 110 is tightly retained therein.

With continuing reference to FIGS. 16A-16E, the mounting device 224 also includes the mounting surfaces 226A, 226B. The mounting surfaces 226A, 226B may be mounting tabs or other structures that extend from sides 232A, 232B of the retention structure 228 to support mounting of the mounting device 224 to each side of the board opening 148 when the TOSA 110 is disposed in the board opening 148, as illustrated in FIG. 15 and FIGS. 17A-17F. To provide for edge mounting of the TOSA 110 in the board opening 148, the mounting surfaces 226A, 226B are disposed along a plane $P_3$ that intersects with the retention opening 230, as illustrated in FIGS. 16A and 16B. In this manner, the retention opening 230 will be disposed inside the board opening 148 such that the flange 124 and/or the can 118 of the TOSA 110 supported in the retention opening 230 will be disposed both about and below the electronics board 144.

With continuing reference to FIGS. 16A-16E, the retention structure 228 and the mounting surfaces 226A, 226B may be constructed from electrically conductive material, such as copper, silver, brass, steel, and any spring tempered copper alloy such as phosphor bronze or beryllium copper, as non-limiting examples. Thus, when the flange 124 and/or the can 118 of the TOSA 110 is secured inside the retention opening 230 and the mounting surfaces 226A, 226B are coupled to a grounding node of the electronics board 144, the TOSA 110 will be additionally grounded to the electronics board 144 through the mounting device 224. In this regard, the mounting surfaces 226A, 226B serve as grounding pads. The mounting surfaces 226A, 226B may be soldered to grounding nodes on the electronics board 144 to provide this additional grounding between the electronics board 144 and the TOSA 110, as illustrated in FIG. 15 and FIGS. 17A-17F. Additional or improved grounding can improve RF shielding of the TOSA 110. For example, a surface area between seventy percent (70%) and ninety-five percent (95%) of the outer surface of the flange 124 may be placed into contact with the retention structure 228 to provide additional grounding in this embodiment. The greater the amount of surface contact between the mounting device 224 and the TOSA 110, the lower the impedance and enhanced grounding.

With regard to FIGS. 16B-16E, the retention structure 228 contains an additional clamp 238. The clamp 238 further assists in securing the flange 124 and/or the can 118 of the TOSA 110 firmly and securely in the retention opening 230. The clamp 238 is compromised of two extension members 240A, 240B that extend down from each side 242A, 242B of the retention structure 228 such that the extension members 240A, 240B are disposed in parallel planes to each other. Each extension member 240A, 240B contains openings 244A, 244B that are configured to receive a fastener 246 therethrough, as illustrated in FIGS. 17B, 17D, and 17F. The fastener 246 may be threaded. When the fastener 246 is tightened, the fastener 246 forces the extension members 240A, 240B to be bent toward each other to decrease the inner diameter $ID_3$ of the retention opening 230 around the flange 124 and/or the can 118 of the TOSA 110 as a clamp. Providing the clamp 238 may further assist in securing and/or aligning to the TOSA 110 in the board opening 148 and the electrical leads 122 to the optical interface 152. A slot 248 between the extension members 240A, 240B also allows the optical fiber tether 114 to be disposed therein to allow the mounting device 244 to be slipped over the TOSA 110 during assembly even if the electrical leads 122 of the TOSA 110 are already secured to the electronics board 144. This may be particularly beneficial if the optical fiber tether 114 is already connectorized, as is illustrated in FIG. 7, wherein the slot 248 of the mounting device 244 is slipped over the optical fiber tether 114 between the TOSA 110 and the connector.

Figure 18:
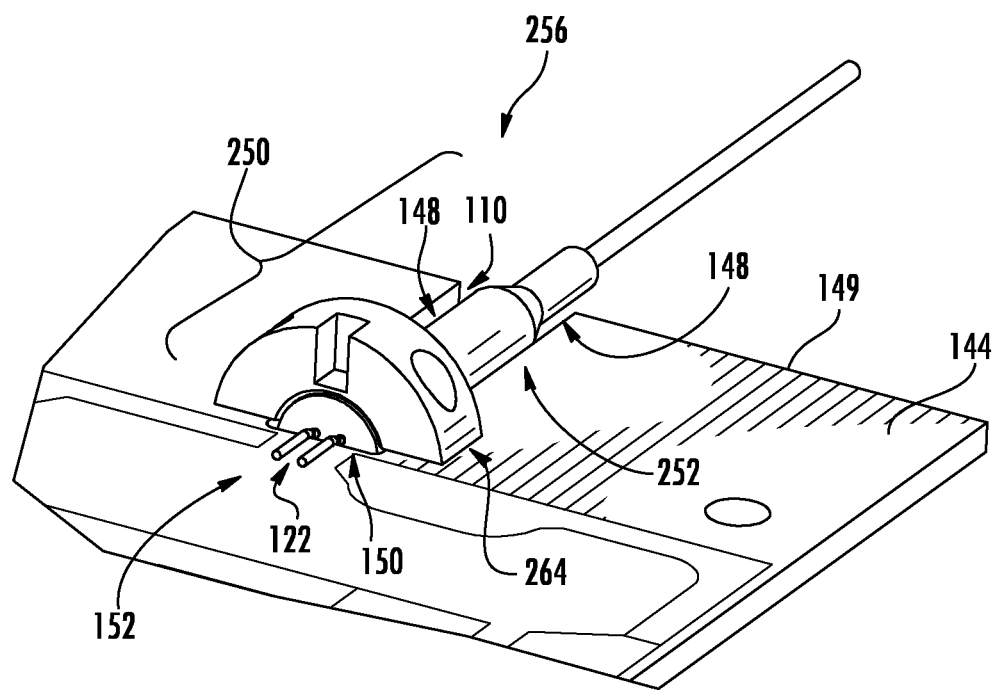
FIG. 18 is a rear perspective view of another exemplary optical sub-assembly comprising a mounting device securing the optical device of FIGS. 8A and 8B to an electronics board.

FIG. 18 is a rear perspective view of another exemplary optical sub-assembly 250 that can be provided for mounting an optical device 252 to the electronics board 144 to provide another optical interface apparatus 256. In this example, the optical device 252 mounted to the electronics board 144 is also the TOSA 110 in FIGS. 8A and 8B. Also in this example, the optical interface apparatus 256 may be an optical interface card, such as the OIC 90 previously described above with regard to FIGS. 5-7. Note that although a TOSA 110 is illustrated in FIG. 18 as being mounted to the electronics board 144, a ROSA 112 or other optical device could also be mounted to the electronics board 144 in the same or similar fashion.

With continuing reference to FIG. 18, the TOSA 110 of the optical sub-assembly 250 is disposed inside the board opening 148 in the electronics board 144 to edge mount the optical device 252 to the electronics board 144, as previously discussed. In this embodiment, the board opening 148 extends to the end 149 of the electronics board 144. However, the board opening 148 does not have to extend to the end 149 of the electronics board 144, such as is the case with the OIC 90 in FIGS. 5-7. With reference back to FIG. 18, the board opening 148 forms the first opening edge 150 in the electronics board 144. The optical interface 152 is disposed in the electronics board 144 adjacent to the first opening edge 150. The electrical leads 122 of the TOSA 110 are connected to the optical interface 152 to electrically connect the TOSA 110 to the electrical circuit(s) in the electronics board 144 to provide the optical interface apparatus 256. The optical signals generated by the TOSA 110 as a result of interfacing the TOSA 110 to the electronics board 144 are provided over the optical fiber tether 114.

With continuing reference to FIG. 18, an alternative mounting device 264 is provided that is used to secure the TOSA 110 inside the board opening 148 and to the electronics board 144. FIGS. 19A-19E illustrate more detail of the mounting device 264 and its features and will be described below in more detail. With reference back to FIG. 18, the mounting device 264 contains features that allow the TOSA 110 to be edge mounted to the electronics board 144 in the board opening 148 such that the electrical leads 122 of the TOSA 110 can be electrically connected to the optical interface 152 adjacent the first opening edge 150 of the electronics board 144. FIGS. 20A and 20B are front perspective and bottom perspective views, respectively, of the optical sub-assembly 250 mounted to the electronics board 144 in FIG. 18. FIGS. 20C and 20D are left top and rear side cross-sectional views, respectively, of the optical sub-assembly 250 mounted to the electronics board 144 in FIG. 18. FIGS. 20E and 20F are bottom and front side cross-sectional views, respectively, of the optical sub-assembly 250 mounted to the electronics board 144 in FIG. 18.

As will also be discussed in more detail with regard to FIGS. 19A-19E, the mounting device 264 also contains additional features. The mounting device 264 includes features that assist in aligning the flange 124 and/or the can 118 of the TOSA 110 to the board opening 148 and the optical interface 152 when the TOSA 110 is mounted to the electronics board 144 using the mounting device 264. The mounting device 264 is also configured to provide electrical contact with the flange 124 and/or the can 118 of the TOSA 110 when mounting the TOSA 110 to the electronics board 144. Thus, when mounting surfaces 266A, 266B of the mounting device 264 are connected to the grounding node 157 of the electronics board 144 to secure the mounting device 264 to the electronics board 144, additional grounding (i.e., lower impedance) is provided between the TOSA 110 and the electronics board 144. Providing additional grounding beyond grounding provided through a ground lead among the electrical leads 122 and the optical interface 152 may improve RF shielding of the TOSA 110. This may assist in reducing or preventing radiated RF signals from the TOSA 110 from interfering with the ROSAs 112 as an example, and thus causing noise to be imposed on the receive circuits in the electronics board 144 connected to ROSAs 112. Providing additional grounding with a grounding clamp connected to a ground lead among the electrical leads 122 may be difficult or not possible without damaging the TOSA 110 and/or due to coating on the connection point between the electrical leads 122 and the optical interface 152.

Figure 19A:
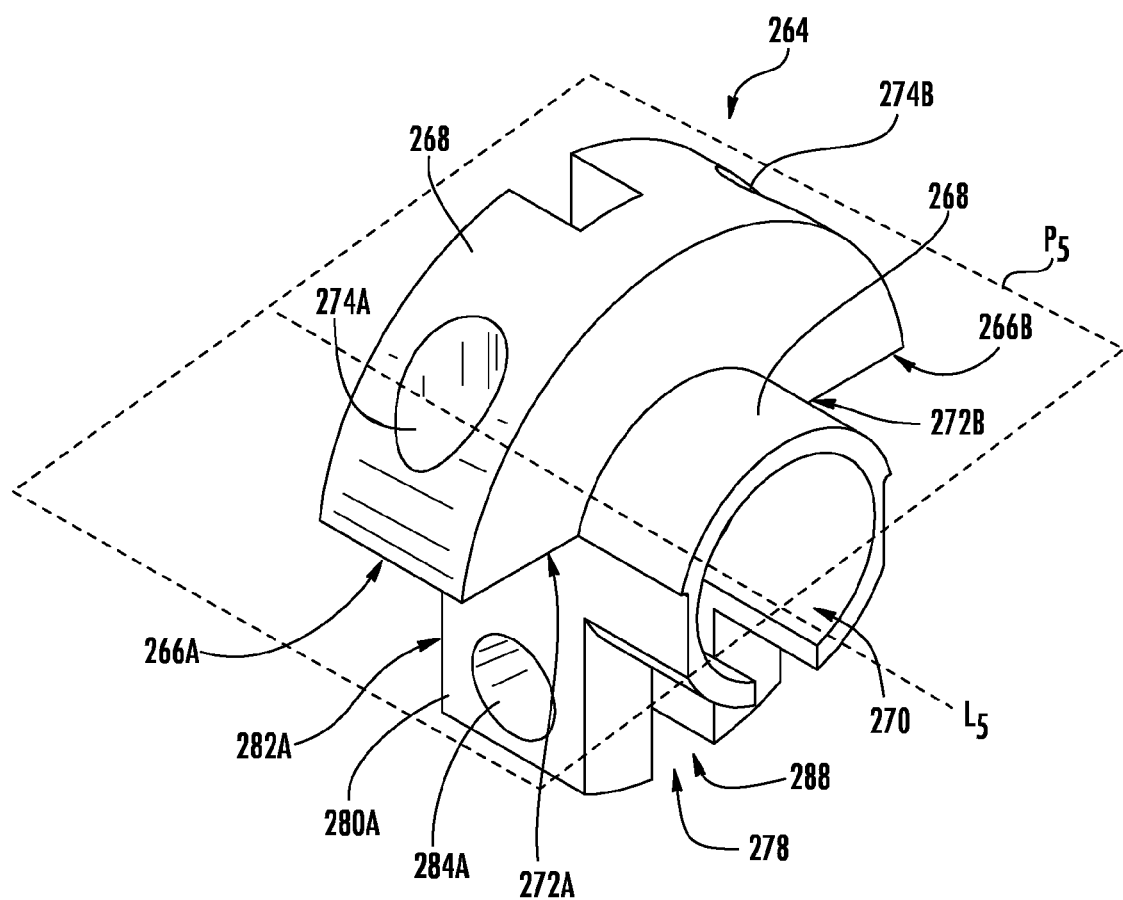
FIG. 19A is a perspective view of the mounting device of the optical sub-assembly of FIG. 18.
Figure 19B:
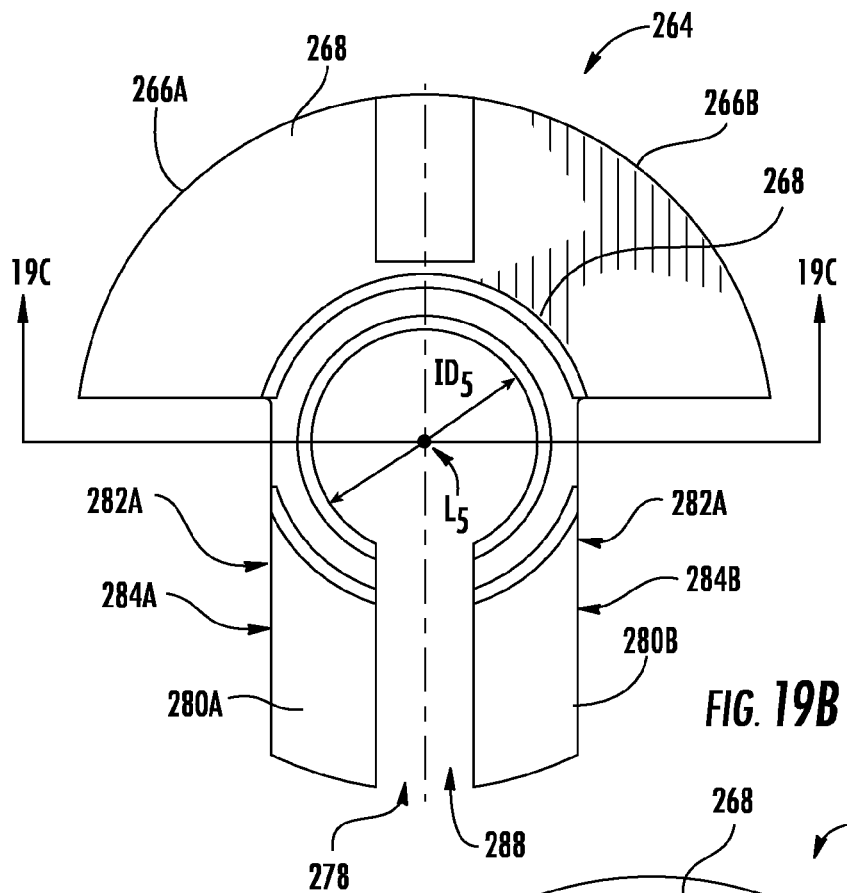
FIGS. 19B and 19C are front and rear views, respectively, of the mounting device of the optical sub-assembly of FIG. 18.
Figure 19C:
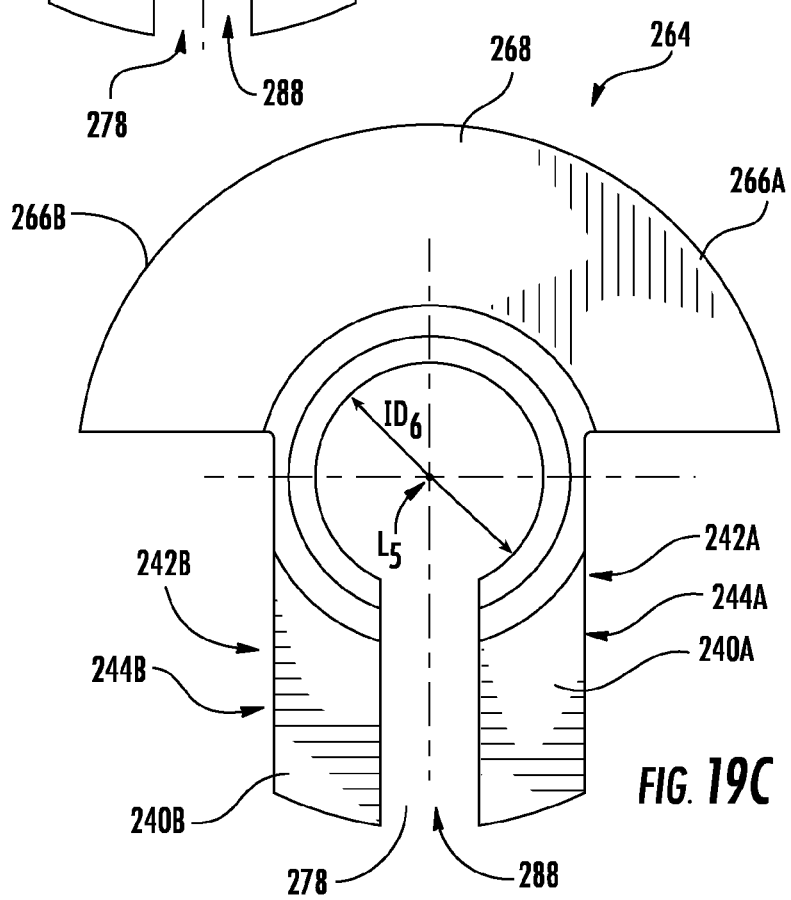
Figure 19D:
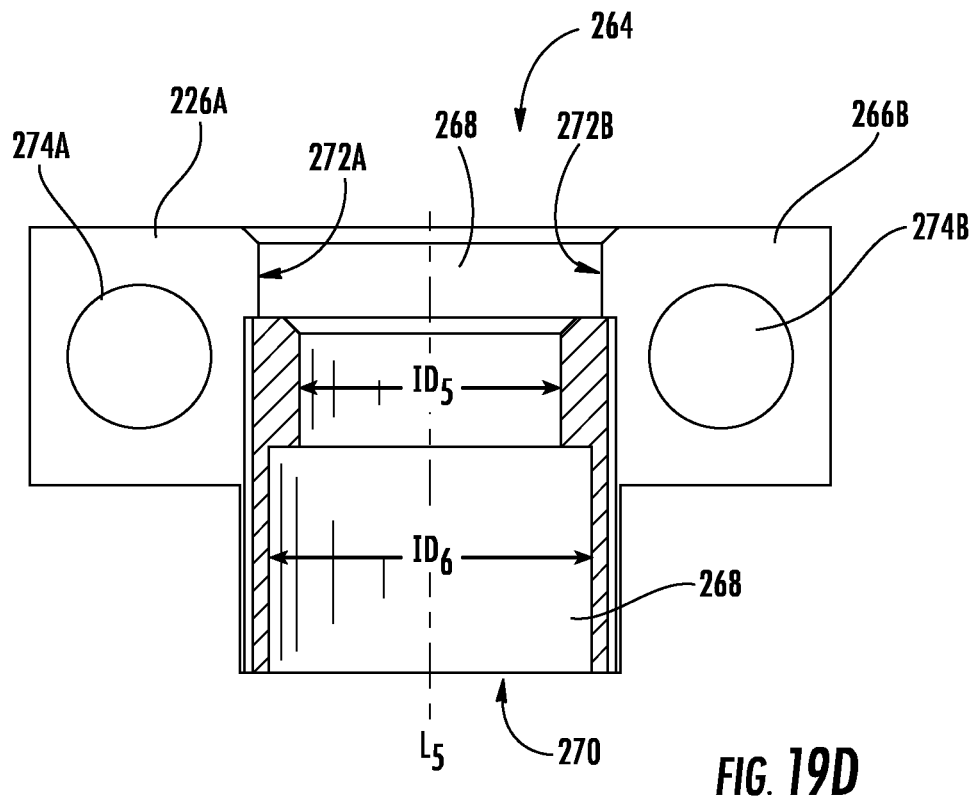
FIGS. 19D and 19E are top and left side views, respectively, of the mounting device of the optical sub-assembly of FIG. 18.
Figure 19E:
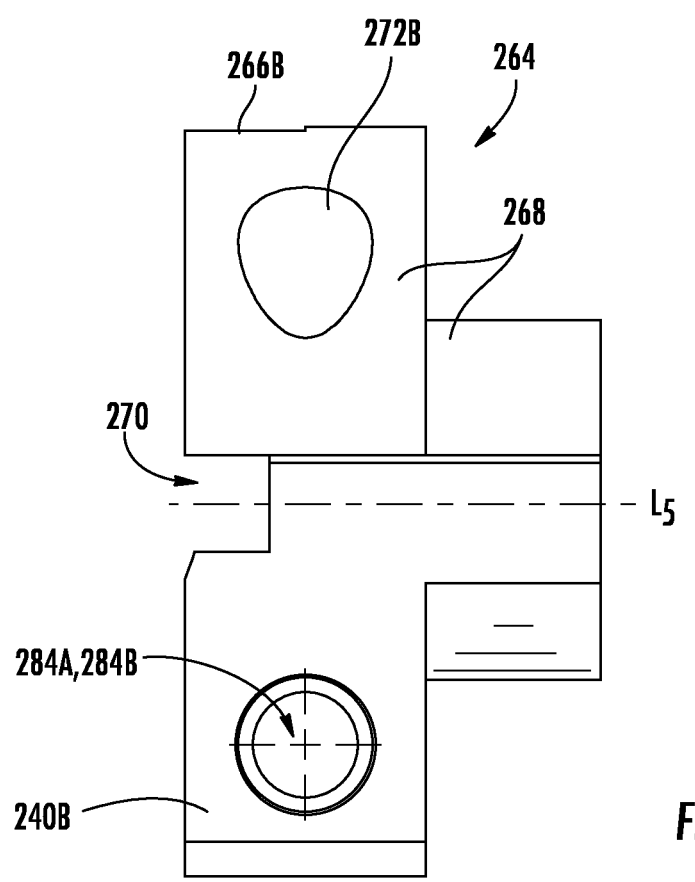
Figure 20A:
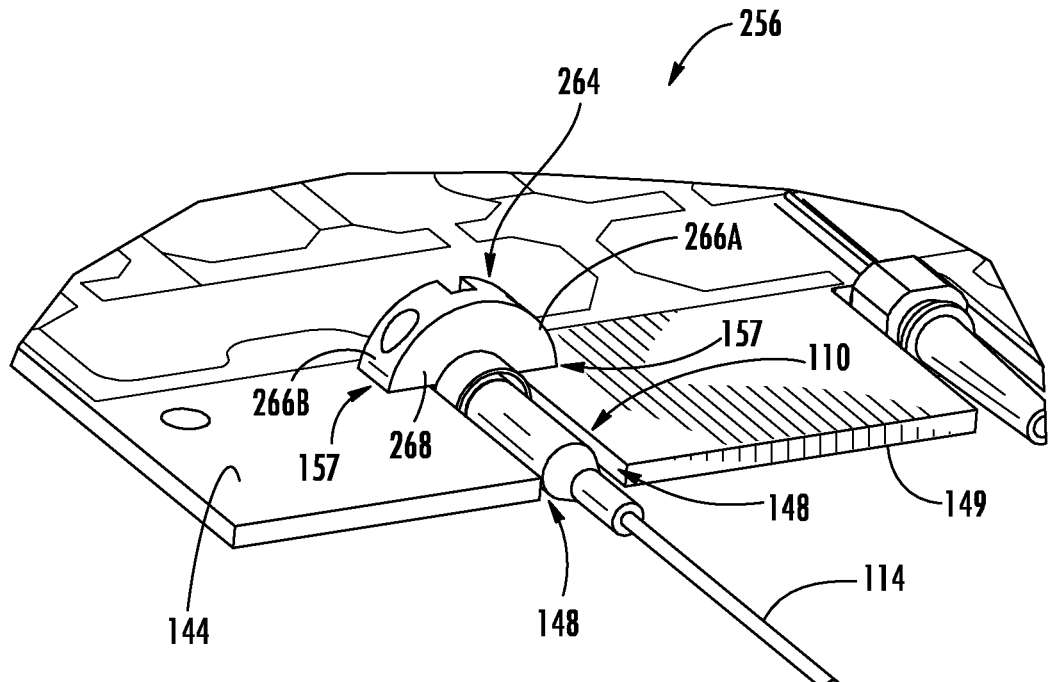
FIGS. 20A and 20B are front perspective and bottom perspective views, respectively, of the optical sub-assembly mounted to the electronics board in FIG. 18.
Figure 20B:
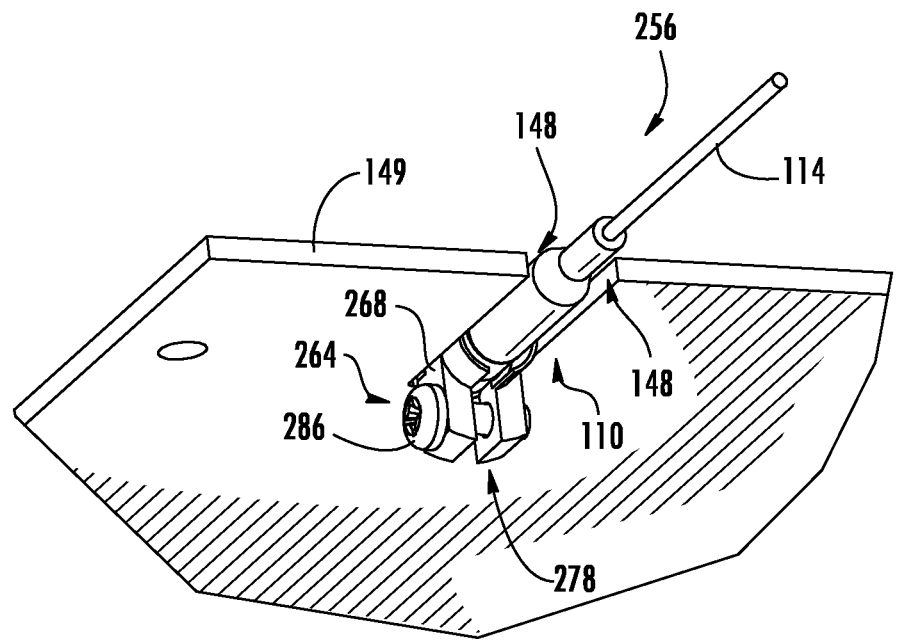
Figure 20C:
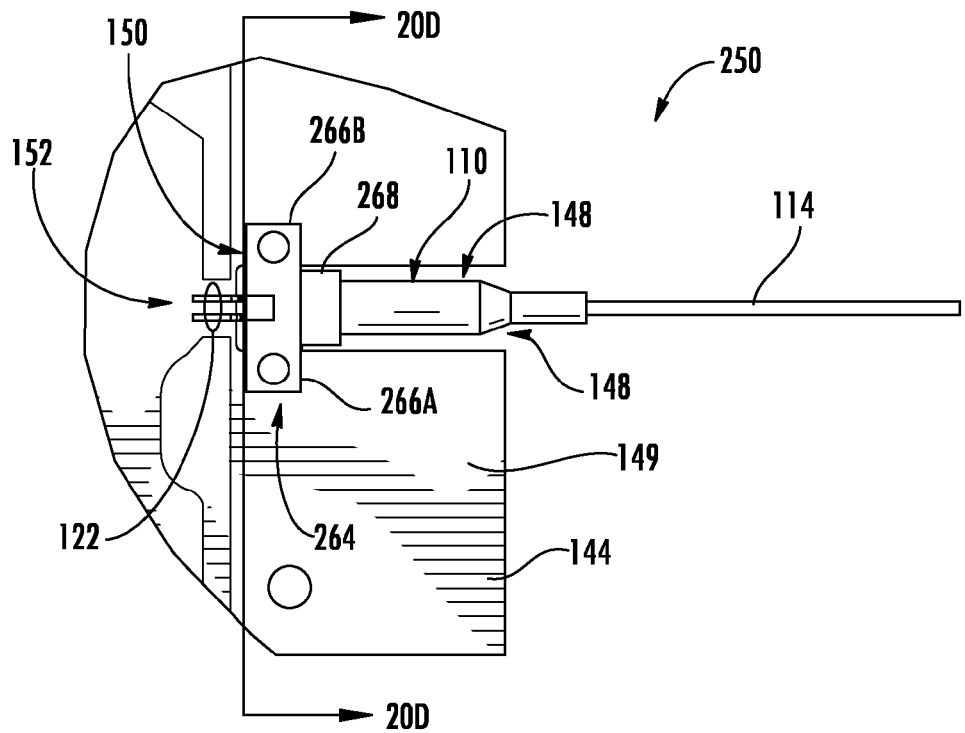
FIGS. 20C and 20D are left top and rear side cross-sectional views, respectively, of the optical sub-assembly mounted to the electronics board in FIG. 18.
Figure 20D:
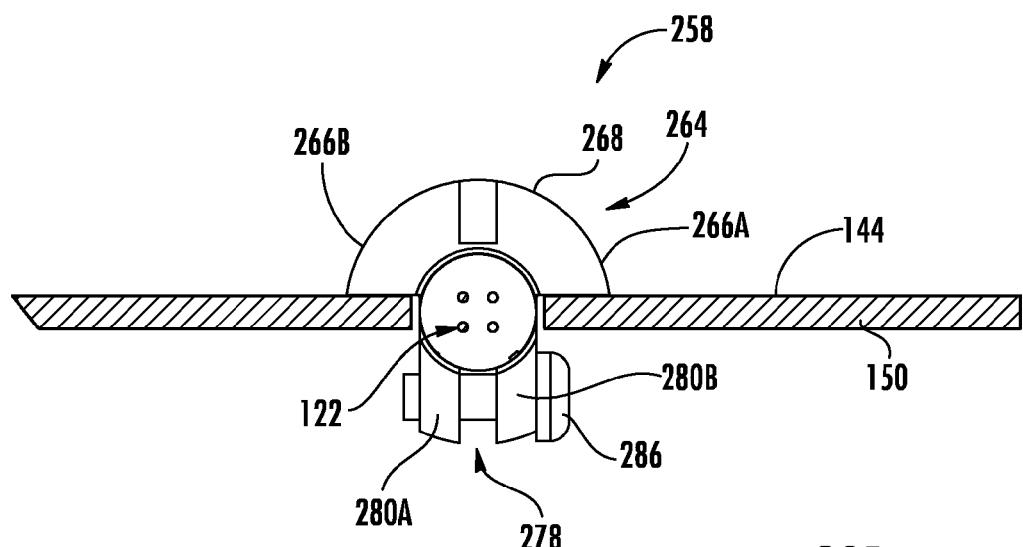
Figure 20E:
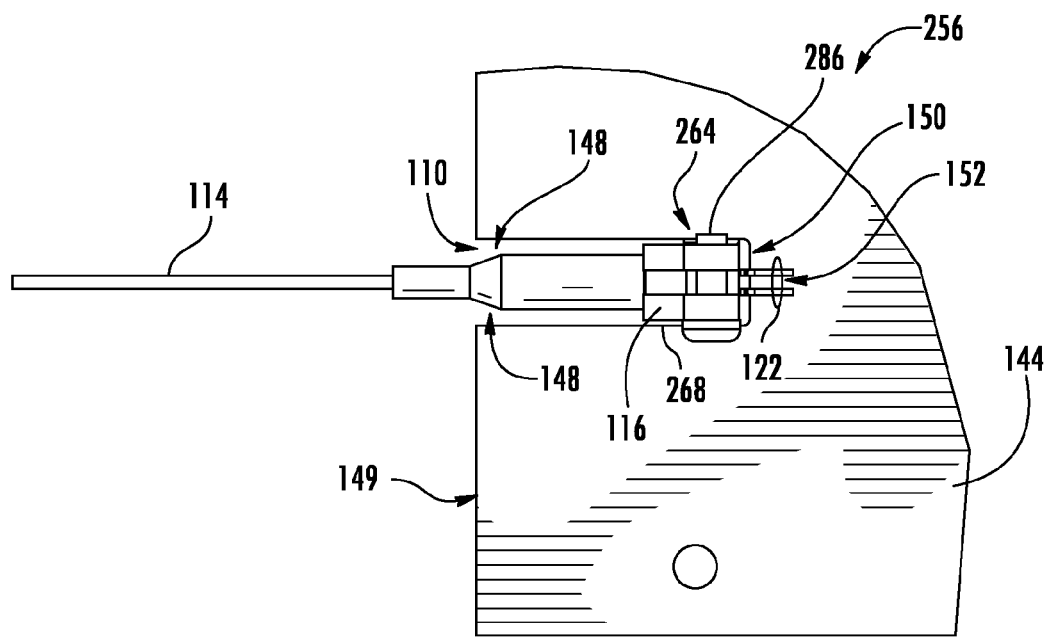
FIGS. 20E and 20F are bottom and front side cross-sectional views, respectively, of the optical sub-assembly mounted to the electronics board in FIG. 18.
Figure 20F:
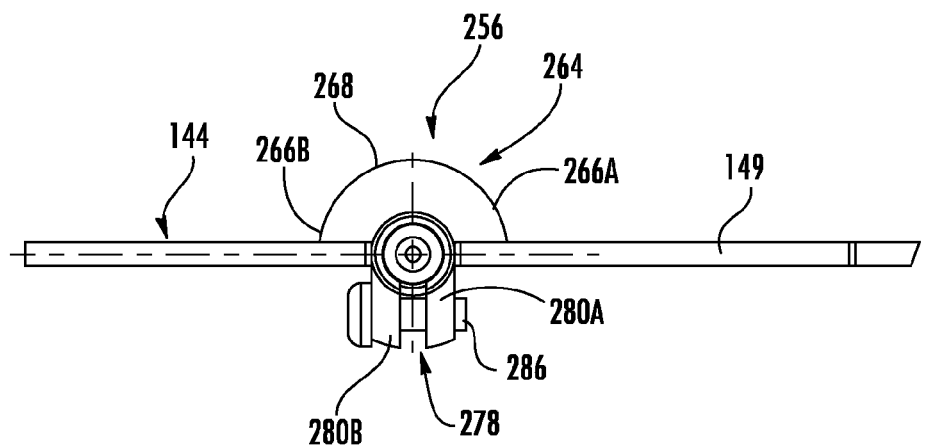

FIG. 19A is a perspective view of the mounting device 264 of the optical sub-assembly 250 of FIG. 18. FIGS. 19B and 19C are front and rear views, respectively, of the mounting device 264 of the optical sub-assembly 250 of FIG. 18. FIGS. 19D and 19E are top and left side views, respectively, of the mounting device 264 of the optical sub-assembly 250 of FIG. 18. As illustrated therein, the mounting device 264 includes a retention structure 268. The retention structure 268 comprises a retention opening 270 disposed along a longitudinal axis $L_5$ of the retention structure 268. The retention opening 270 in this embodiment has a geometric shape that is complementary to the geometric shape of the flange 124 and/or the can 118 of the TOSA 110. In this embodiment, the retention opening 270 is cylindrical shaped to be complementary with the cylindrical shape of the flange 124 and/or the can 118 of the TOSA 110. As illustrated in FIG. 18, in this embodiment, the flange 124 is the largest outer diameter component of the TOSA 110, and is disposed inside the retention opening 270. As also illustrated in FIG. 18 and illustrated in more detail with regard to FIGS. 20A-20F, the retention opening 270 supports the flange 124 and the can 118 of the TOSA 110 to secure the TOSA 110 in the board opening 148 of the electronics board 144. The retention opening 270 can precisely retain the flange 124 and the can 118 of the TOSA 110 to hold the TOSA 110 in precise alignment in the board opening 148 and to align the electrical leads 122 with the optical interface 152 of the electronics board 144.

With continuing reference to FIGS. 19A-19E, to securely retain the flange 124 and the can 118 of the TOSA 110 inside the retention opening 270, an inner diameter $ID_5$ of the retention opening 270, as illustrated in FIG. 19B, may be the same or slightly smaller than the outer diameter of the flange 124 or the can 118 of the TOSA 110. In this manner, a friction fit is provided between the retention structure 268 and the TOSA 110, as illustrated in FIG. 18 and FIGS. 20A-20F. As also illustrated in FIGS. 19B and 19C, the retention structure 268 also contains a larger inner diameter $ID_6$ that is created as a result of a counter bore disposed in the retention structure 268 to create the retention opening 270 having the inner diameter $ID_5$. Thus, additional space is provide between the inner diameter $ID_5$ and the inner diameter $ID_6$ in the retention opening 270 so that there is room for the flange 124 of the TOSA 110 to be retained loosely in the retention opening 270 while the can 118 and the flange 124 of the TOSA 110 is tightly retained therein.

With continuing reference to FIGS. 19A-19E, the mounting device 264 also includes the mounting surfaces 266A, 266B. The mounting surfaces 266A, 266B may be mounting tabs or other structures that extend from sides 272A, 272B of the retention structure 268 to support mounting of the mounting device 264 to each side of the board opening 148 when the TOSA 110 is disposed in the board opening 148, as illustrated in FIG. 18 and FIGS. 20A-20F. To provide for edge mounting of the TOSA 110 in the board opening 148, the mounting surfaces 266A, 266B are disposed along a plane $P_5$ that intersects with the retention opening 270, as illustrated in FIGS. 19A and 19B. In this manner, the retention opening 270 will be disposed inside the board opening 148 such that the flange 124 of the TOSA 110 supported in the retention opening 270 will be disposed both above and below the electronics board 144. The mounting surfaces 266A, 266B each contain through holes 274A, 274B that are configured to receive fasteners or solder to secure the mounting surfaces 266A, 266B to the electronics board 144, and in turn secure the TOSA 110 supported in the retention opening 270 to the electronics board 144.

With continuing reference to FIGS. 19A-19E, the retention structure 268 and the mounting surfaces 266A, 266B may be constructed from electrically conductive material, such as copper, silver, brass, steel, and any spring tempered copper alloy such as phosphor bronze or beryllium copper, as non-limiting examples. Thus, when the flange 124 and/or the can 118 of the TOSA 110 is secured inside the retention opening 270 and the mounting surfaces 266A, 266B are coupled to a grounding node of the electronics board 144, the TOSA 110 will be additionally grounded to the electronics board 144 through the mounting device 264. In this regard, the mounting surfaces 266A, 266B serve as grounding pads. The mounting surfaces 266A, 266B may be soldered to grounding nodes on the electronics board 144 to provide this additional grounding between the electronics board 144 and the TOSA 110, as illustrated in FIG. 18 and FIGS. 20A-20F. Additional or improved grounding can improve RF shielding of the TOSA 110. For example, a surface area between seventy percent (70%) and ninety-five percent (95%) of the outer surface of the flange 124 may be placed into contact with the retention structure 268 to provide additional grounding in this embodiment. The greater the amount of surface contact between the mounting device 264 and the TOSA 110, the lower the impedance and enhanced grounding.

With regard to FIGS. 19A-19E, the retention structure 268 contains an additional clamp 278. The clamp 278 further assists in securing the flange 124 or the can 118 of the TOSA 110 firmly and securely in the retention opening 270. The clamp 278 is comprised of two extension members 280A, 280B that extend down from each side 282A, 282B of the retention structure 268 such that the extension members 280A, 280B are disposed in parallel planes to each other. Each extension member 280A, 280B contains openings 284A, 284B that are configured to receive a fastener 286 therethrough, as illustrated in FIGS. 20B, 20D, and 20F. The fastener 286 may be threaded. When the fastener 286 is tightened, the fastener 286 forces the extension members 280A, 280B to be bent toward each other to decrease the inner diameter $ID_5$ of the retention opening 270 around the flange 124 and/or the can 118 of the TOSA 110 as a clamp. Providing the clamp 278 may further assist in securing and/or aligning to the TOSA 110 in the board opening 148 and the electrical leads 122 to the optical interface. A slot 288 between the extension members 280A, 280B also allows the optical fiber tether 114 to be disposed therein to allow the mounting device 264 to be slipped over the TOSA 110 during assembly even if the electrical leads 122 of the TOSA 110 are already secured to the electronics board 144. This may be particularly beneficial if the optical fiber tether 114 is already connectorized, as is illustrated in FIG. 7, wherein the slot 288 of the mounting device 264 is slipped over the optical fiber tether 114 between the TOSA 110 and the connector.

FIGS. 21A-21D are front top perspective, front bottom perspective, left top, and rear side cross-sectional views, respectively, of the mounting device 264 in FIGS. 18-20F mounted orthogonally to the electronics board 144 to provide an alternative optical sub-assembly 300 to secure the optical device of FIGS. 8A and 8B to an electronics board. In this regard, the optical sub-assembly 300 that can be provided for mounting an optical device 302 to the electronics board 144 to provide another optical interface apparatus 306. In this example, the optical device 302 mounted to the electronics board 144 is also the TOSA 110 in FIGS. 8A and 8B. Also in this example, the optical interface apparatus 306 may be an optical interface card, such as the OIC 90 previously described above with regard to FIGS. 5-7. Note that although a TOSA 110 is illustrated in FIGS. 21A-21D as being mounted to the electronics board 144, a ROSA 112 or other optical device could also be mounted to the electronics board 144 in the same or similar fashion.

Figure 21A:
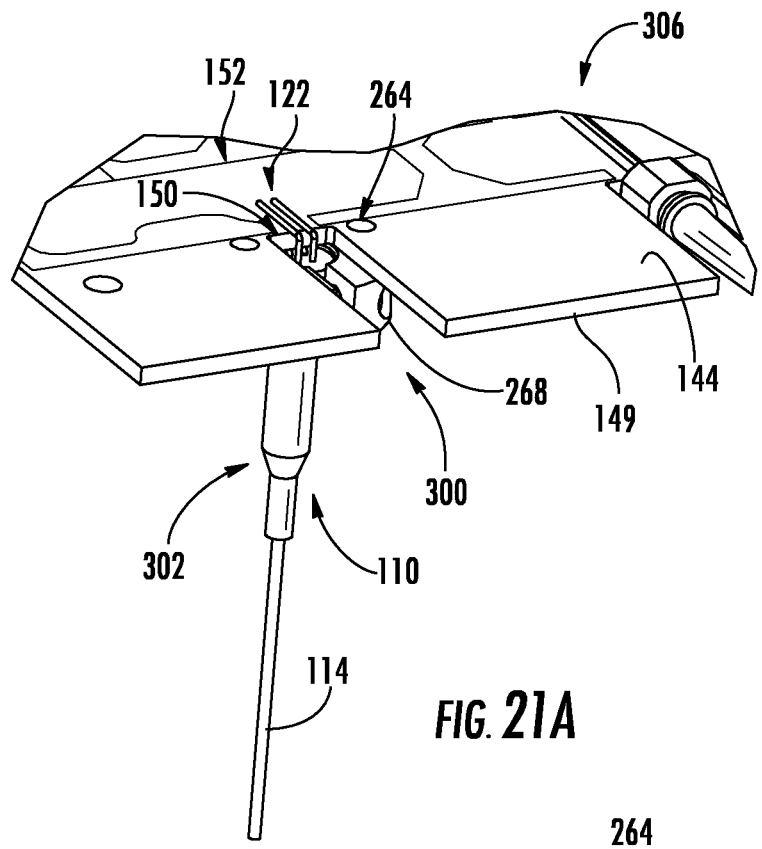
FIGS. 21A-21D are front top perspective, front bottom perspective, left top, and rear side cross-sectional views, respectively, of another exemplary optical sub-assembly comprising a mounting device securing the optical device of FIGS. 8A and 8B to an electronics board.
Figure 21B:
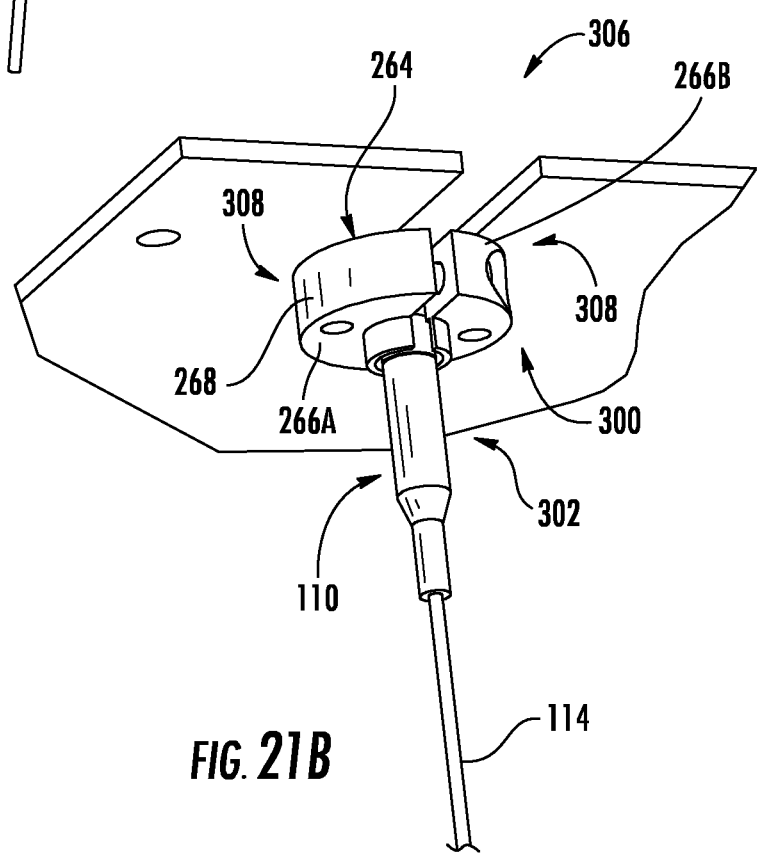
Figure 21C:
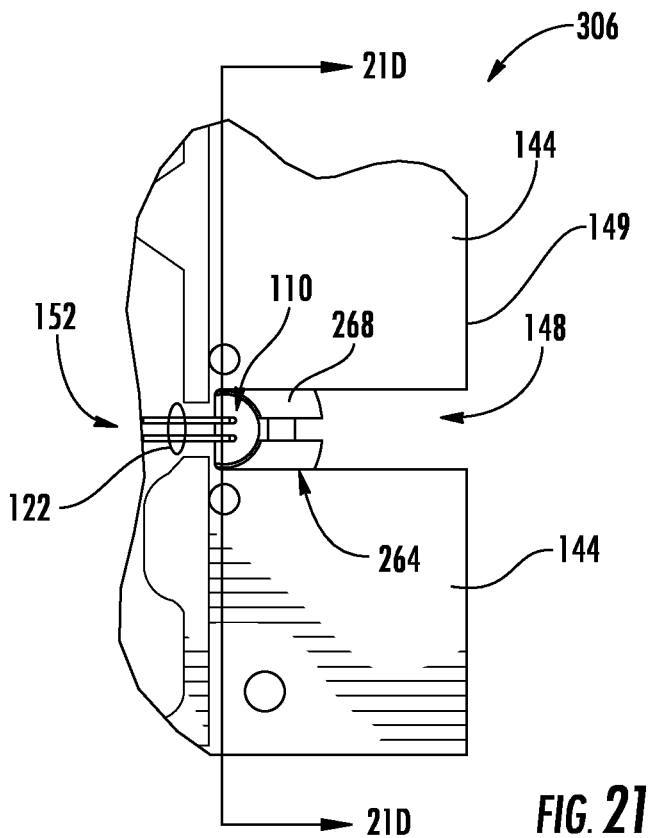
Figure 21D:
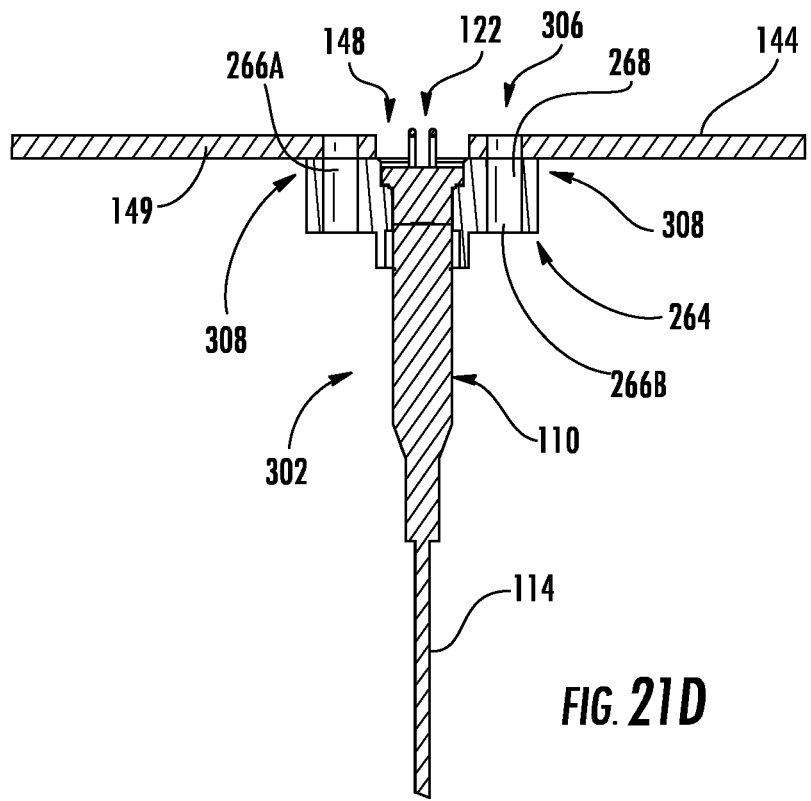

With continuing reference to FIGS. 21A-21D, an optical sub-assembly 300 is provided where the optical device 302 is disposed inside the board opening 148 in the electronics board 144 to orthogonally mount the optical device 302 to the electronics board 144 to provide the optical interface apparatus 306. Thus, grounding nodes 308 are disposed on the bottom side of the electronics board 44 as illustrated in FIG. 21B to allow the mounting device 264 to electrically contact the grounding nodes 308 when assembled and retaining the TOSA 110. In this embodiment, the optical device 302 is the TOSA 110. The optical sub-assembly 300 includes the mounting device 264 having the same features in FIGS. 18-20F discussed above. Thus, these features are noted in FIGS. 21A-21D with common element numbers along with the common element numbers for the electronics board 144, and thus will not be re-discussed. As illustrated in FIGS. 21A-21D, the electrical leads 122 run up through the board opening 148 in the electronics board from the TOSA 110 and are bent at an approximate right angle to be connected to the optical interface 152. The electrical leads 122 could also be connected to the optical interface 152 without being bent.

As used herein, it is intended that terms "fiber optic cables" and/or "optical fibers" include all types of single mode and multi-mode light waveguides, including one or more optical fibers that may be upcoated, colored, buffered, ribbonized and/or have other organizing or protective structure in a cable such as one or more tubes, strength members, jackets or the like. The optical fibers disclosed herein can be single mode or multi-mode optical fibers. Likewise, other types of suitable optical fibers include bend-insensitive optical fibers, or any other expedient of a medium for transmitting light signals. An example of a bend-insensitive, or bend resistant, optical fiber is ClearCurve® Multimode fiber commercially available from Corning Incorporated. Suitable fibers of this type are disclosed, for example, in U.S. Patent Application Publication Nos. 2008/0166094 and 2009/0169163, the disclosures of which are incorporated herein by reference in their entireties.

Many modifications and other embodiments set forth herein will come to mind to one skilled in the art to which the embodiments pertain having the benefit of the teachings presented in the foregoing descriptions and the associated drawings. Therefore, it is to be understood that the description and claims are not to be limited to the specific embodiments disclosed and that modifications and other embodiments are intended to be included within the scope of the appended claims. For example, the embodiments disclosed herein can be employed for any type of distributed antenna system, whether such includes optical fiber or not.

It is intended that the embodiments cover the modifications and variations of the embodiments provided they come within the scope of the appended claims and their equivalents. Although specific terms are employed herein, they are used in a generic and descriptive sense only and not for purposes of limitation.

What is claimed is:

1. A mounting device for mounting an optical device in an optical sub-assembly, comprising:
   a retention structure comprising a retention opening disposed along a longitudinal axis of the retention structure; and
   at least one mounting surface disposed adjacent to the retention structure and disposed along a plane that intersects with the retention opening, the at least one mounting surface configured to be attached to an electronics board of an optical sub-assembly inside a board opening of the electronics board to secure the retention structure to the electronics board inside the board opening,
   wherein the retention structure is configured to retain at least a portion of an optical device comprising an optical interface in the retention opening to align the at least a portion of the optical device with a longitudinal axis of the retention opening.

2. The mounting device of claim 1, wherein the retention structure is configured to align the at least a portion of the optical device with or substantially with the longitudinal axis of the retention opening.

3. The mounting device of claim 2, wherein the retention opening is comprised of a geometric shape adapted to be complementary to at least a portion of a geometric shape of the optical device retained in the retention opening.

4. The mounting device of claim 3, wherein the geometric shape of the retention opening is comprised from the group consisting of a cylindrical shape, an open cylindrical shape, a semi-cylindrical shape, and a closed cylindrical shape.

5. The mounting device of claim 1, wherein the retention structure is configured to be disposed in electrical contact with the at least a portion of the optical device.

6. The mounting device of claim 5, wherein the retention structure is in electrical contact with the at least one mounting surface.

7. The mounting device of claim 6, wherein the at least one mounting surface is configured to be electrically coupled to a grounding node to provide radio frequency shielding for the optical device retained within the retention structure.

8. The mounting device of claim 6, wherein the at least one mounting surface is comprised of at least one grounding pad.

9. The mounting device of claim 8, wherein the at least one grounding pad is comprised of a first grounding tab electrically coupled to a first side of the retention structure and a second grounding tab electrically coupled to a second side of the retention structure opposite from the first side of the retention structure.

10. The mounting device of claim 1, wherein the retention opening is comprised of a first opening having a first inner diameter configured to be in surface contact with the at least a portion of the optical device, and a second opening having a second inner diameter and disposed adjacent the first opening.

11. The mounting device of claim 1, further comprising at least one clamp disposed in the mounting device configured to clamp the retention structure to the at least a portion of the optical device.

12. The mounting device of claim 1, further comprising a fiber slot disposed in the retention structure to allow an optical fiber connected to the optical device to be received through the fiber slot into the retention opening.

13. The mounting device of claim 1, further comprising at least one protrusion member provided in the retention structure and disposed in the retention opening.

14. The mounting device of claim 1, wherein the optical interface is comprised of a transmit optical sub-assembly (TOSA).

15. The mounting device of claim 1, wherein the optical interface is comprised of a receive optical sub-assembly (ROSA).

16. The mounting device of claim 1, wherein the retention structure is disposed in electrical contact with the at least a portion of the optical device.

17. The mounting device of claim 1, wherein the board opening comprises at least one opening edge, the at least one mounting surface configured to attach to the electronics board adjacent the at least one opening edge.

18. The mounting device of claim 17, wherein the at least one mounting surface comprises two mounting surfaces extending from opposite sides of the retention structure.

19. The mounting device of claim 1, wherein the at least one mounting surface comprises two mounting surfaces extending from opposite sides of the retention structure.

* * * * *